United States Patent [19]

Satou et al.

[11] Patent Number: 5,754,061
[45] Date of Patent: May 19, 1998

[54] BI-CMOS CIRCUITS WITH ENHANCED POWER SUPPLY NOISE SUPPRESSION AND ENHANCED SPEED

[75] Inventors: Shinzou Satou; Kou Ebihara; Akiyoshi Suzuki; Keisuke Ishiwata; Kouji Miki; Hitoshi Ohmichi; Tamio Miyamura; Masamichi Kamiyama, all of Kawasaki, Japan

[73] Assignee: Fujitsu Limited, Kawasaki, Japan

[21] Appl. No.: 718,015

[22] Filed: Sep. 3, 1996

Related U.S. Application Data

[63] Continuation of Ser. No. 187,458, Jan. 28, 1994, abandoned.

[30] Foreign Application Priority Data

Mar. 17, 1993 [JP] Japan ..................... 5-057528
Jun. 18, 1993 [JP] Japan ..................... 5-148125

[51] Int. Cl.$^6$ ..................... H03K 19/02; H03K 17/04
[52] U.S. Cl. ..................... 326/110; 326/84; 326/17; 326/26
[58] Field of Search ..................... 326/17, 26, 84, 326/109, 110

[56] References Cited

U.S. PATENT DOCUMENTS

| | | | |
|---|---|---|---|
| 5,077,492 | 12/1991 | Fuse | 307/451 |
| 5,138,195 | 8/1992 | Satou et al. | 307/446 |
| 5,198,704 | 3/1993 | Nitta | 307/446 |
| 5,239,212 | 8/1993 | Masuda | 307/446 |
| 5,254,885 | 10/1993 | Ando | 326/110 |
| 5,300,829 | 4/1994 | Lev | 326/110 |
| 5,313,116 | 5/1994 | Murabayashi | 307/446 |
| 5,341,042 | 8/1994 | Chen | 326/110 |
| 5,355,030 | 10/1994 | Buchholtz et al. | 326/17 |

FOREIGN PATENT DOCUMENTS

| | | |
|---|---|---|
| A 0 398 744 A3 | 11/1990 | European Pat. Off. . |
| 470 500 A | 2/1992 | European Pat. Off. ............... 326/110 |
| A 0 490 243 | 6/1992 | European Pat. Off. . |
| 61-225924 | 10/1986 | Japan . |
| 1-286616 | 11/1989 | Japan . |
| 2-203614 | 8/1990 | Japan . |
| 4-239817 | 8/1992 | Japan . |
| 5-268058 | 10/1993 | Japan ............... 326/110 |

OTHER PUBLICATIONS

IEEE Journal of Solid–State Circuits, vol. 26, No. 3, Mar. 1, 1991, New York, US, pp. 427–431, XP000222623. toshiaki hanibuchi et al.: "A Bipolar–PMOS Merged Basic Cell for 0.8–uM BICMOS Sea of Gates"(figures 1,6).

IBM Technical Disclosure Bulletin, vol. 33, No. 1A, Jun. 1, 1990, Armonk, NY, US, pp. 274–278, XP000120190 "Improved BIFET Circuit" (figure 1).

Patent Abstracts of Japan, vol. 15, No. 365 (E–1111), 13 Sep. 1991 & JP–A–03–142870 (Fujitsu Ltd; Others: 02) Jun. 18, 1991 (abrege).

*Primary Examiner*—Edward P. Westin
*Assistant Examiner*—Benjamin D. Driscoll
*Attorney, Agent, or Firm*—Armstrong, Westerman, Hattori, McLeland & Naughton

[57] ABSTRACT

A Bi-CMOS circuit includes a first bipolar, a second bipolar transistor and a CMOS control unit for performing switching controls of the first and second bipolar transistors on the basis of an input signal applied to an input terminal and for controlling an output signal output via the output terminal on the basis of the input signal. A turn-OFF unit temporality couples the base of the first bipolar transistor to a low-potential side power supply line on the basis of a current flowing in said control means when the first bipolar transistor is turned OFF, so that the first bipolar transistor can be rapidly turned OFF.

13 Claims, 69 Drawing Sheets

FIG. 36

| | $C_0$ pF | PRIOR CIRCUITS | | | | | PRESENT INVENTION | |
|---|---|---|---|---|---|---|---|---|
| | | CKT 100 IN FIG.1 | CKT 110 IN FIG.7 | CKT 120 IN FIG.13 | | CKT 10 IN FIG.25 | |
| | | | | SAME SIZE | DIFF. SIZE | SAME SIZE | DIFF. SIZE |
| $V_{th}$ | 0 | 2.56 V DIFFERENCE ⇔ | 1.67 V -0.89 V | 1.90 V -0.66 V | 2.15 V -0.41 V | 2.28 V -0.28 V | 2.48 V -0.08 V |
| $P_{LOSS}$ | 1 | 38.4 uw/MHz (FIG.6) | -16% (FIG.12) | -18% (FIG.18) | -23% (FIG.23) | -27% (FIG.30) | -29% (FIG.35) |
| $t_{pLH}$ | 1 | 440 ps (FIG.6) | +100% (FIG.12) | +78% (FIG.18) | +53% (FIG.23) | +35% (FIG.30) | +20% (FIG.35) |
| EB REVERSE | 2 | NOT OCCUR (FIG.5) | -3.1 V (FIG.11) | -2.25V (FIG.17) | -2.17V (FIG.22) | -1.10 V (FIG.29) | -0.87V (FIG.34) |

FIG.41A
(INVERTER)
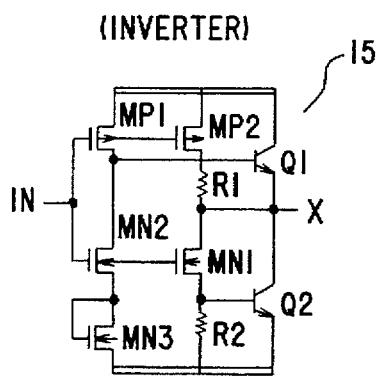
FIG.41B
(2-INPUT NAND)
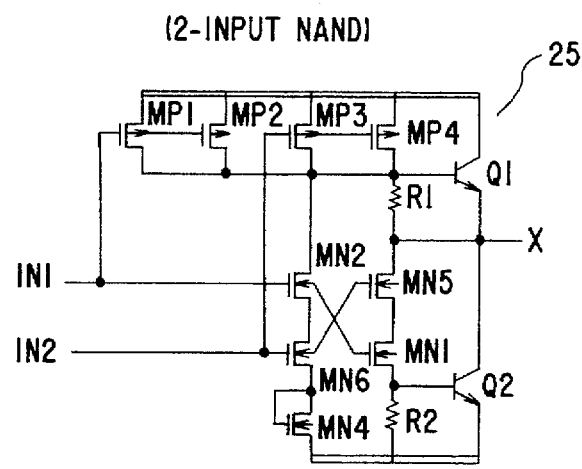
FIG.41C
FIG.41D

FIG.44
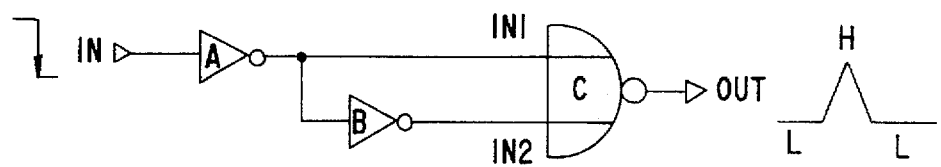
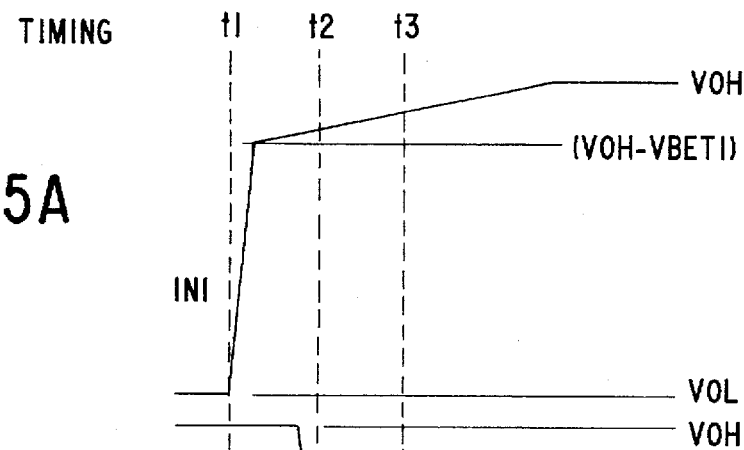
FIG.45A
FIG.45B
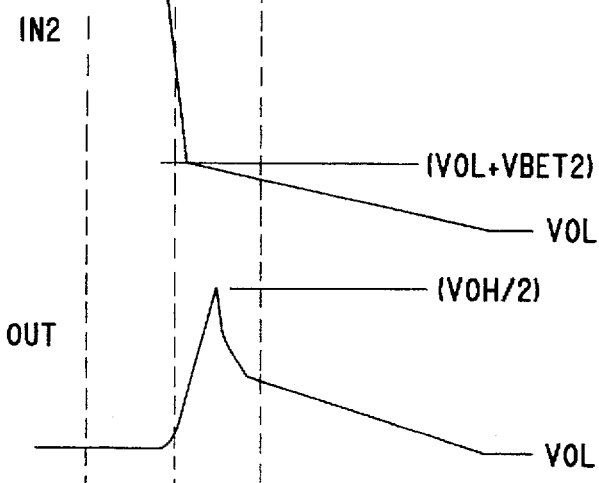
FIG.45C 5,754,061

BI-CMOS CIRCUITS WITH ENHANCED POWER SUPPLY NOISE SUPPRESSION AND ENHANCED SPEED

This is a continuation of application Ser. No. 08/187,458 filed Jan. 28, 1994, now abandoned.

BACKGROUND OF THE INVENTION

1. Field of the Invention

The present invention generally relates to Bi-CMOS (Bipolar-Complementary Metal Oxide Semiconductor) circuits, and more particularly to a Bi-CMOS circuit forming a gate circuit.

Recently, there has been an increasing demand of high-speed low power consumption semiconductor devices with speeding up of computer devices or the like and reduction in power consumed therein. Further, semiconductor devices have been developed which has a Bi-CMOS circuit including bipolar transistors and MOS transistors with a demand that an analog circuit and a digital circuit are formed on one chip.

2. Description of the Prior Art

FIG. 1 is a circuit diagram of an inverter circuit 100, which is an example of conventional impedance type Bi-CMOS circuits. An input signal voltage $V_{IN}$ applied to an input terminal 1 is inverted with respect to a predetermined threshold voltage Vth3, and an output voltage $V_{OUT}$ is output via an output terminal 2.

A power supply voltage Vcc is applied to a power supply terminal 3. The collector of a bipolar transistor Q1 is connected to the power supply terminal 3, and the emitter thereof is connected to the output terminal 2. The collector of a bipolar transistor Q2 is connected to the output terminal 2, and the emitter thereof is connected to a ground terminal 4. A resistor Z1 is connected between the base and emitter of the bipolar transistor Q1, and a resistor Z2 is connected between the base and emitter of the bipolar transistor Q2.

As shown in FIG. 1, a P-channel MOS transistor MP1 is connected between the power supply terminal 3 and the base of the bipolar transistor Q1. An N-channel MOS transistor MN1 is connected between the output terminal 2 and the base of the bipolar transistor Q2. The gates of the MOS transistors MP1 and MN1 are connected to thee input terminal 1, via which the input signal voltage $V_{IN}$ is applied to the gates thereof. The MOS transistors MP1 and MN1 have identical dimensions.

FIG. 2 is a graph showing a DC (direct current) operation of the inverter circuit 100 shown in FIG. 1. The horizontal axis of the graph and a curve I denote the input signal voltage $V_{IN}$. A curve II denotes the output voltage $V_{OUT}$ with respect to the input signal voltage $V_{IN}$. A curve III denotes a base voltage V1 of the bipolar transistor Q1 with respect to the input signal voltage $V_{IN}$. The aforementioned threshold voltage Vth3 corresponds to a voltage obtained at a cross point A3 at which the curves I and II cross, and is equal to 2.56 [V].

FIGS. 3 through 6 are waveform diagrams showing AC (alternating current) operations of the inverter circuit 100. The horizontal axes of the waveform diagrams of FIGS. 3 through 6 denote time t [nsec]. These diagrams show voltage and current waveforms observed at nodes of the inverter circuit 100 when the input signal voltage $V_{IN}$ is changed with time according to the curve I (FIGS. 3 and 6). In figures described below, curves indicating voltages and currents observed at the same nodes are given the same Roman numbers.

A description will now be given of the circuit operation observed when the input signal voltage $V_{IN}$ is changed according to the curve I shown in FIG. 3. FIG. 3 shows a case where the capacitance of the output load of the output terminal 2 is 1 [pF]. In FIG. 3, a curve IV indicates the base voltage of the bipolar transistor Q2, that is, the base-emitter voltage $V_{BE2}$ thereof. The difference between the curve II and the curve III corresponds to the base-emitter voltage $V_{BE1}$ of the bipolar transistor Q1.

When the input signal voltage $V_{IN}$ is at a low level, the P-channel MOS transistor MP1 shown in FIG. 1 is ON, and the N-channel MOS transistor MN1 is OFF. Hence, a switching control is performed so that the bipolar transistor Q1 is ON, and the bipolar transistor Q2 is OFF. The base-emitter voltages $V_{BE1}$ and $V_{BE2}$ are approximately equal to 0.6 [V] and 0 [V] around time $t_1$ shown in FIG. 3, respectively. It can be seen from the above that the bipolar transistor Q1 is ON and the bipolar transistor Q2 is OFF.

When the input signal voltage $V_{IN}$ is at a high level, the P-channel MOS transistor MP1 is OFF and the N-channel MOS transistor MN1 is ON. Hence, a switching control is performed so that the bipolar transistor Q1 is OFF, and the bipolar transistor Q2 is ON. The base-emitter voltages VBE1 and $V_{BE2}$ are approximately equal to 0 [V] and 0.5 [V] around time $t_2$ shown in FIG. 3, respectively. It can be seen from the above that the bipolar transistor Q1 is OFF and the bipolar transistor Q2 is ON. Hence, the output voltage $V_{OUT}$ has a waveform indicated by the curve II which corresponds to the inverted version of the waveform of the input signal voltage $V_{IN}$.

The waveform of the output voltage $V_{OUT}$ changes with a change of the output load capacitance Co. When Co=0 [pF], the output voltage $V_{OUT}$ has a waveform similar to a rectangular wave, rather than the curve II. When Co=2 [pF], the output voltage $V_{OUT}$ has a waveform corresponding to a rounded version of the curve II.

As shown in FIG. 4, the base voltage V1 of the bipolar transistor Q1 changes with a change of the output load capacitance Do together with the waveform (not shown) of the output voltage $V_{OUT}$. In FIG. 4, a curve IIIa indicates a waveform of the base voltage V1 observed when Co=0 [pF], and a curve IIIb indicates a waveform thereof observed when Co=2 [pF].

In an operation in which the input signal voltage $V_{IN}$ switches from the low level to the high level and the output voltage $V_{OUT}$ switches from the high level to the low level, a current instantaneously flows in the resistor Z1 when the N-channel MOS transistor MN1 is turned ON. Hence, the base-emitter voltage $V_{BE1}$ of the bipolar transistor Q1 becomes equal to a voltage drop developing across the resistor Z1, and the output voltage $V_{OUT}$ is switched from the high level to the low level in a state in which the bipolar transistor Q1 is ON.

FIG. 5 shows a variation in the base-emitter voltage $V_{BE1}$ (which corresponds to the difference between the curve II and the curve III) in which the output load capacitance Co functions as a parameter. In FIG. 5, a curve Va indicates a waveform of the base-emitter voltage $V_{BE1}$ observed when Co=0 [pF], and a curve V indicates a waveform thereof observed when Co=1 [pF]. Further, a curve Vb indicates a waveform of the base-emitter voltage $V_{BE1}$ observed when Co=2 [pF].

As shown in FIG. 5, the base-emitter voltage $V_{BE1}$ drastically increases around t=211 [nsec] when the output voltage $V_{OUT}$ is switched from the high level to the low level (see FIG. 3), and then decreases. An unnecessary pass-through current flows in the bipolar transistor Q1 from the power source when the base-emitter voltage $V_{BE1}$ drastically increases.

The above behavior is shown in FIG. 6, which shows, together with the input signal voltage $V_{IN}$ (curve I) and the output voltage $V_{OUT}$ (curve II), a curve VI indicating a power supply current $I_{CC}$ and a curve VII indicating a ground current $I_{GG}$, these curves being observed when Co=1 [pF]. As shown in FIG. 6, a propagation delay time tpLH until the output voltage $V_{OUT}$ rises to Vcc/2 after the input signal voltage $V_{IN}$ falls to Vcc/2 is equal to 440 [psec], and a propagation delay time tpHL until the output voltage $V_{OUT}$ falls to Vcc/w after the input signal voltage $V_{IN}$ rises to Vcc/2 is equal to 415 [psec].

The power supply current $I_{CC}$ flowing around t=201 [nsec] is needed in order to charge the output load capacitance Co and switch the output voltage $V_{OUT}$ from the low level to the high level. However, the output voltage $V_{OUT}$ is switched from the high level to the low level around t=211 [nsec], and the power supply current ICC equal to 3–4 [mA] flowing at that time is an unnecessary current. An unnecessary power PLOSS consumed at that time is 38.4 [μW/MHz], which is obtained by integrating the power supply current $I_{CC}$ and dividing the integrated value by the frequency of the signal.

With the above in mind, an improved Bi-CMOS circuit as shown in FIG. 7 has been proposed which is intended to eliminate an increase in the base-emitter voltage $V_{BE1}$ (a hatched area shown in FIG. 5) and reduce the power supply current $I_{CC}$ flowing when the output voltage $V_{OUT}$ is switched from the high level to the low level.

An improved inverter circuit 110 shown in FIG. 7 includes an N-channel MOS transistor MN2 connected, with respect to the input terminal 1, in parallel with the P-channel MOS transistor MP1 and the N-channel MOS transistor MN1. These MOS transistors MP1, MN1 and MN2 have identical dimensions. More particularly, the source of the N-channel MOS transistor MN2 is grounded, and the drain thereof is connected to the base of the bipolar transistor Q1. When the input signal voltage $V_{IN}$ switches from the low level to the high level, that is, the output voltage $V_{OUT}$ is switched from the high level to the low level, the N-channel MOS transistor MN2 is turned ON in response to the input signal voltage $V_{IN}$ at the same time as the N-channel MOS transistor MN1 is turned ON. Hence, the N-channel MOS transistor MN2 draws the base current of the bipolar transistor Q1, and functions to rapidly turn it ON.

FIG. 8 is a graph showing the DC operation of the inverter circuit 110. As shown in FIG. 8, a threshold voltage Vth4 corresponds to the value of the input signal voltage $V_{IN}$ obtained at a cross point A4 at which the curves I and II cross. Due to the provision of the N-channel MOS transistor MN2, the threshold voltage is 0.89 [V] lower than the threshold voltage Vth3, and is hence 1.70 [V].

FIGS. 9 through 12 are waveform diagrams showing the AC operations of the inverter circuits 110. FIGS. 9, 10, 11 and 12 show the operations observed in the same conditions as those for the operations shown in FIGS. 3, 4, 5 and 6. The waveforms of the input signal voltages $V_{IN}$ indicated by the curves I shown in FIGS. 9 and 12 are the same as those shown in FIGS. 3 and 6.

As shown in FIG. 12, the unnecessary power supply current $I_{CC}$ flowing when the output voltage $V_{OUT}$ is switched from the high level to the low level (t=210–211 [nsec]) is reduced, due to the function of the aforementioned N-channel MOS transistor MN2, to approximately 0.5 [mA], which causes any critical problems. The unnecessary power PLOSS consumed at that time is calculated so that PLOSS=32.4 [μW/MHz].

The above unnecessary power is deduced by 6 [μW/MHz] (16%) less than that of the inverter circuit 100 shown in FIG. 1. The propagation delay time tpLH becomes 880 [psec], which is 440 [psec] (+100%) more than that of the inverter circuit 100. The propagation delay time tpHL becomes 330 [psec], which is 85 [psec] less than that of the inverter circuit 100.

Due to the function of the N-channel MOS transistor MN2, the base voltage V1 of the bipolar transistor Q1 falls more rapidly than that in the inverter circuit 100 when the output voltage $V_{OUT}$ is switched from the high level to the low level. That is, as shown in FIG. 9, the output voltage $V_{OUT}$ is gradually decreased due to the influence of the output load capacitance Co, while the base voltage V1 falls more rapidly than the output voltage $V_{OUT}$. Further, as shown in FIG. 10, the fall time of the base voltage V1 is approximately constant irrespective of how large the output load capacitance Co is.

Hence, as shown in FIG. 11, an increase of the base-emitter voltage $V_{BE1}$ occurring when the output voltage $V_{OUT}$ is switched from the high level to the low level is eliminated. However, a reverse voltage (emitter-base reverse voltage) of 3 [V] occurs when Co=2 [pF]. It is known that the occurrence of the EB reverse voltage degrades the reliability of transistors.

In short, a reduction in the unnecessary power supply current $I_{CC}$ in the above-mentioned conventional Bi-CMOS circuit flowing when the output voltage $V_{OUT}$ is switched from the high level to the low level increases the propagation delay time tpLH generated when the output voltage $V_{OUT}$ is switched from the low level to the high level due to a decrease in the threshold voltage, and generates the EB reverse voltage degrading the reliability of transistors.

In order to reduce the unnecessary power supply current $I_{CC}$ and reduce the propagation delay time tpLH and the EB reverse voltage, it may be possible to form a Bi-CMOS circuit described below.

An inverter circuit 120 shown in FIG. 13 includes an N-channel MOS transistor MN3 connected in series between the source of the N-channel MOS transistor MN2 and the ground. The MOS transistors MP1, MN1, MN2 and MN3 have identical dimensions.

As shown in FIG. 13, the source of the N-channel MOS transistor MN3 is grounded and the drain thereof is connected to the source of the N-channel MOS transistor MN2. Further, the gate of the N-channel MOS transistor MN3 is connected to the power supply terminal 3, and is thus biased. Hence, the impedance between the source and drain of the transistor MN3 is made constant and functions as a resistance element. Hence, the impedance between connected between the base of the bipolar transistor Q1 and the ground becomes greater than that in the circuits shown in FIGS. 1 and 7, and reduces a decrease of the threshold voltage.

FIG. 14 is a graph showing the DC operation of the inverter 120 observed at the above-mentioned time. A threshold voltage Vth5 corresponds to the input signal voltage $V_{IN}$ obtained at a cross point A5 at which the curves I and II cross. Due to the provision of the N-channel MOS transistors MN2 and MN3, the threshold voltage Vth5 is 0.66 [V] lower than the threshold voltage Vth3, and hence becomes equal to 1.90 [V]. That is, due to the function of the N-channel MOS transistor MN3, a decrease in the threshold voltage Vth5 is 0.22 [V] less than that in the threshold voltage Vth4.

FIGS. 15 through 18 are waveform diagrams showing the AC operations of the inverter circuit 120. FIGS. 15, 16, 17 and 18 show the operations observed in the same conditions as those for the operations shown in FIGS. 3, 4, 5 and 6, respectively. The waveforms indicated by the curves I in FIGS. 15 and 18 are the same as those shown in FIGS. 3 and 6.

As shown in FIG. 18, the unnecessary current $I_{CC}$ flowing when the output voltage $V_{OUT}$ is switched from the high level to the low level (t=210–211 [nsec]) is approximately equal to 0.5 [mA], which does not cause any critical problems. The unnecessary power PLOSS consumed at that time is calculated so that PLOSS=31.3 [µW/MHz].

The above value of the consumed power is 7.1 [µW/MHz] (18%) lower than that in the inverter circuit 100 shown in FIG. 1. Further, the propagation delay time tpLH becomes 785 [psec], which is 345 [psec] (+78%) more than that of the inverter circuit 100. The propagation delay time tpHL becomes 340 [psec], which is 75 [psec] less than that of the inverter circuit 100.

Furthermore, the base voltage V1 of the transistor Q1 rises more rapidly than the output voltage $V_{OUT}$ rises as in the case of the inverter circuit 110 shown in FIG. 7 when the output voltage $V_{OUT}$ is switched from the high level to the low level (FIG. 15), and is approximately constant irrespective of how large the output load capacitance Co is (FIG. 16).

As shown in FIG. 17, it becomes possible to prevent an increase in the base-emitter voltage $V_{BE1}$ 1 observed when the output voltage $V_{OUT}$ is switched from the high level to the low level in the presence of the load capacitance Co. The EB reverse voltage obtained when Co=2 [pF] is reduced by 0.76 [V] and becomes –2.25 [V].

A description will now be given of operation waveforms observed when the size of each of the MOS transistors MN1, MN2 and MN3 is reduced to half that of the P-channel MOS transistor MP1 in the circuit configuration shown in FIG. 12.

FIG. 19 is a graph showing the DC operation observed when the MOS transistors are sized as described above. A threshold voltage Vth6 corresponds to the input signal voltage $V_{IN}$ obtained at a cross point A6 at which the curves I and II cross. By changing the sizes of the MOS transistors as mentioned above, the threshold voltage Vth6 becomes 0.25 [V] higher than the threshold voltage Vth5 and equal to 2.15 [V]. That is, a decrease in the threshold voltage Vth6 is reduced by 0.47 [V].

FIGS. 20 through 23 are waveform diagrams showing the AC operations of the inverter circuit 120 in which the MOS transistors are sized as described before. FIGS. 20, 21, 22 and 23 show the operations observed in the same conditions as those for the operations shown in FIGS. 3, 4, 5 and 6, respectively. The waveforms indicated by the curves I in FIGS. 20 and 23 are the same as those shown in FIGS. 3 and 6.

As shown in FIG. 23, the unnecessary current $I_{CC}$ flowing when the output voltage $V_{OUT}$ is switched from the high level to the low level (t=210–211 [nsec]) is approximately equal to 0.3 [mA], which does not cause any critical problems. The unnecessary power PLOSS consumed at that time is calculated so that PLOSS=29.6 [µW/MHz].

The above value of the consumed power is 8.8 [µW/MHz] (23%) lower than that in the inverter circuit 100 shown in FIG. 1. Further, the propagation delay time tpLH becomes 675 [psec], which is 235 [psec] (+53%) more than that of the inverter circuit 100. The propagation delay time tpHL becomes 415 [psec], which is equal to that of the inverter circuit 100.

Furthermore, the base voltage V1 of the transistor Q1 rises more rapidly than the output voltage $V_{OUT}$ rises as in the case of the inverter circuit 110 shown in FIG. 7 when the output voltage $V_{OUT}$ is switched from the high level to the low level (FIG. 20), and is approximately constant irrespective of how large the output load capacitance Co is (FIG. 21).

As shown in FIG. 22, it becomes possible to prevent an increase in the base-emitter voltage $V_{BE1}$ observed when the output voltage $V_{OUT}$ is switched from the high level to the low level in the presence of the load capacitance Co. The EB reverse voltage is –2.17 [V] when Co=2 [pF], this value being approximately equal to that of the circuit configuration in which all the MOS transistors have identical dimensions.

The characteristics of the conventional Bi-CMOS inverter circuits 100, 110 and 120 are shown in FIG. 36, which will be described later.

With the above-mentioned structure, it becomes possible to reduce the unnecessary power supply current $I_{CC}$ and reduce the propagation delay time tpLH and the EB reverse voltage.

As has been described previously, it becomes possible to prevent a decrease in the threshold voltage Vth to obtain satisfactory characteristics by reducing the size of the N-channel MOS transistor MN3. However, the input signal voltage $V_{IN}$ is applied to the N-channel MOS transistor NM3. Hence, reduction in the size of the N-channel MOS transistors MN3 causes various restrictions in terms of, for example, layout of elements and interconnection lines and needs complicated pattern design. Particularly, these problems will be serious to multiple-input gate circuits.

SUMMARY OF THE INVENTION

It is an object of the present invention is to provide a Bi-CMOS circuit having a reduced unnecessary power supply current, a reduced propagation delay time and a reduced emitter-base reverse voltage, these advantages being achieved without reduction of the transistor size as described above.

The above object of the present invention is achieved by a Bi-CMOS circuit comprising: a first bipolar transistor having a collector connected to a first power supply line, an emitter connected to an output terminal, and a base; a second bipolar transistor having a collector connected to the output terminal, an emitter connected to a second power supply line, and a base; control means, coupled to the first and second bipolar transistors and comprised of a CMOS circuit, for performing switching controls of the first and second bipolar transistors on the basis of an input signal applied to an input terminal and for controlling an output signal output via the output terminal on the basis of the input signal; and turn-OFF means, operatively coupled to the first bipolar transistor and the control means, for temporality coupling the base of the first bipolar transistor to the second power supply line on the basis of a current flowing in the control means when the first bipolar transistor is turned OFF, so that the first bipolar transistor can be rapidly turned OFF.

The above object of the present invention is also achieved by a Bi-CMOS circuit comprising: a first bipolar transistor having a collector connected to a first power supply line, an emitter connected to an output terminal, and a base; a second bipolar transistor having a collector connected to the output terminal, an emitter connected to a second power supply line, and a base; control means, comprised of a CMOS circuit, for performing switching controls of the first and second bipolar transistors on the basis of a plurality of input signals applied to input terminals and for controlling an output signal output via the output terminal on the basis of the plurality of input signals; and instantaneous noise suppressing means, operatively coupled to the first bipolar transistor and the control means, for controlling a current flowing from the first power supply line to the base of the first bipolar transistor on the basis of logical changes in the plurality of input signals, so that an instantaneous noise caused at the output terminal at the time of the logical changes can be suppressed.

The above object of the present invention is also achieved by a Bi-CMOS circuit comprising: a first bipolar transistor having a collector connected to a first power supply line, an emitter connected to an output terminal, and a base; a second bipolar transistor having a collector connected to the output terminal, an emitter connected to a second power supply line, and a base; control means, comprised of a CMOS circuit, for performing switching controls of the first and second bipolar transistors on the basis of a plurality of input signals applied to input terminals and for controlling an output voltage output via the output terminal on the basis of the plurality of input signals; and reference voltage generating means for generating, from a first external voltage and a second external voltage, at least one internal power supply voltage dependent on a threshold voltage of MOS transistors of the CMOS circuit, the at least one internal power supply voltage being carried via either the first power supply line or the second power supply line, so that an instantaneous noise caused at the output terminal at the time of logical changes of the plurality of input signals can be suppressed.

The above object of the present invention is also achieved by a Bi-CMOS circuit comprising: a first bipolar transistor having a collector connected to a first power supply line, an emitter connected to an output terminal, and a base; a second bipolar transistor having a collector connected to the output terminal, an emitter connected to a second power supply line, and a base; control means, comprised of a CMOS circuit, for performing switching controls of the first and second bipolar transistors on the basis of a plurality of input signals applied to input terminals and for controlling an output voltage output via the output terminal on the basis of the plurality of input signals; and a first pad connected either the first power supply line or the second power supply line, the first pad receiving a power supply voltage dependent on a threshold voltage of MOS transistors of the CMOS circuit, the internal power supply voltage being carried via either the first power supply line or the second power supply line, so that an instantaneous noise caused at the output terminal at the time of logical changes of the plurality of input signals can be suppressed.

BRIEF DESCRIPTION OF THE DRAWINGS

Other objects, features and advantages of the present invention will become more apparent from the following detailed description when read in conjunction with the accompanying drawings, in which:

FIG. 36 is a diagram showing the operations of the conventional inverter circuits and the inverter circuit according to the first embodiment of the present invention;

FIGS. 41A and 41C is a circuit diagram of an inverter shown in FIG. 40;

FIGS. 41B and 41D is a circuit diagram of a two-input NAND circuit shown in FIG. 40;

FIG. 44 is a block diagram of a logic circuit using the conventional Bi-CMOS circuit;

FIGS. 45 A–C is a waveform diagram showing the AC operation of the circuit shown in FIG. 43;

DESCRIPTION OF THE PREFERRED EMBODIMENTS

Figure 24:
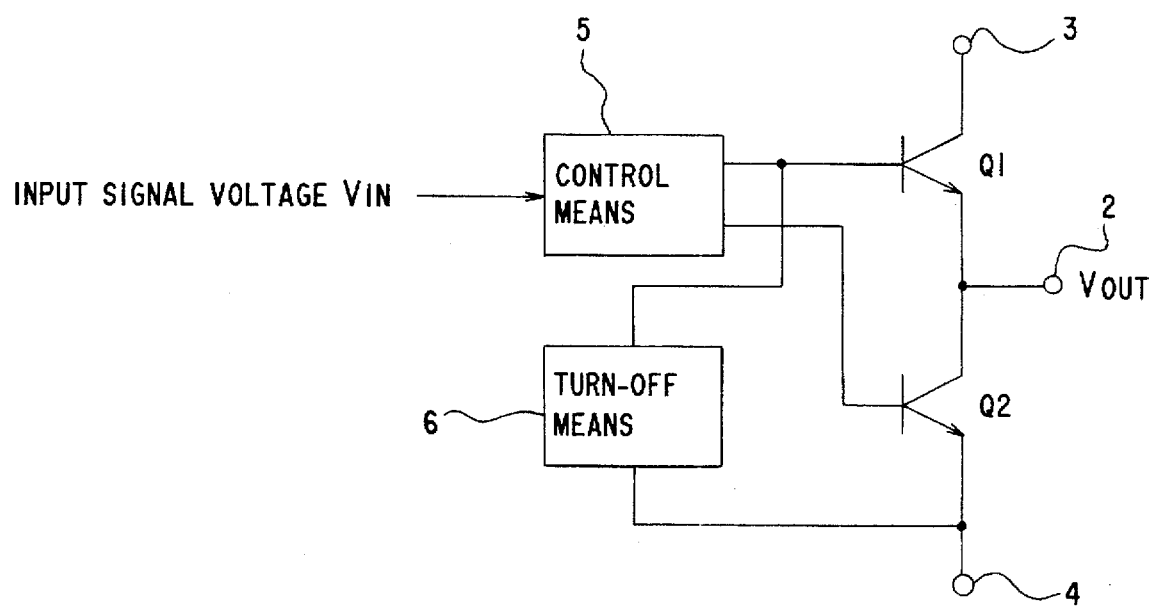
FIG. 24 is a diagram showing the principle of the present invention.

FIG. 24 is a diagram of the principle of the present invention. A Bi-CMOS circuit shown in FIG. 24 includes the first bipolar transistor Q1 and the second bipolar transistor Q2. The collector of the first bipolar transistor Q1 is connected to the power supply terminal 3, and the emitter thereof is connected to the output terminal 2. The collector of the second bipolar transistor Q2 is connected to the output terminal 2, and the emitter thereof is connected to the ground 4.

Further, the Bi-CMOS circuit includes a control means 5, which includes at least the aforementioned P-channel MOS transistor MP1 and the N-channel MOS transistor MN1. The control means 5 performs a switching control operation on the first bipolar transistor Q1 and the second bipolar transistor Q2 to thereby control the voltage of the output terminal 2 on the input signal voltage. A turn-OFF means 6 temporarily connects the base of the first bipolar transistor Q1 to the ground 4 on the basis of a current flowing in the control means 5 when the first bipolar transistor Q1 is turned OFF, whereby the turn-OFF means 6 rapidly turns OFF the first bipolar transistor Q1. Normally, the turn-OFF means 6 sets the base of the first bipolar transistor Q1 to a high impedance with respect to the ground 4.

With the above structure, it becomes possible to reduce the pass-through current flowing in the first bipolar transistor Q1 and reduce the reverse voltage between the base and emitter thereof. Further, the presence of the turn-OFF means 6 functions to substantially increase the threshold voltage that determines the logic operation of the control means 5. Hence, the increased threshold voltage can be caused to match the switching operation of the first bipolar transistor Q1 without changing the sizes of MOS transistors.

Figure 25:
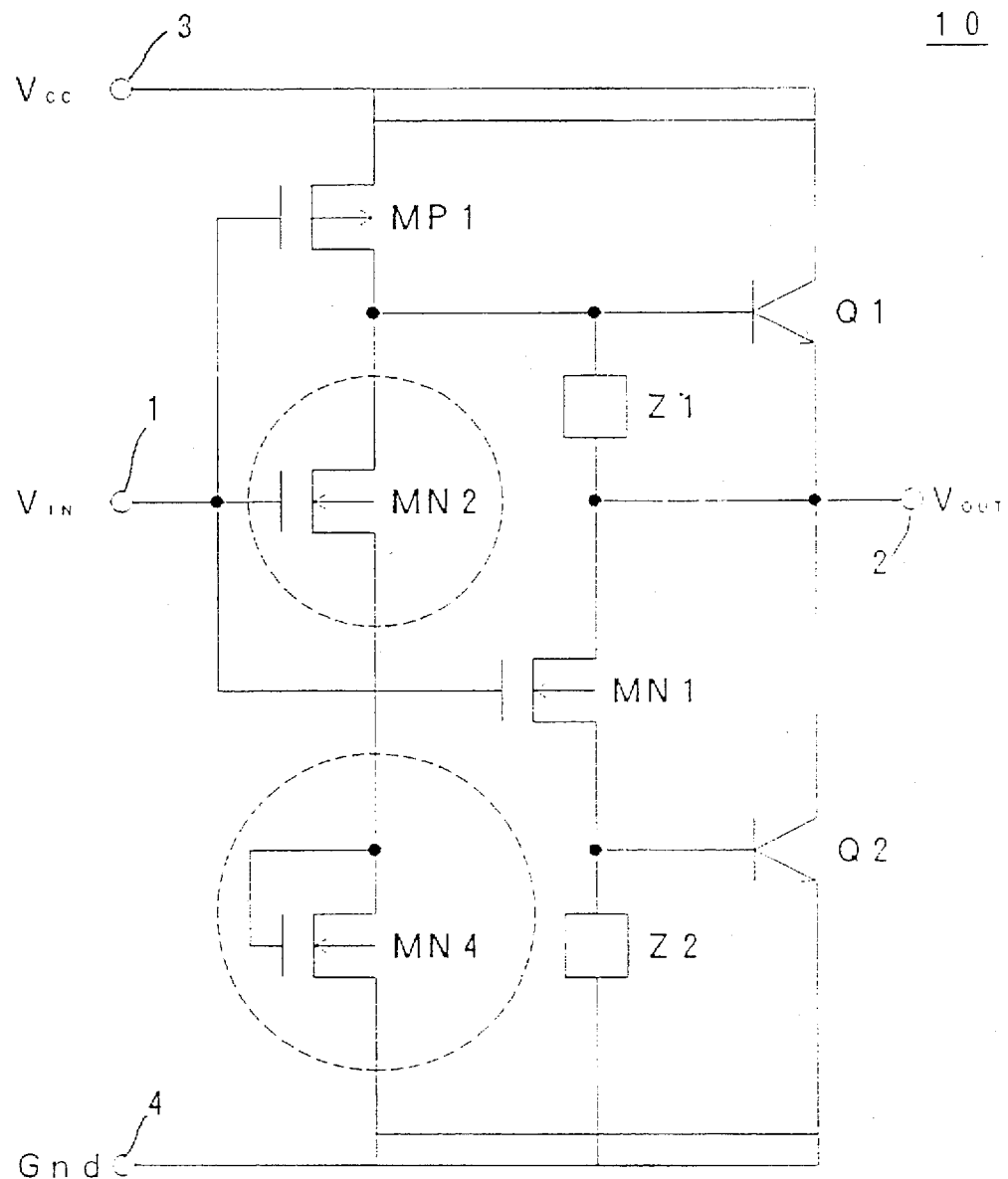
FIG. 25 is a circuit diagram of a Bi-CMOS circuit according to a first embodiment of the present invention.

FIG. 25 is a circuit diagram of an inverter circuit 10 formed by an impedance-type Bi-CMOS circuit according to a first embodiment of the present invention. The input signal voltage $V_{IN}$ applied to the input terminal 1 is inverted with respect to the predetermined threshold voltage Vth1, and the output voltage $V_{OUT}$ is output to the output terminal 2. A load capacitance not shown in FIG. 25 is coupled to the output terminal 2.

The power supply voltage Vcc is applied to the power supply terminal 3. The collector of the first bipolar transistor Q1 is connected to the power supply terminal 3, and the emitter thereof is connected to the output terminal 2. The collector of the second bipolar transistor Q2 is connected to the output terminal 2, and the emitter thereof is connected to the ground 4. The resistor Z1 is connected between the base and emitter of the bipolar transistor Q1, and the resistor Z2 is connected between the base and emitter of the bipolar transistor Q2.

The P-channel MOS transistor MP1 is connected between the power supply terminal 3 and the base of the bipolar transistor Q1. The N-channel MOS transistor MN1 is connected between the output terminal 2 and the base of the bipolar transistor Q2. The gates of the MOS transistors MP1 and MN1 are connected to the input terminal 1, and the input signal voltage is applied thereto. The control means 5 shown in FIG. 24 includes the MOS transistors MP1 and MN1.

The N-channel MOS transistor MN2 is connected, with respect to the input terminal 1, in parallel with the P-channel MOS transistor MP1 and the N-channel MOS transistor MN1. The drain of the N-channel MOS transistor MN2 is connected to the base of the bipolar transistor Q1.

The source of the N-channel MOS transistor MN2 is connected to the gate and drain of an N-channel MOS transistor MN4, the source of which transistor MN4 is grounded. The turn-OFF means 6 shown in FIG. 24 includes the N-channel MOS transistors MN2 and MN4. The N-channel MOS transistors MN2 and MN4 function to temporarily conduct a path between the base of the bipolar transistor Q1 and the ground 4 to turn OFF the transistor Q1 when the P-channel MOS transistor MP1 turns the transistor Q1 from ON to OFF.

The MOS transistors MP1, MN1, MN2 and MN4 have identical dimensions.

Figure 26:
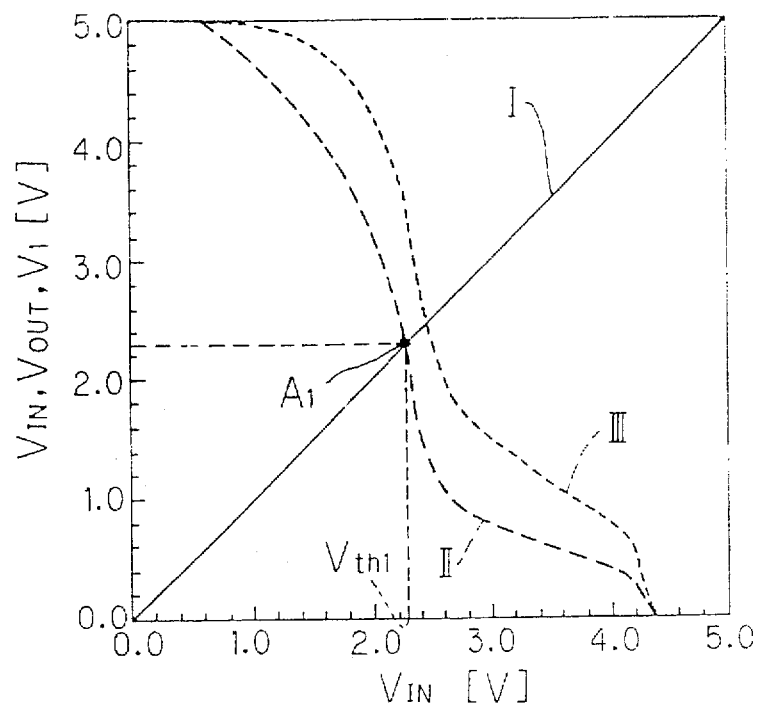
FIG. 26 is a graph showing the DC operation of the inverter circuit shown in FIG. 25.

FIG. 26 is a graph showing the DC operation of the inverter circuit 10. The threshold voltage Vth1 corresponds to the input signal voltage $V_{IN}$ obtained at a cross point A1 at which the curve I (input signal voltage $V_{IN}$) and the curve II (output voltage $V_{OUT}$) cross, and is equal to 2.28 [V]. This value of the threshold voltage Vth1 is only 0.28 [V] less than the threshold voltage Vth3 of the aforementioned inverter circuit 100 and is 0.38 [V] higher than the threshold voltage Vth5 of the aforementioned inverter circuit 120.

Figure 3:
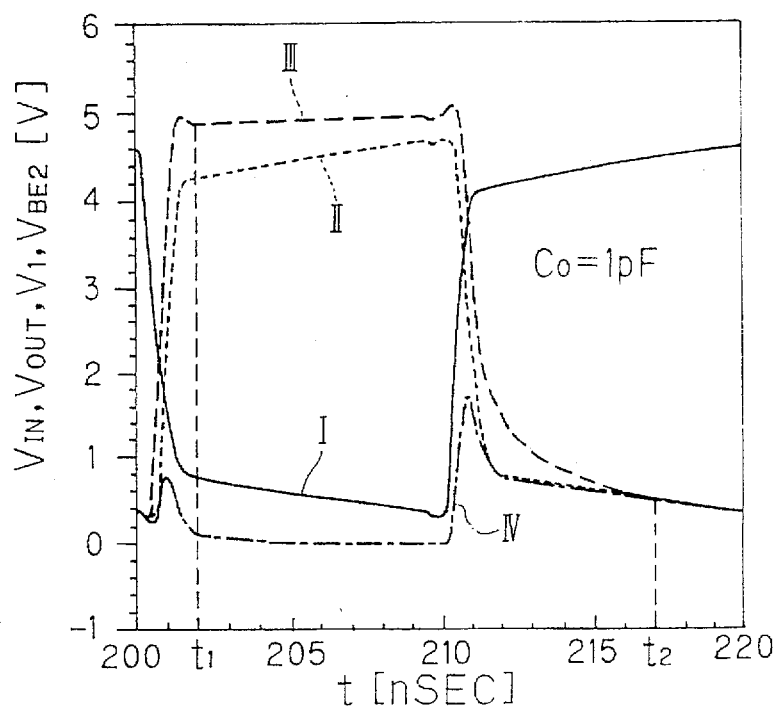
FIG. 3 is a waveform diagram showing the AC operation of the inverter circuit shown in FIG. 1.
Figure 4:
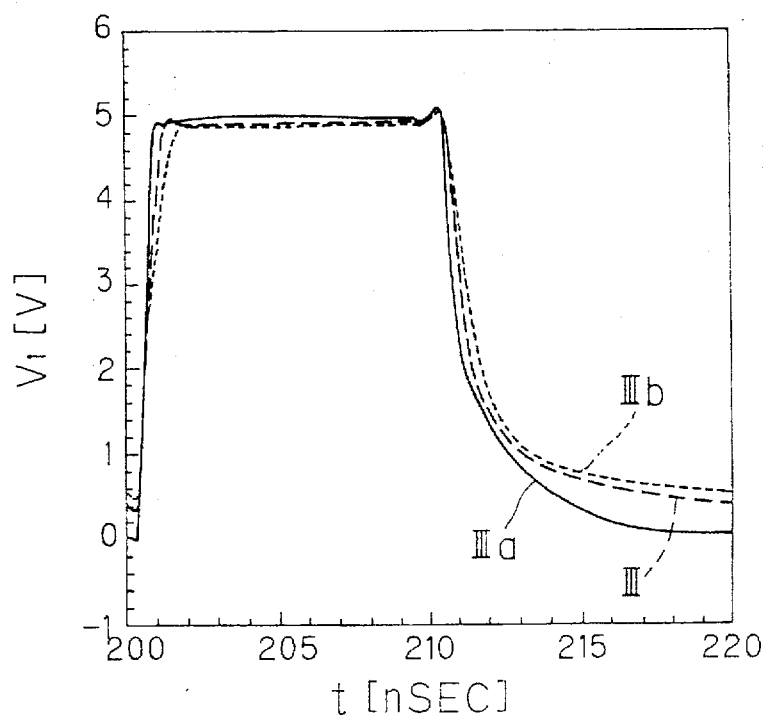
FIG. 4 is a waveform diagram showing the AC operation of the inverter circuit shown in FIG. 1.
Figure 5:
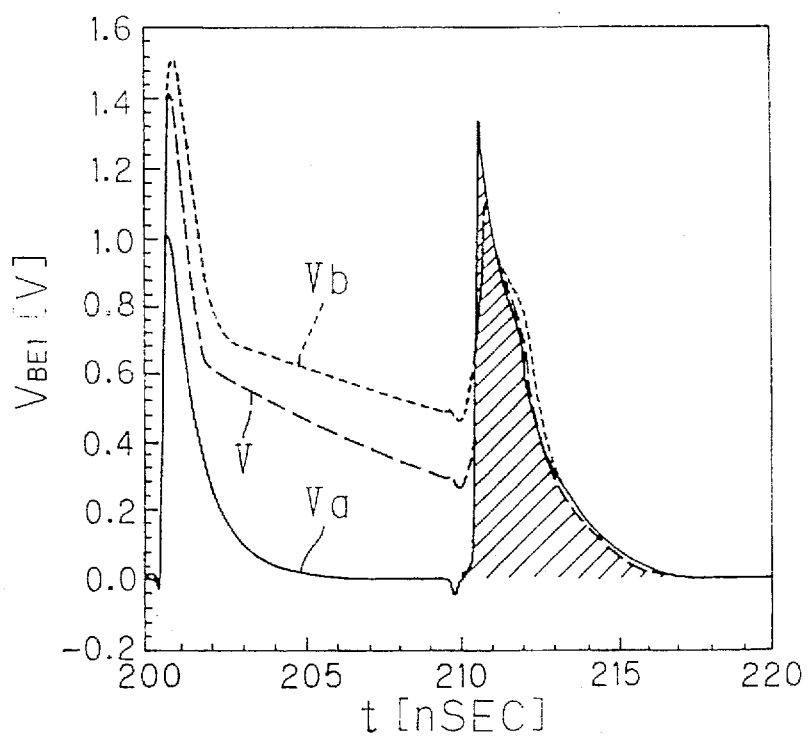
FIG. 5 is a waveform diagram showing the AC operation of the inverter circuit shown in FIG. 1.
Figure 6:
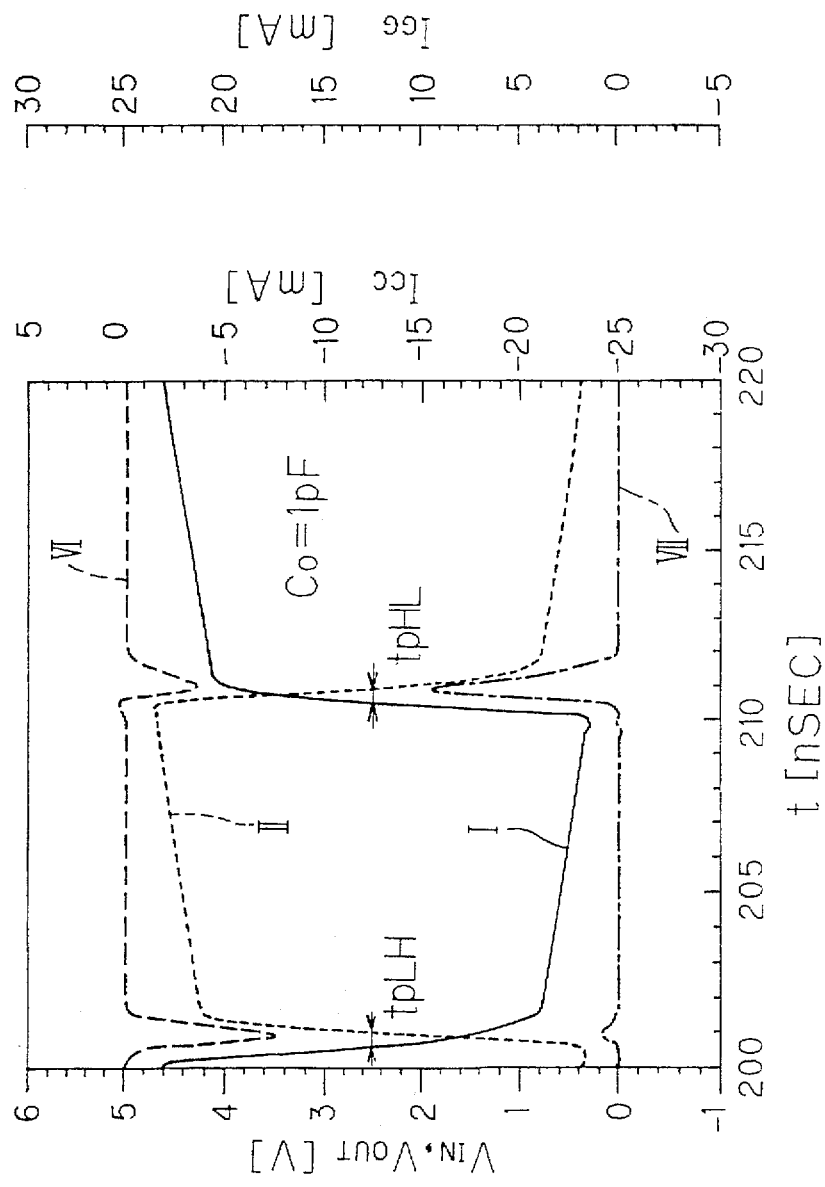
FIG. 6 is a waveform diagram showing the AC operation of the inverter circuit shown in FIG. 1.
Figure 27:
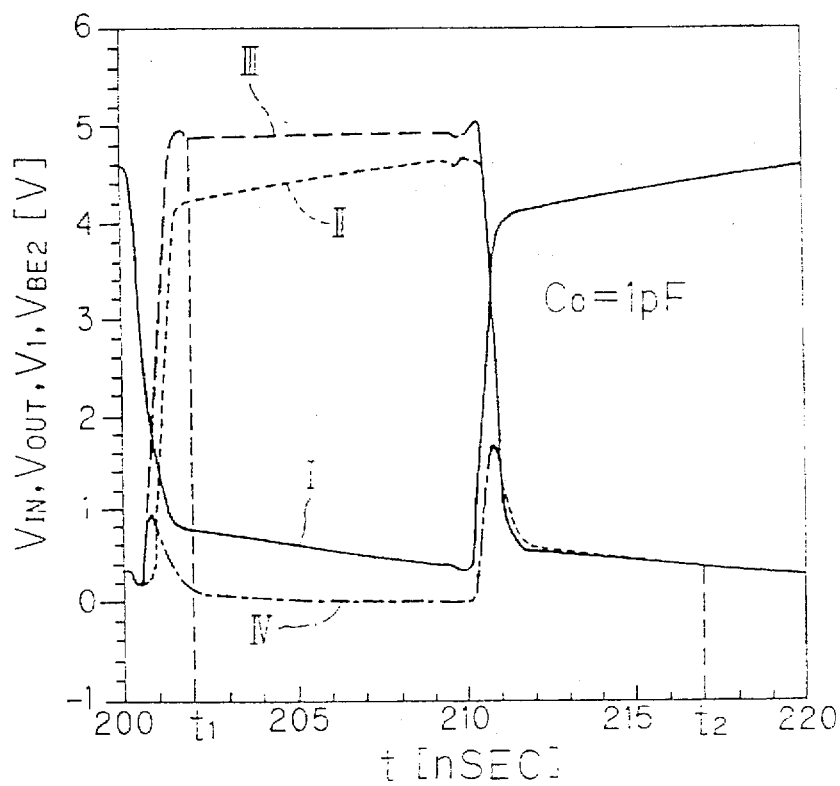
FIG. 27 is a waveform diagram showing the AC operation of the inverter circuit shown in FIG. 25.
Figure 28:
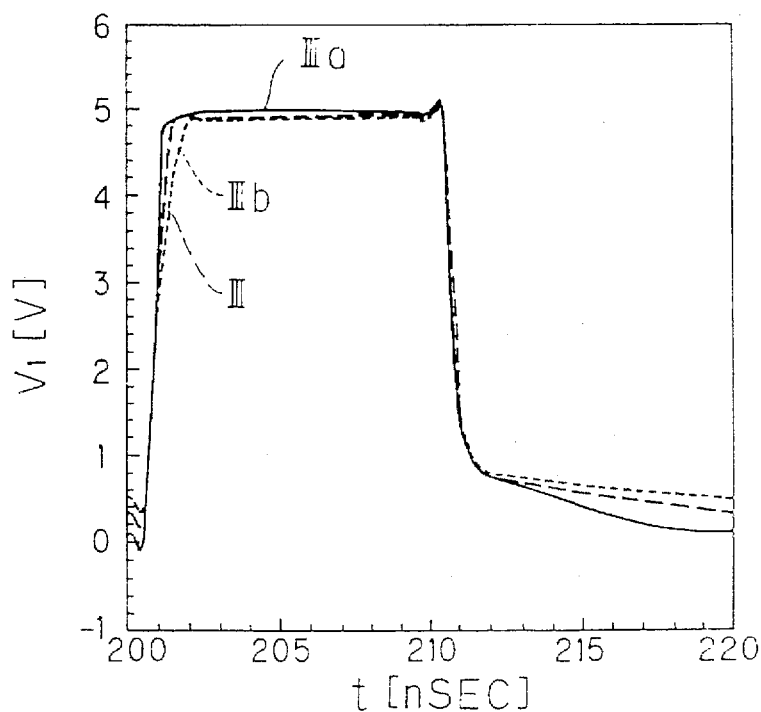
FIG. 28 is a waveform diagram showing the AC operation of the inverter circuit shown in FIG. 25.
Figure 29:
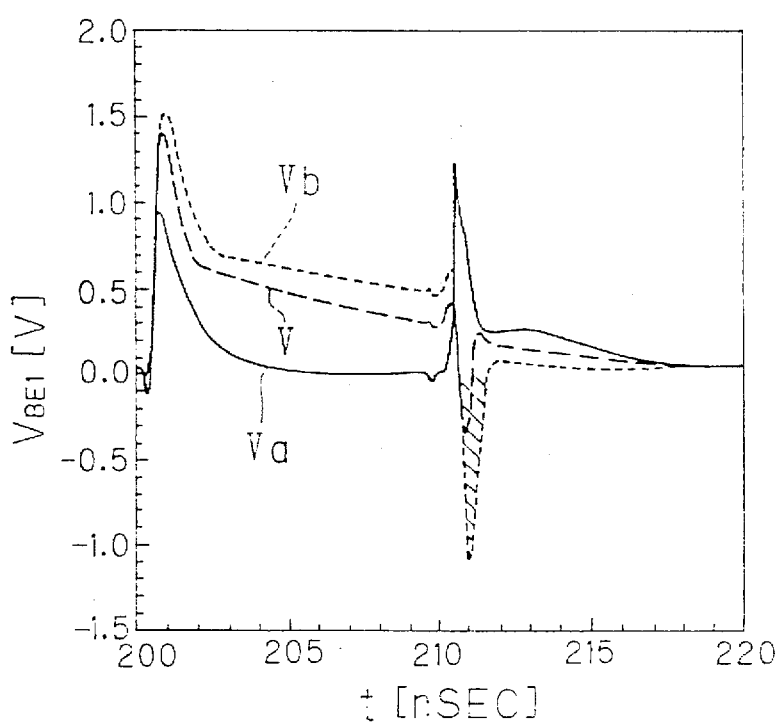
FIG. 29 is a waveform diagram showing the AC operation of the inverter circuit shown in FIG. 25.
Figure 30:
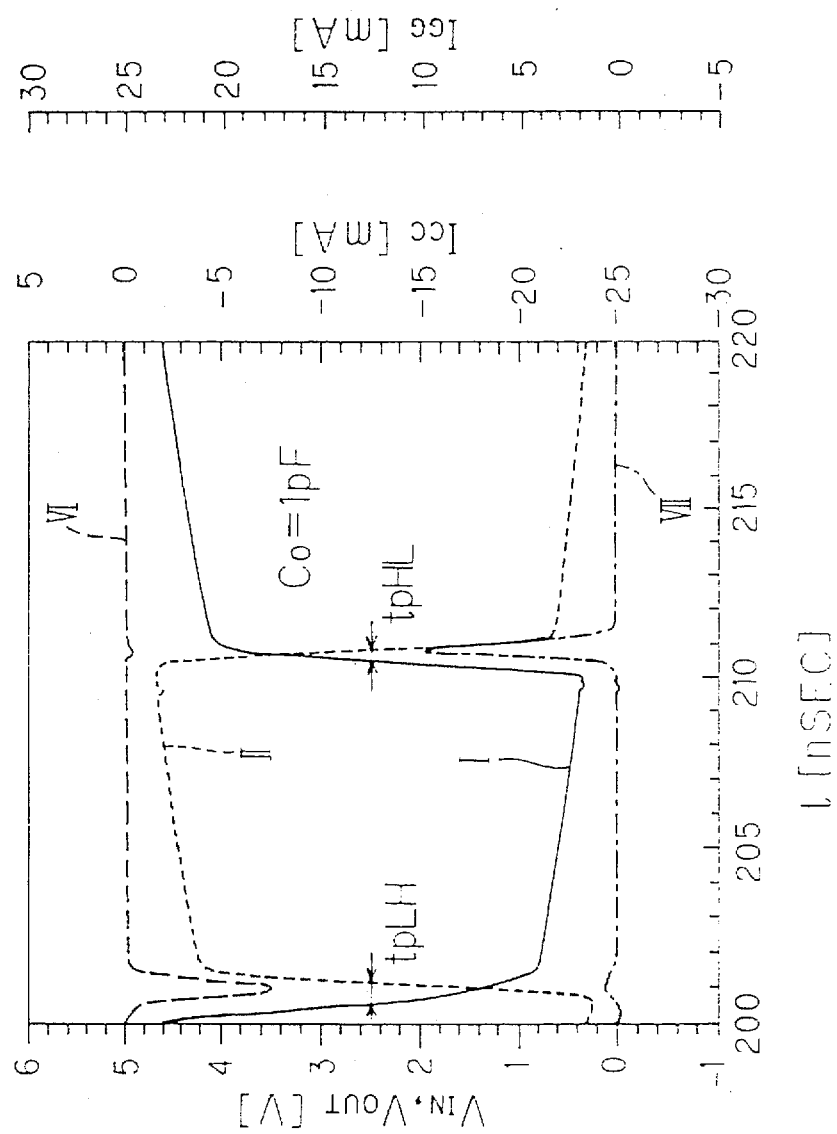
FIG. 30 is a waveform diagram showing the AC operation of the inverter circuit shown in FIG. 25.

FIGS. 27 through 30 are waveform diagrams showing the AC operations of the inverter circuit 10. In FIGS. 27 through 30, the horizontal axes denote the time t [nsec]. FIGS. 27 through 30 show the voltage and current waveforms obtained by changing the input signal voltage $V_{IN}$ with time according to the curve I (FIGS. 27 and 30). The waveform of the input signal voltage $V_{IN}$ related to FIGS. 27 through 30 is the same as that shown in FIG. 3 or FIG. 6. Further, FIGS. 27, 28, 29 and 30 show the operations observed under the same conditions as those related to FIGS. 3, 4, 5 and 6, respectively.

A description will now be given of the operation of the inverter circuit 10 when the input signal voltage $V_{IN}$ is changed according to the curve I shown in FIG. 27.

When the input signal voltage $V_{IN}$ is maintained at the low level, the P-channel MOS transistor MP1 shown in FIG. 25 is ON and the N-channel MOS transistor MN is OFF. Hence, the switching control is carried out so that the bipolar transistor Q1 is ON and the bipolar transistor Q2 is OFF. Simultaneously, the N-channel MOS transistor MN2 is OFF, and the N-channel MOS transistor MN4 is also OFF. More particularly, the base-emitter voltages $V_{BE1}$ and $V_{BE2}$ are approximately equal to 0.6 [V] and 0 [V] around time $t_1$ shown in FIG. 27. This shows that the bipolar transistor Q1 is ON and the bipolar transistor Q2 is OFF.

When the input signal voltage $V_{IN}$ is maintained at the high level, the P-channel MOS transistor MP1 is OFF and the N-channel MOS transistor MN1 is ON. Hence, the switching control is performed so that the bipolar transistor Q1 is OFF and the bipolar transistor Q2 is ON. More particularly, the base-emitter voltages $V_{BE1}$ and $V_{BE2}$ are approximately equal to 0 [V] and 0.5 [V] around time $t_2$, respectively. This shows that the bipolar transistor Q1 is OFF and the bipolar transistor Q2 is ON. Hence, the output voltage $V_{OUT}$ has a waveform indicated by the curve II reverse to the input signal voltage $V_{IN}$.

When the input signal voltage $V_{IN}$ switches from the low level to the high level and the output voltage $V_{OUT}$ is switched from the high level to the low level, the N-channel MOS transistor MN1 is turned ON and simultaneously the N-channel MOS transistor MN2 is turned ON. Hence, the gate of the N-channel MOS transistor MN4 connected to the source of the N-channel MOS transistor MN2 is switched to the high level, and the transistor MN4 is turned ON at the same time as the transistor MN2.

Figure 7:
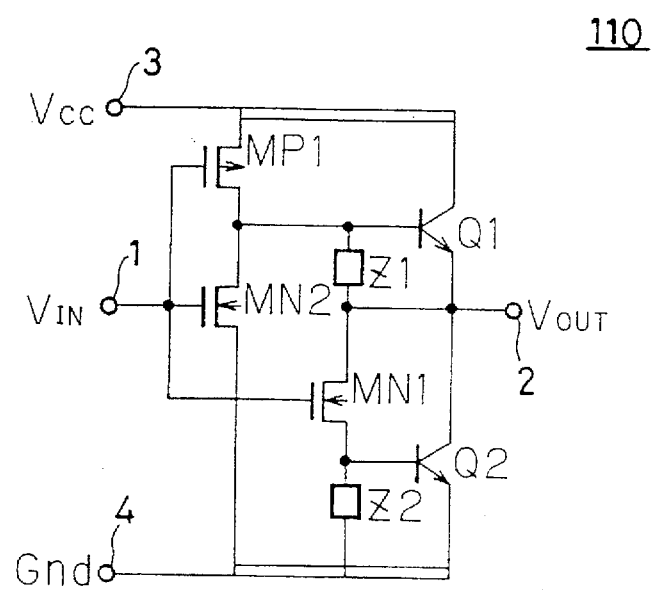
FIG. 7 is a circuit diagram of another conventional inverter circuit including a Bi-CMOS circuit.
Figure 8:
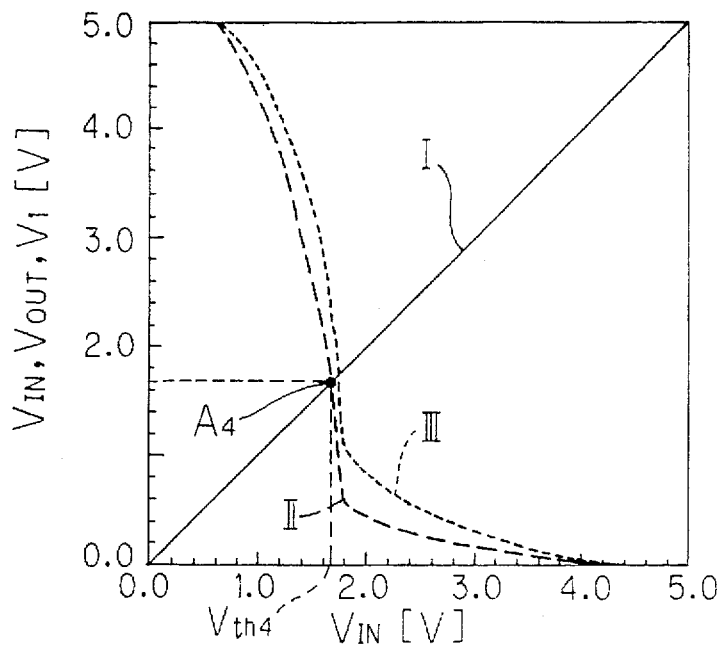
FIG. 8 is a graph showing the DC operation of the inverter circuit shown in FIG. 7.
Figure 9:
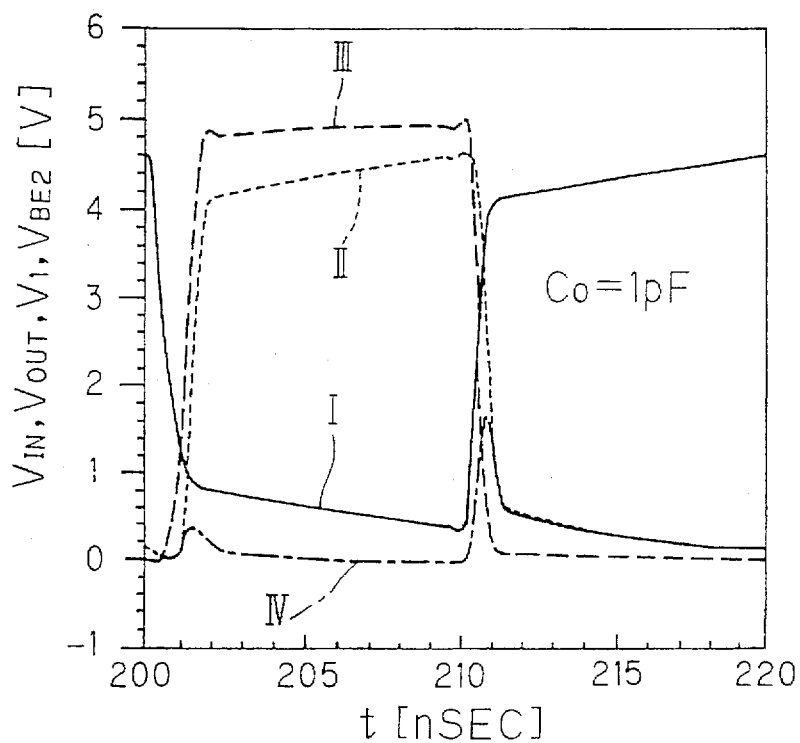
FIG. 9 is a waveform diagram showing the AC operation of the inverter circuit shown in FIG. 7.
Figure 13:
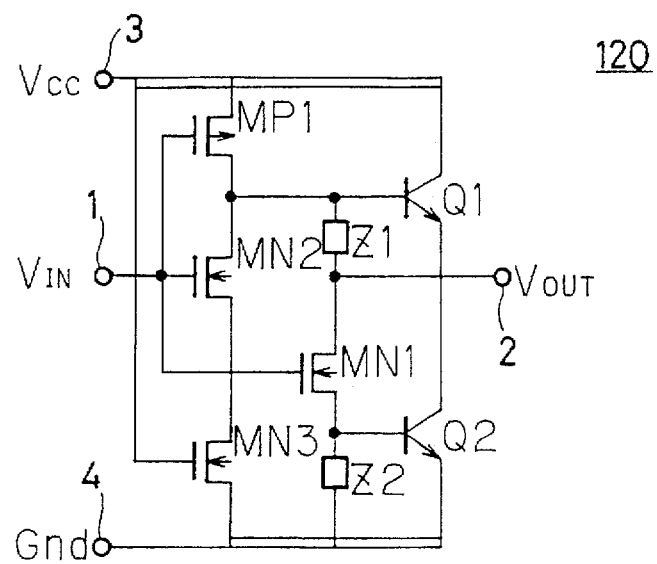
FIG. 13 is a circuit diagram of yet another conventional inverter circuit including a Bi-CMOS circuit.
Figure 14:
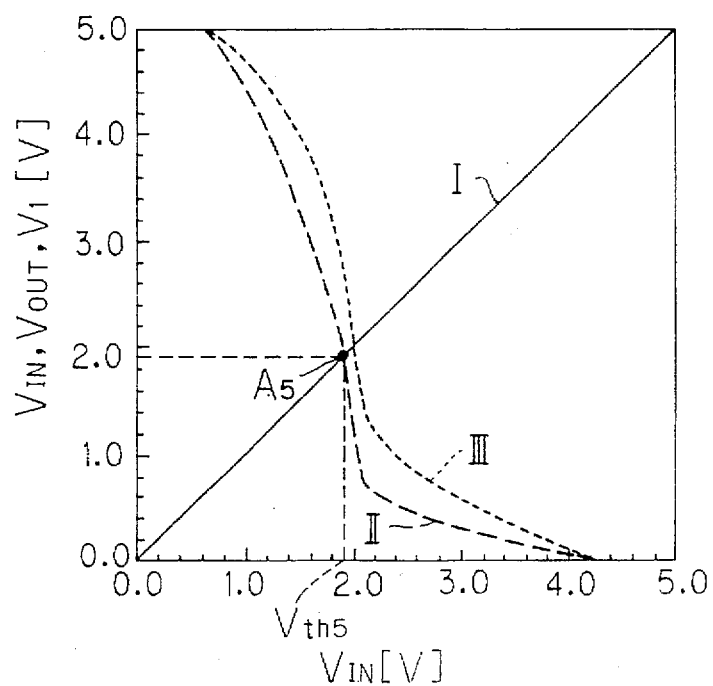
FIG. 14 is a graph showing the DC operation of the inverter circuit shown in FIG. 13.
Figure 15:
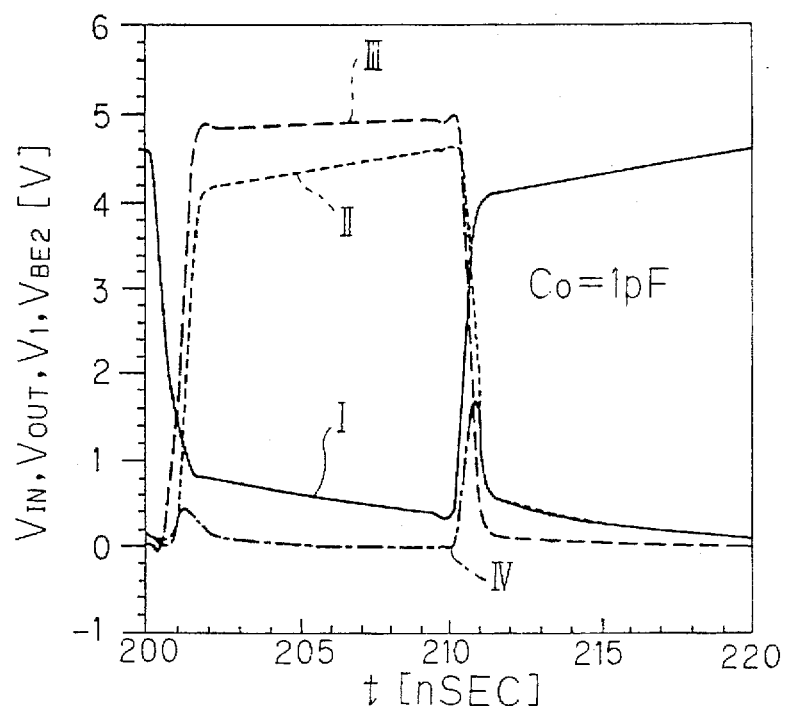
FIG. 15 is a waveform diagram showing the AC operation of the inverter circuit shown in FIG. 13.

Hence, the base of the bipolar transistor Q1 is conducted to the ground and the base voltage V1 thereof is rapidly decreased. As a result, the bipolar transistor Q1 is rapidly turned OFF. However, during the above operation, the N-channel MOS transistor MN4 functions as a variable impedance element, and hence the falling speed of the base voltage V1 is less than that of the inverter circuit shown in FIG. 7 or FIG. 13 (inverter circuit 110 or 120).

Figure 10:
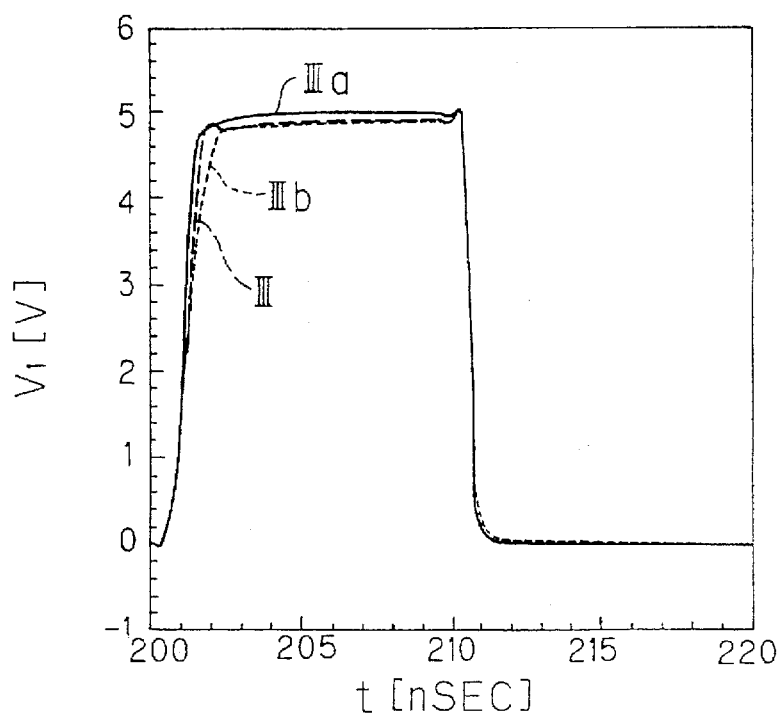
FIG. 10 is a waveform diagram showing the AC operation of the inverter circuit shown in FIG. 7.
Figure 11:
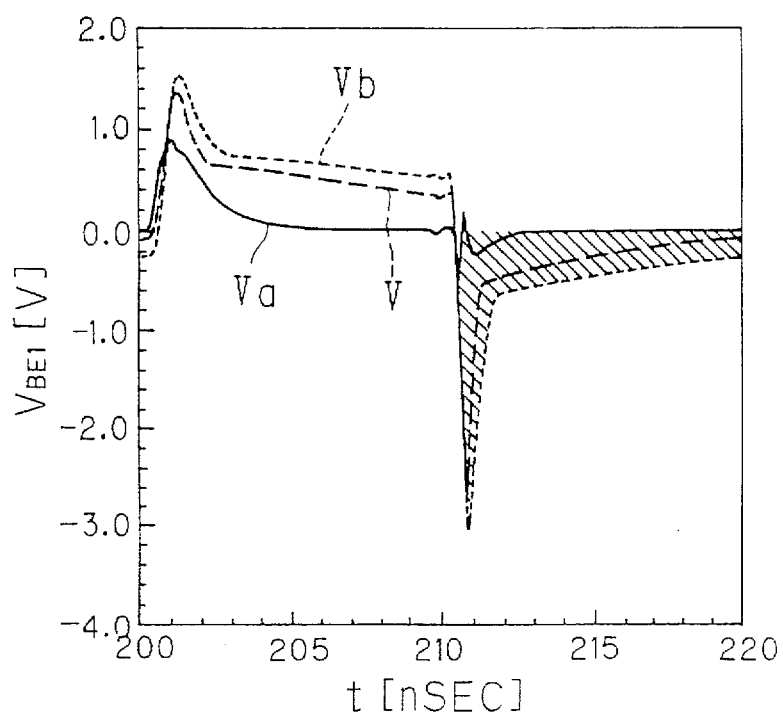
FIG. 11 is a waveform diagram showing the AC operation of the inverter circuit shown in FIG. 7.
Figure 12:
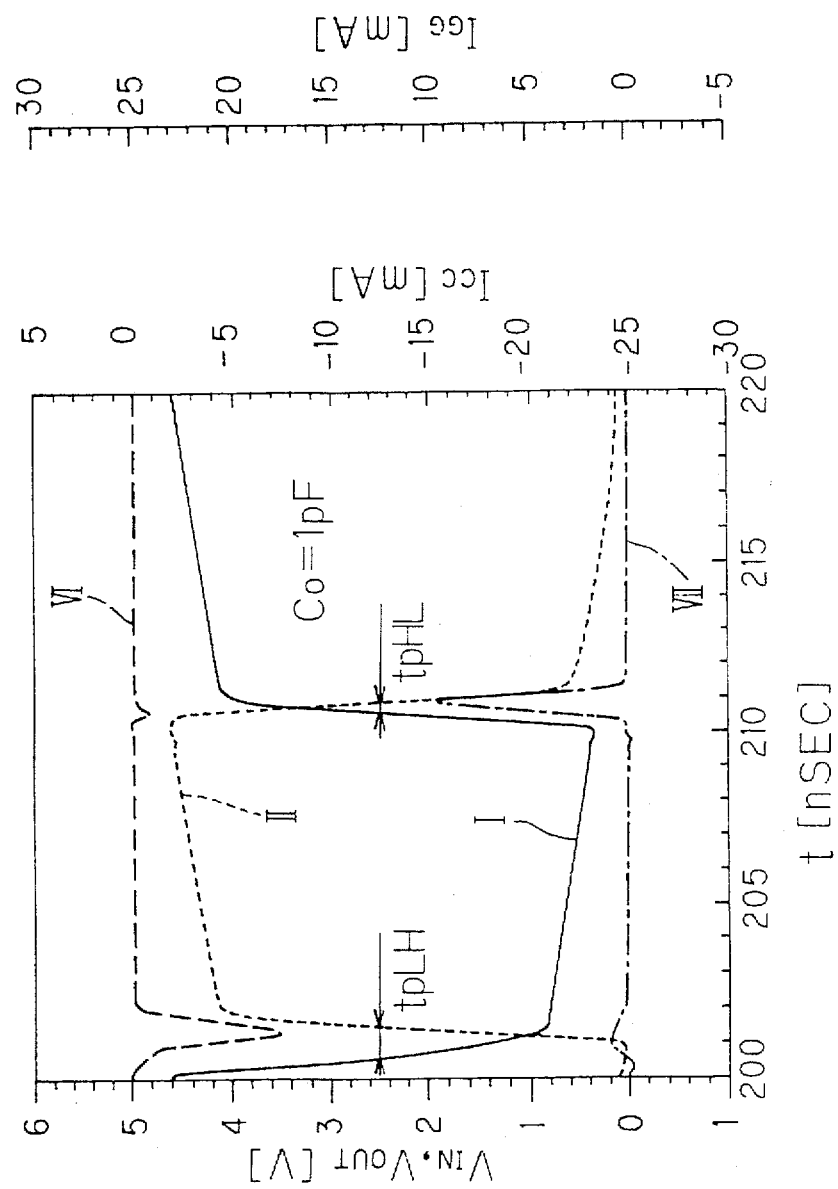
FIG. 12 is a waveform diagram showing the AC operation of the inverter circuit shown in FIG. 7.
Figure 16:
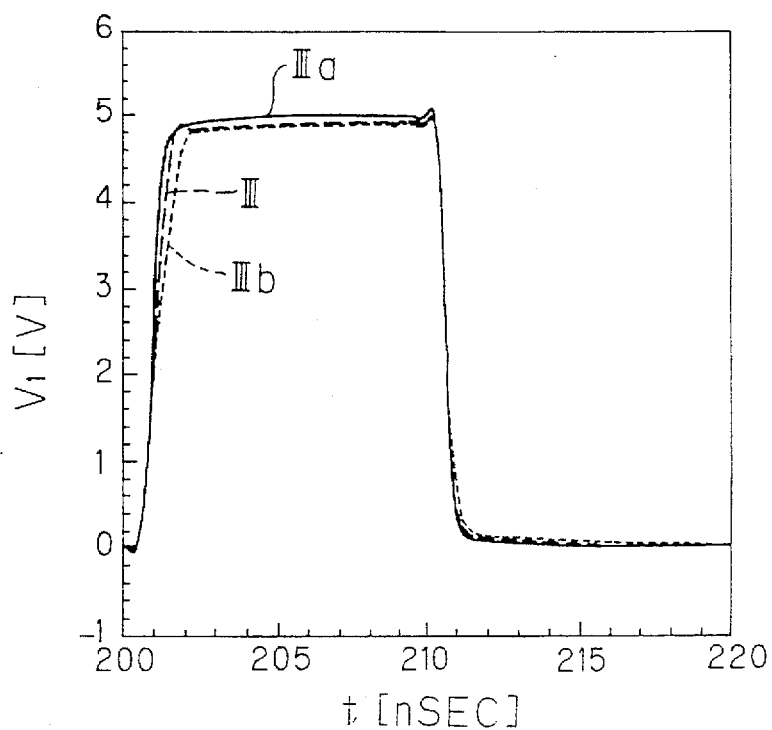
FIG. 16 is a waveform diagram showing the AC operation of the inverter circuit shown in FIG. 13.
Figure 17:
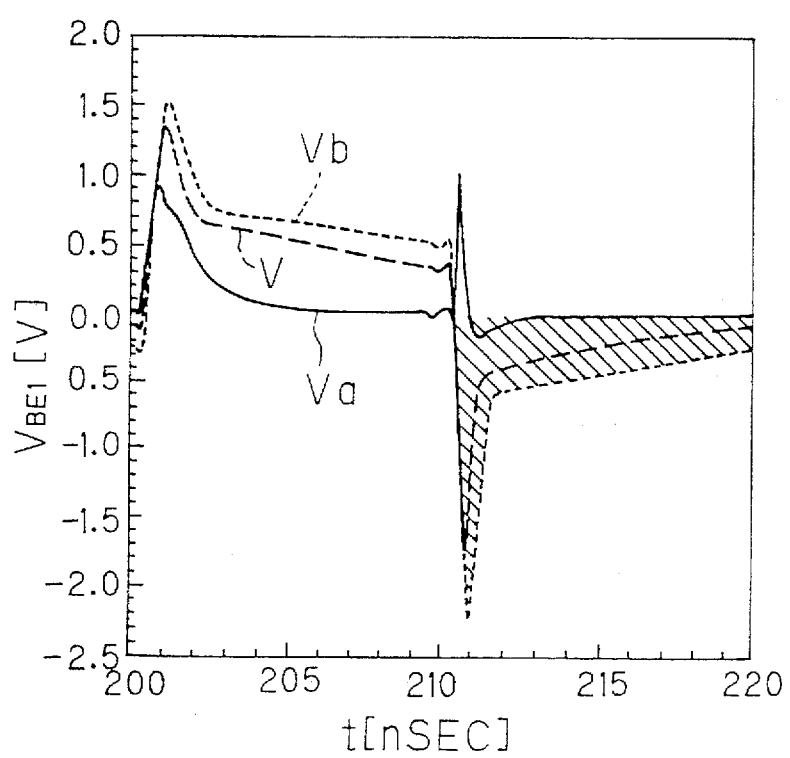
FIG. 17 is a waveform diagram showing the AC operation of the inverter circuit shown in FIG. 13.
Figure 18:
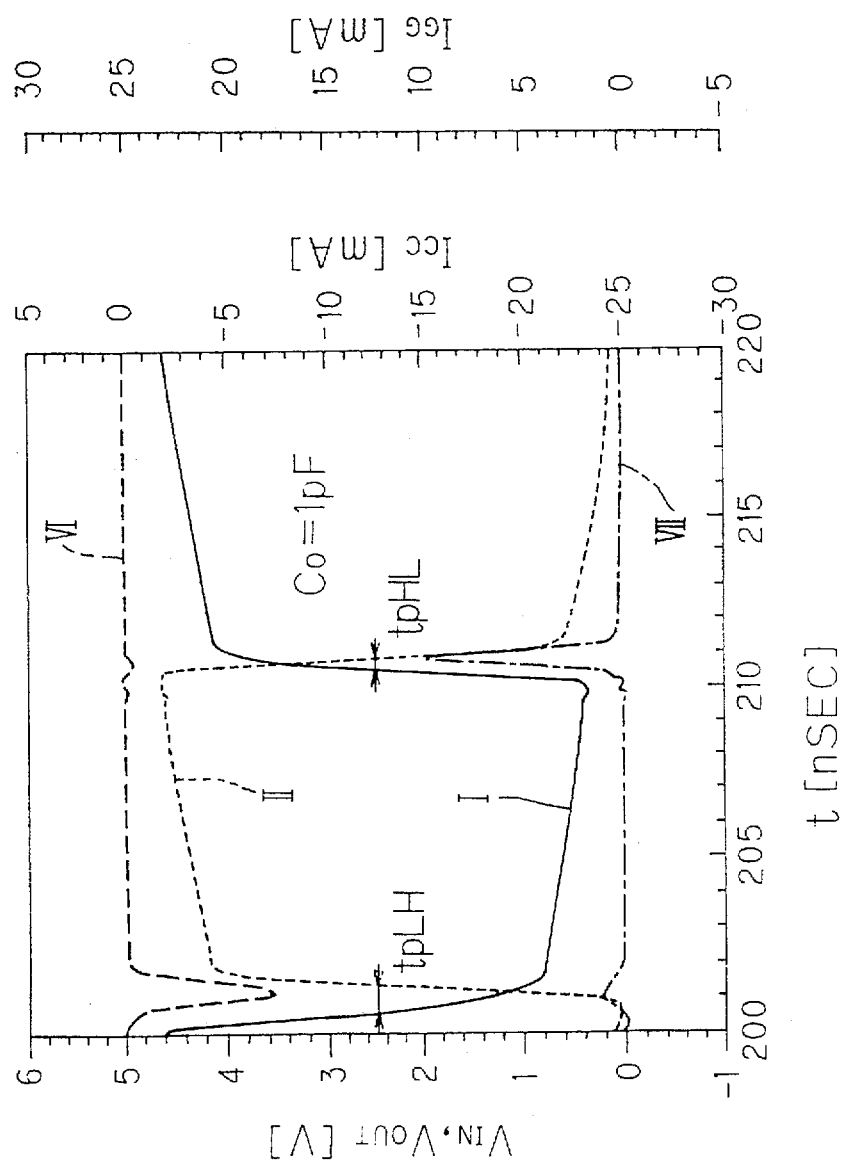
FIG. 18 is a waveform diagram showing the AC operation of the inverter circuit shown in FIG. 13.
Figure 19:
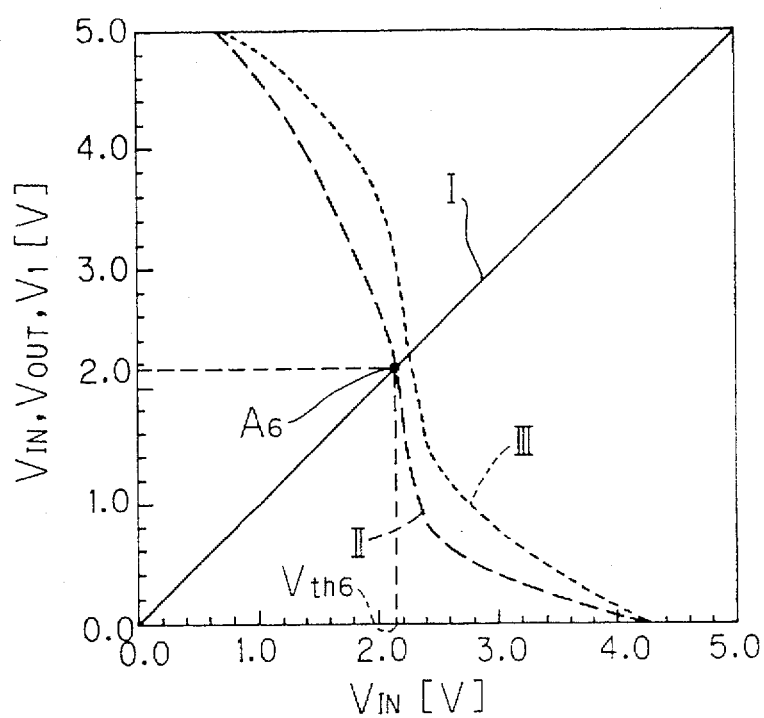
FIG. 19 is a graph showing the DC operation of a modified version of the inverter circuit shown in FIG. 13.
Figure 20:
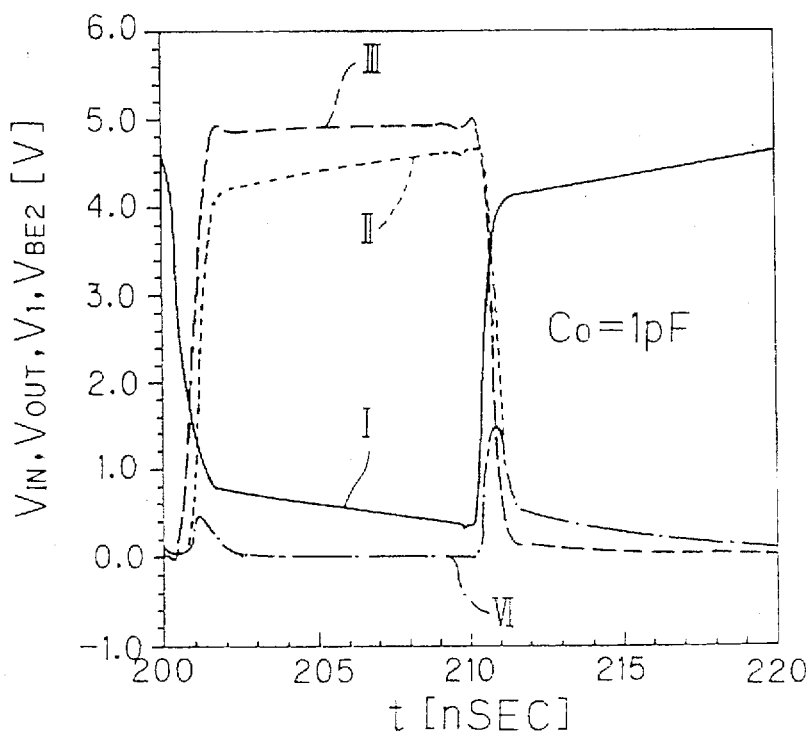
FIG. 20 is a waveform diagram showing the AC operation of the modified version of the inverter circuit shown in FIG. 13.
Figure 21:
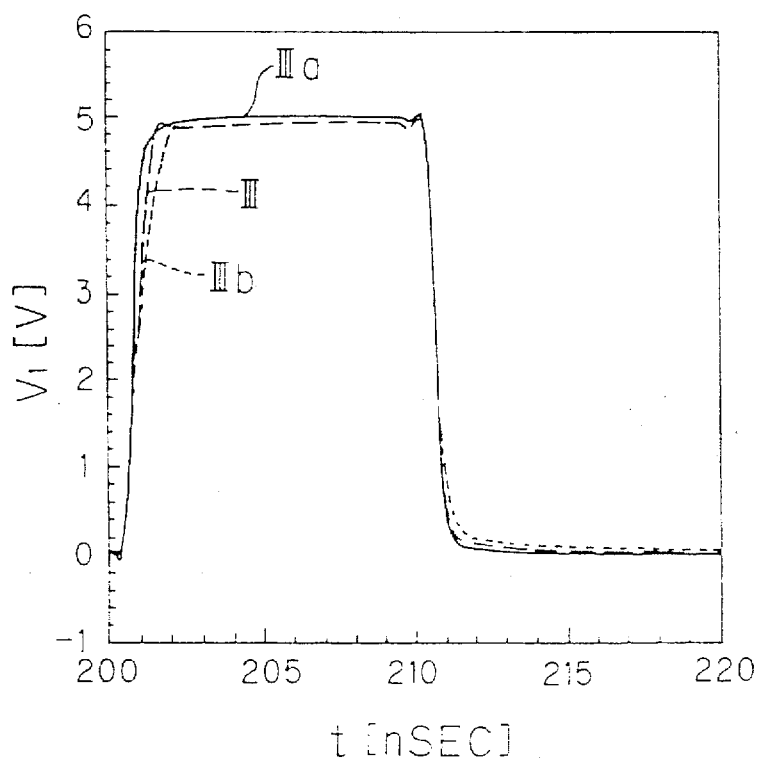
FIG. 21 is a waveform diagram showing the AC operation of the modified version of the inverter circuit shown in FIG. 13.
Figure 22:
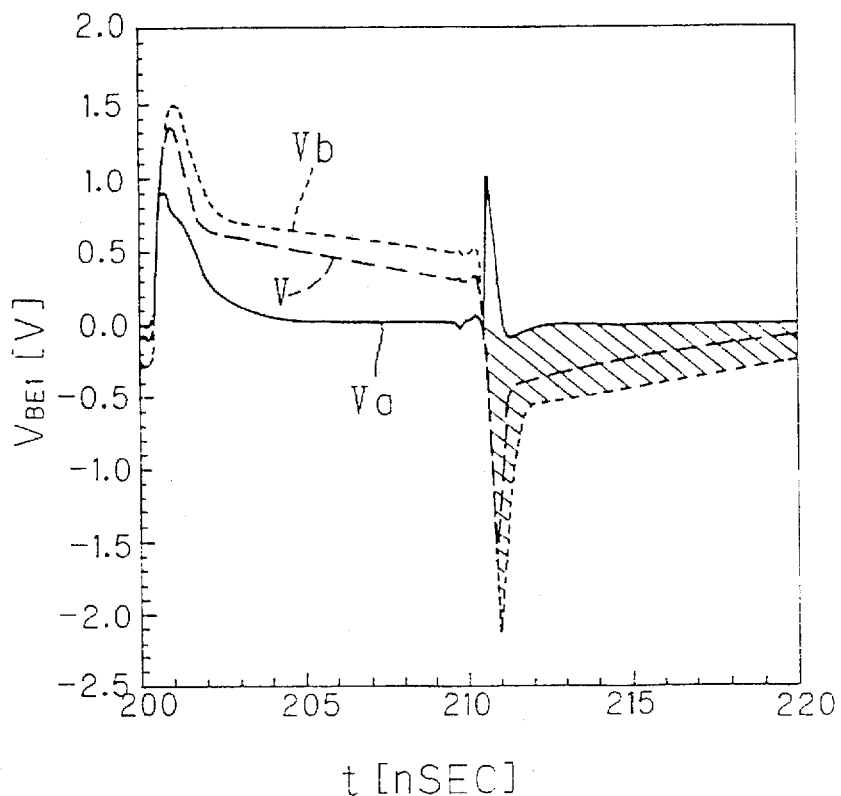
FIG. 22 is a waveform diagram showing the AC operation of the modified version of the inverter circuit shown in FIG. 13.
Figure 23:
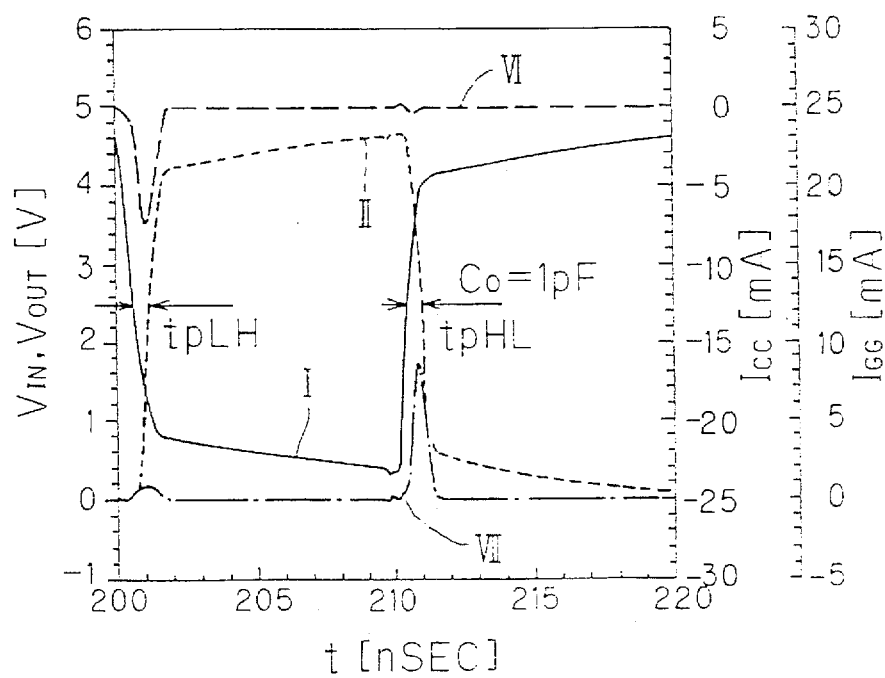
FIG. 23 is a waveform diagram showing the AC operation of the modified version of the inverter circuit shown in FIG. 13.

That is, as shown in FIG. 28, the waveform of the base voltage V1 changes together with that (not shown) of the output voltage $V_{OUT}$ in accordance with the output load capacitance Co. As the output load capacitance Co increases, the base voltage V1 rises with a time longer than that it takes the base voltage V1 to rise in the cases shown in FIGS. 10, 16 and 21. Hence, as shown in FIG. 29, the emitter-base (EB) reverse voltage can be reduced to 1.1 [V] when Co=2 [pF] by preventing a rapid increase of the base-emitter voltage $V_{BE1}$ of the bipolar transistor Q1. Hence, it become also possible to reduce the pass-through current flowing in the bipolar transistor Q1 from the power source due to a rapid increase in the base-emitter voltage $V_{BE1}$.

As shown in FIG. 30, it is possible to reduce the unnecessary power supply current $I_{CC}$ flowing around t=210–211 [nsec]. The unnecessary power PLOSS consumed at the above time is calculated so that PLOSS =28.1 [μW/MHz]. Further, the propagation delay time tpHL until the output voltage $V_{OUT}$ falls to Vcc/2 after the input signal voltage $V_{IN}$ rises to Vcc/2 is 350 [psec].

By the way, when the bipolar transistor Q1 is turned OFF, and the potential of the drain and gate of the N-channel MOS transistor MN4 falls to a level higher than the ground potential by the threshold voltage Vth of the transistor MN4, the N-channel MOS transistor MN4 is turned OFF. That is, the N-channel MOS transistor MN4 is normally OFF, and is temporarily turned ON when the P-channel MOS transistor MP1 performs the switching control of switching the transistor Q1 from ON to OFF, so that the base of the transistor Q1 is conducted to the ground via the transistor MN4.

Hence, the N-channel MOS transistor MN4 is OFF when the input signal voltage $V_{IN}$ switches from the high level to the low level and the output voltage $V_{OUT}$ is switched from the low level to the high level. When the N-channel MOS transistor MN4 is OFF, the drain of the N-channel MOS transistor MN2 and the ground 4 is set in the high-impedance state. That is, the base of the bipolar transistor Q1 is set in the high impedance state with respect to the ground 4.

Hence, when the input signal voltage $V_{IN}$ switches from the high level to the low level and the P-channel MOS transistor MP1 is turned ON, the current supplied by the P-channel MOS transistor MP1 does not flow to the ground 4, and most of the above current is supplied to the bipolar transistor Q1, so that the switching operation can be rapidly carried out.

With the result that the bipolar transistor Q1 is rapidly switched from OFF to ON, the propagation delay time tpLH can be reduced to, for example, 595 [psec] as shown in FIG. 30. The above value of the propagation delay time tpLH is 35% longer than that of the inverter circuit shown in FIG. 1, whereas half or more shorter than that of the inverter circuit 110 shown in FIG. 7 in which the elements are formed under the same condition.

A description will now be given of the operation waveform observed in a case where the MOS transistors MN1, MN2 and MN4 in the circuit configuration shown in FIG. 25 have dimensions half of those of the P-channel MOS transistor MP1.

Figure 31:
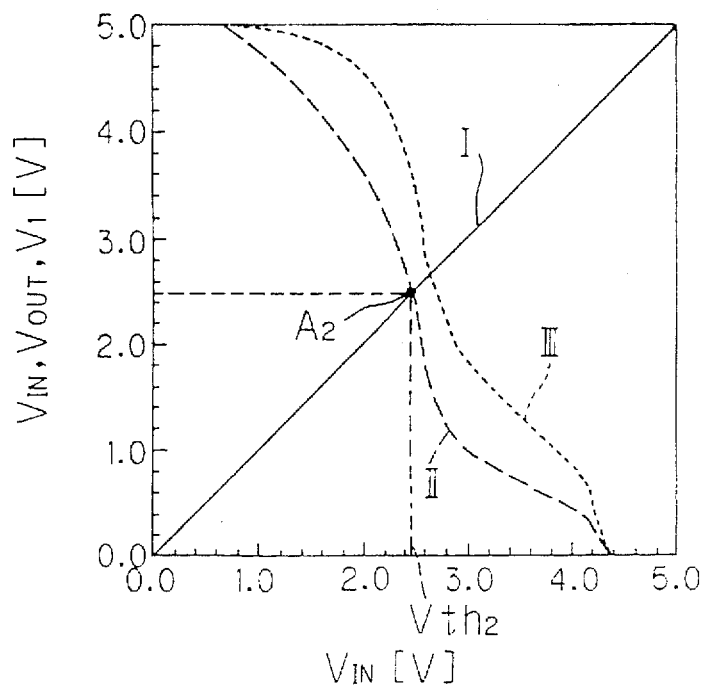
FIG. 31 is a graph showing the DC operation of a variation of the inverter circuit shown in FIG. 25.

FIG. 31 is a graph showing the DC operation of the inverter 10 in which the P-channel and N-channel MOS transistors are sized as described above. A threshold voltage Vth6 corresponds to the input signal voltage $V_{IN}$ obtained at a cross point A2 at which the curve I and the curve II cross. By changing the dimensions of the MOS transistors, the threshold voltage Vth2 becomes 0.20 [V] higher than the threshold voltage Vth and becomes equal to 2.48 [V]. That is, a decrease of the threshold voltage Vth2 is 0.33 [V] less than that in the threshold voltage Vth5, and 0.08 [V] lower than the threshold voltage Vth3.

Figure 32:
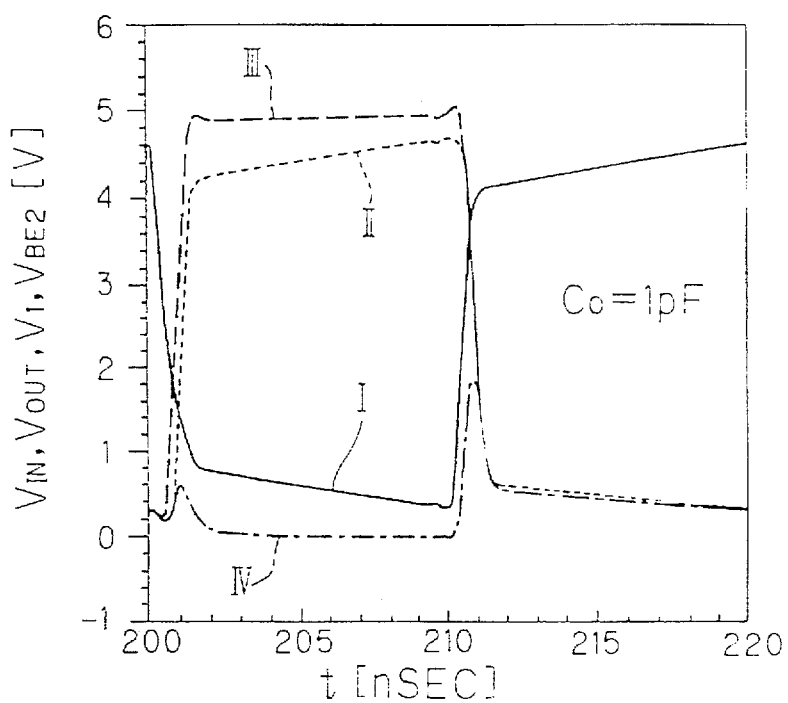
FIG. 32 is a waveform diagram showing the AC operation of the variation of the inverter circuit shown in FIG. 25.
Figure 33:
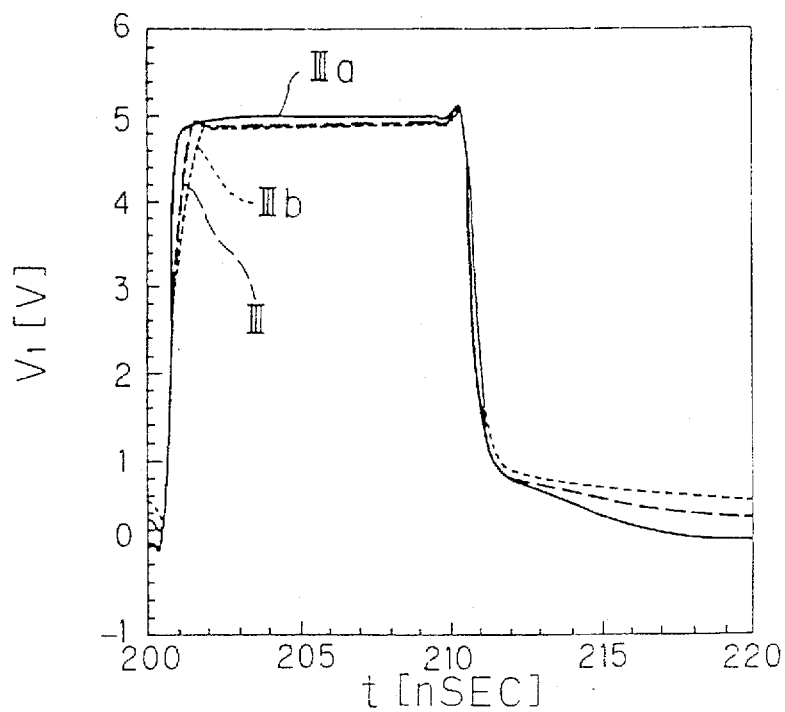
FIG. 33 is a waveform diagram showing the AC operation of the variation of the inverter circuit shown in FIG. 25.
Figure 34:
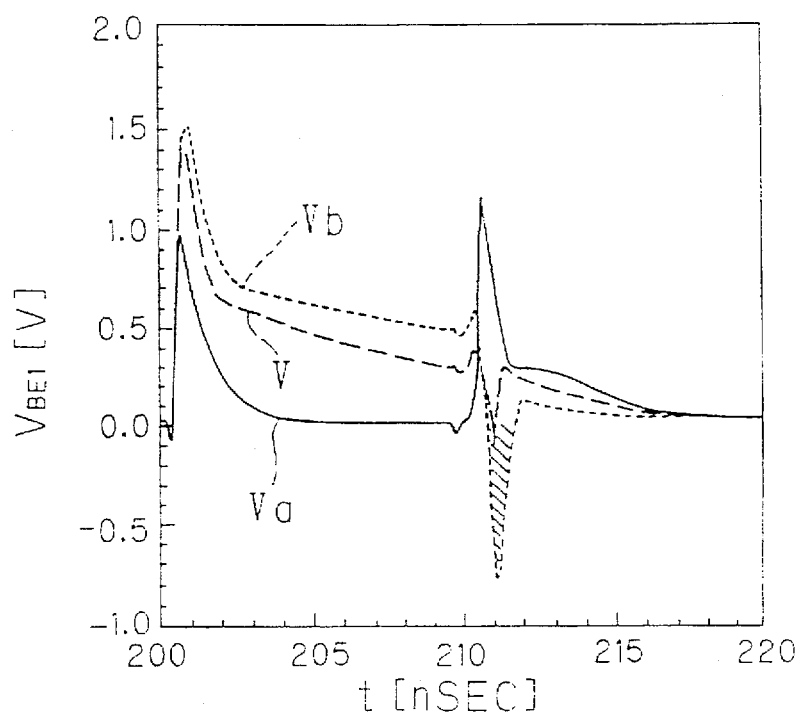
FIG. 34 is a waveform diagram showing the AC operation of the variation of the inverter circuit shown in FIG. 25.
Figure 35:
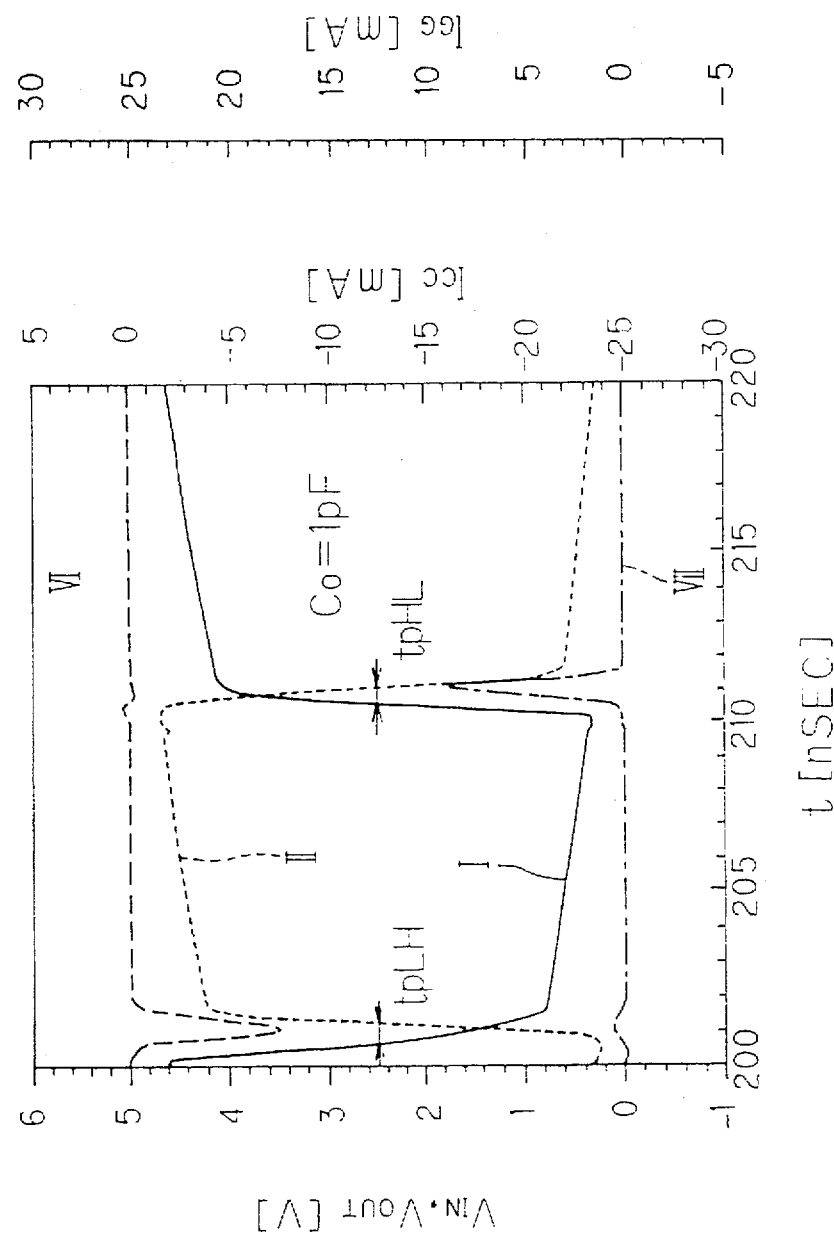
FIG. 35 is a waveform diagram showing the AC operation of the variation of the inverter circuit shown in FIG. 25.

FIGS. 32 through 35 are waveform diagrams showing the AC operations of the inverter circuit 10 in which the MOS transistors are sized as described above. FIGS. 32, 33, 34 and 35 show the operations observed under the same conditions as those in FIGS. 3, 4, 5 and 6, respectively. The waveforms indicated by the curves I in FIGS. 32 and 35 are the same as those shown in FIGS. 3 and 6.

As shown in FIG. 35, the unnecessary power supply current $I_{CC}$ flowing when the output voltage $V_{OUT}$ is switched from the high level to the low level (t=210–211 [nsec]) is approximately equal to 0.3 [mA], which causes any critical problems. The unnecessary power PLOSS consumed at that time is calculated so that PLOSS=27.1 [μW/MHz]. This value of the unnecessary power is reduced and is 11.3 [μW/MHz] (29%) less than that of the inverter circuit 100 shown in FIG. 1. The propagation delay time tpLH is 530 [psec] which is 90 [psec] (+20%) longer than that of the inverter circuit 100. The propagation delay time tpLH is improved and is 65 [psec] shorter than that of the circuit configuration in which all the MOS transistors have identical dimensions.

Further, the base voltage V1 of the bipolar transistor Q1 rises with almost the same time as that in the circuit configuration in which all the MOS transistors have identical dimensions. The propagation delay time tpHL is 430 [psec]. Further, the base voltage V1 falls at almost the same time as the output voltage $V_{OUT}$ falls FIG. 32), and the fall time is slightly influenced by the value of the output load capacitor Co (FIG. 33).

As shown in FIG. 34, there is no increase in the base-emitter voltage $V_{BE1}$ when the output voltage $V_{OUT}$ is switched from the high level to the low level in the presence of the output load capacitance Co. The EB reverse voltage obtained when Co=2 [pF] is −0.78 [V], and is reduced as compared with the circuit configuration in which all the MOS transistors have identical dimensions.

FIG. 36 shows the characteristics of the Bi-CMOS inverter circuit 10 according to the present invention in addition to those of the aforementioned conventional inverter circuits.

As described above, according to the structure of the first embodiment of the present invention, it is possible to reduce the pass-through current, the emitter-base reverse voltage and the propagation delay time tpLH. The magnitude of the pass-through current can be varied to some extent by adjusting the threshold voltage of the N-channel MOS transistor MN4.

It is enough to provide one N-channel MOS transistor MN4 in a multiple-input gate circuit. Hence even when the size of the N-channel MOS transistor MN4 is changed, no problem of preventing pattern design does not occur and layout can be designed in the same manner as in the case of the conventional pattern design.

Further, it is possible to easily adjust the threshold voltage Vth by sizing the N-channel MOS transistor MN4 so that it is smaller than the P-channel MOS transistor MP1, rather than reducing the size of the N-channel MOS transistor MN2. That is, the threshold voltage of the N-channel MOS transistor can be substantially adjusted under the condition that the N-channel MOS transistors MN1 and MN2 are of a size.

Instead of the N-channel MOS transistor MN4, it is possible to employ one or a plurality of diodes. Further, a bipolar transistor can be used instead of the N-channel MOS transistor MN4.

Figure 37:
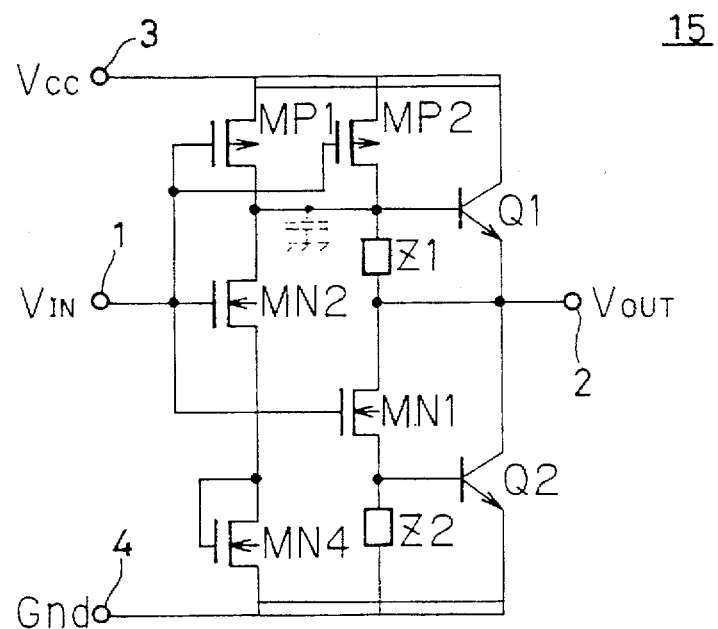
FIG. 37 is a circuit diagram of a first variation in the configuration of the first embodiment of the present invention.

FIG. 37 is a circuit diagram of a variation of the inverter circuit 10 having the N-channel MOS transistor MN4 according to the first embodiment of the present invention. An inverter circuit 15 shown in FIG. 37 includes a P-channel MOS transistor MP2 connected in parallel with the P-channel MOS transistor MP1, and is intended to further reduce the propagation delay time tpLH. The inverter circuit 15 has the N-channel MOS transistor MN4, and hence has the same advantages as those of the inverter circuit 10.

Figure 38:
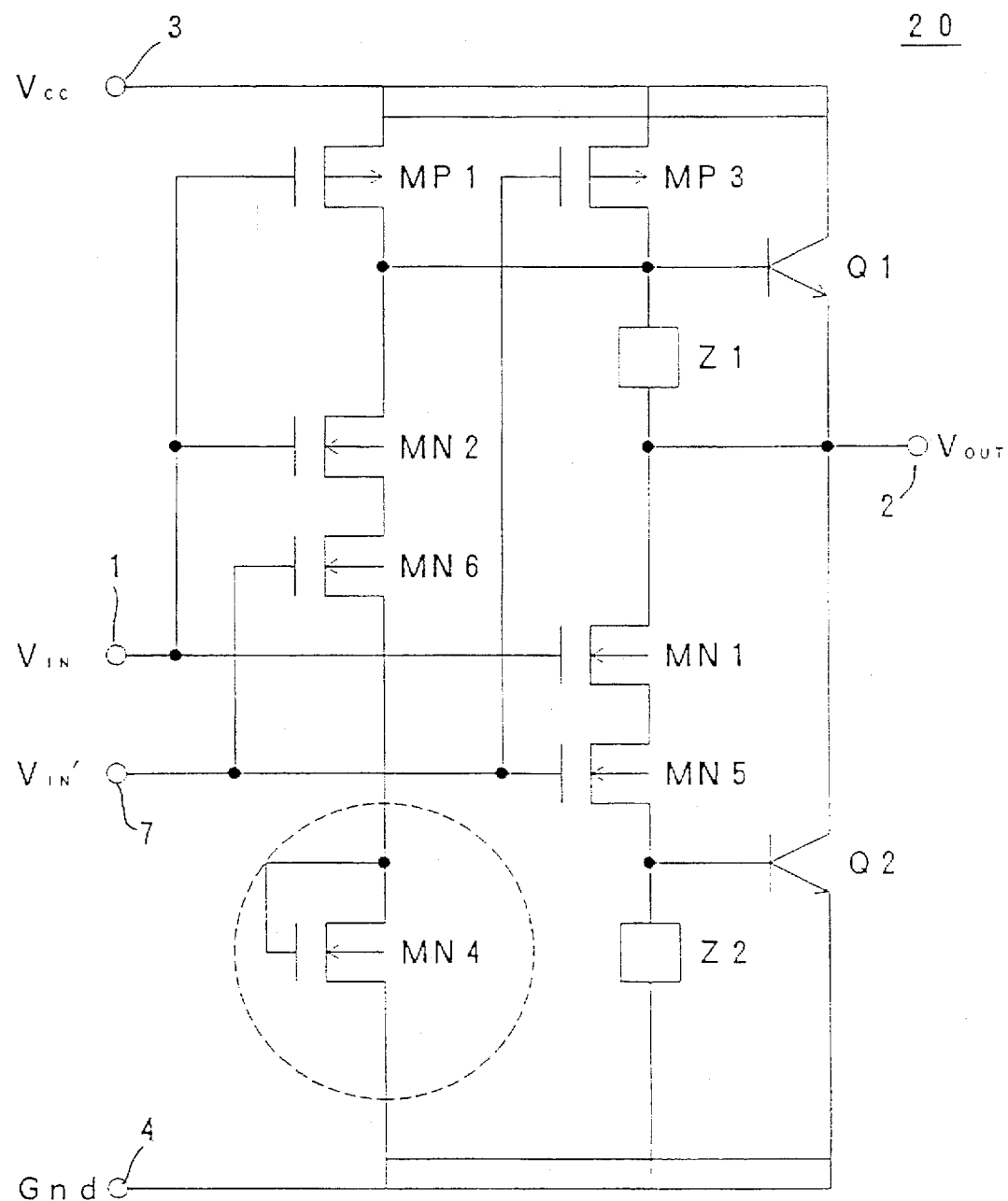
FIG. 38 is a circuit diagram of a second variation in the configuration of the first embodiment of the present invention.

FIG. 38 shows a two-input NAND gate 20 using the N-channel MOS transistor used in the first embodiment of the present invention. An N-channel MOS transistor MN5 is connected between the N-channel MOS transistor MN1 and the resistor Z2. An N-channel MOS transistor MN6 is connected to the N-channel MOS transistors MN2 and the MN4. A P-channel MOS transistor MP3 is connected to the power supply terminal 3 and the bipolar transistor Q1. An input signal voltage $V_{IN}'$ is applied, via an input terminal 7, to the gates of the MOS transistors MN5, MN6 and MP3.

The above NAND gate 20 includes a turn-OFF means made up of the N-channel MOS transistors MN2, MN4 and MN6. By adjusting the size of the N-channel MOS transistor MN4, it is possible to easily obtain the same advantages as those of the first embodiment of the present invention.

Figure 39:
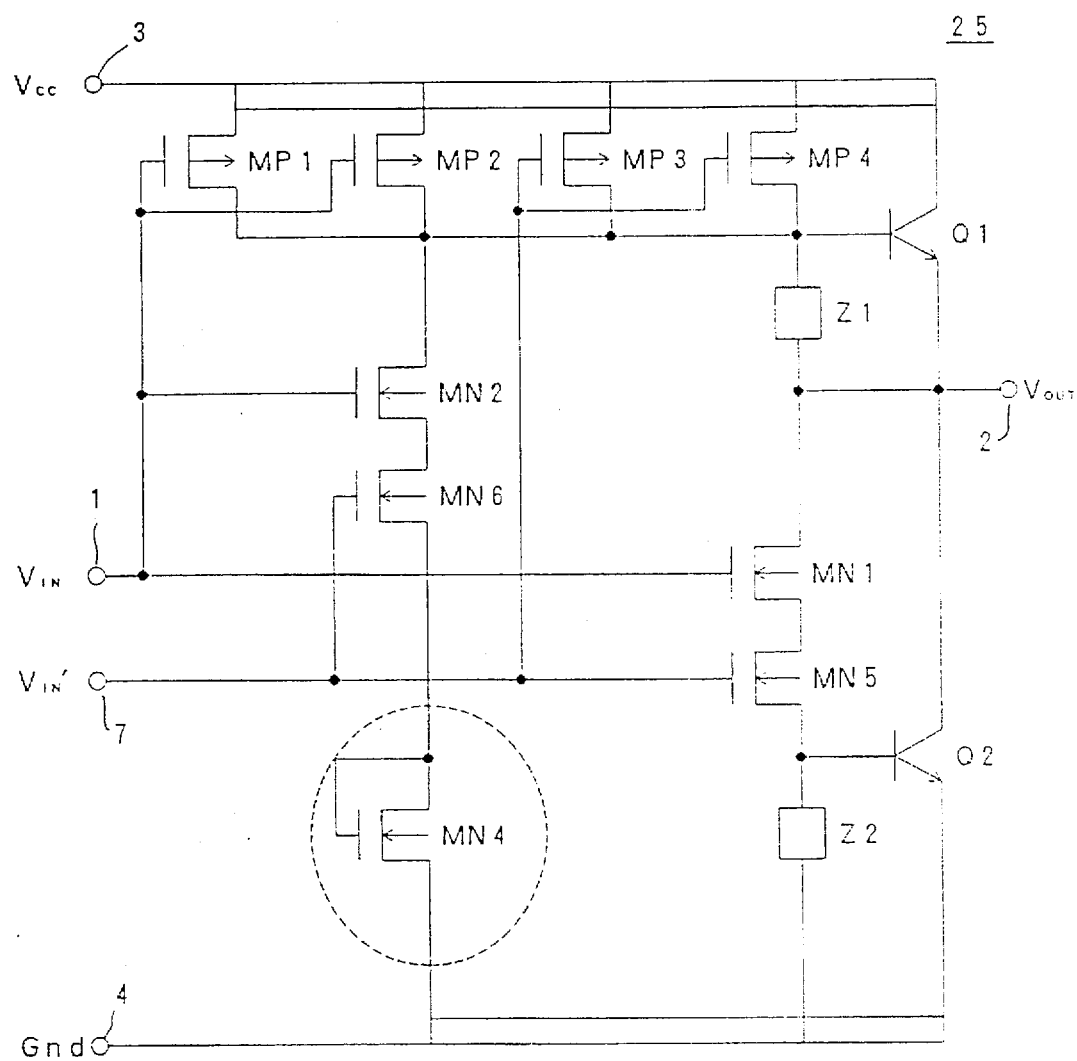
FIG. 39 is a circuit diagram of a third variation in the configuration of the first embodiment of the present invention.

FIG. 39 is a circuit diagram of a two-input NAND gate 25 including the N-channel MOS transistor MN4 used in the first embodiment of the present invention. The two-input NAND gate 25 a P-channel MOS transistor MP2 connected in parallel with the P-channel MOS transistor MP1, and a P-channel MOS transistor MP4 connected in parallel with the P-channel MOS transistor MP3, whereby the propagation delay time tpLH can be reduced. Further, the NAND gate 25 includes the turn-OFF means made up of the N-channel MOS transistors MN2, MN4 and MN6, and the same advantages as those of the first embodiment of the present invention.

Figure 40:
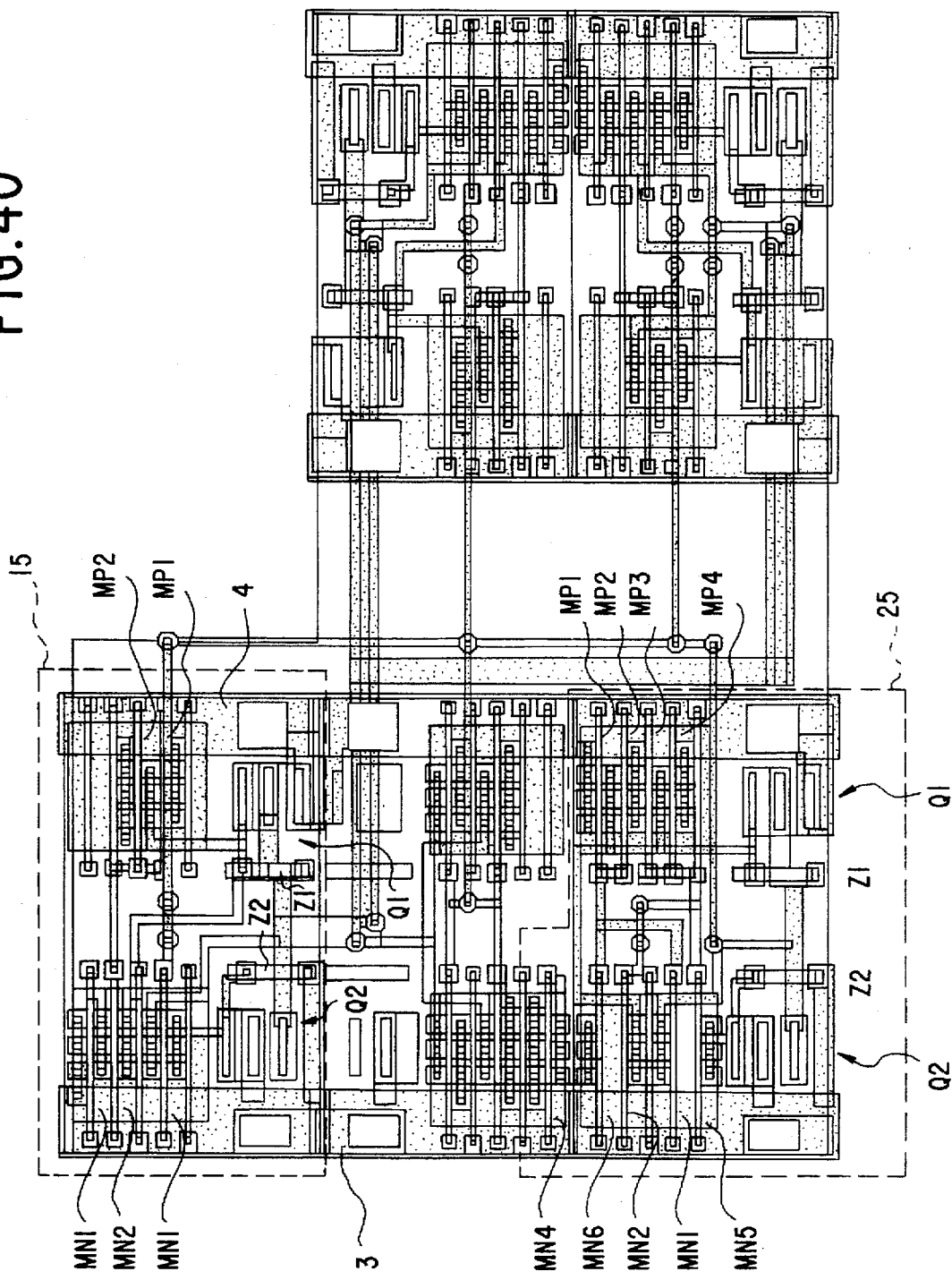
FIG. 40 is a plan view of a layout of the first embodiment of the present invention.

FIG. 40 is a diagram of an example of layout including the inverter circuit 15 and the NAND gate 25 formed on a semiconductor chip. In FIGS. 40, parts that are the same as those shown in FIGS. 37 and 39 are given the same reference numbers as previously. Further, FIG. 41A shows a circuit configuration corresponding to the layout of the inverter circuit 15, and FIG. 41B shows a circuit configuration corresponding to the layout of the NAND circuit 25. As shown in FIG. 40, the N-channel MOS transistors MN1, MN2 and MN4 are formed by transistor formation areas of the same size.

Figure 42:
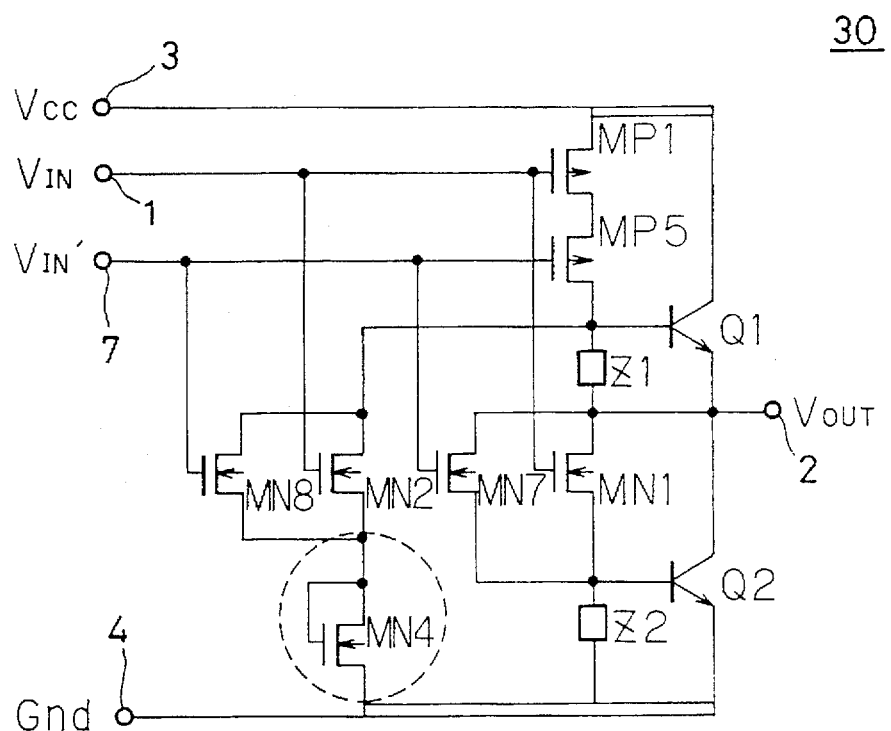
FIG. 42 is a circuit diagram of a fourth variation in the configuration of the first embodiment of the present invention.

FIG. 42 shows a two-input NOR gate 30 using the N-channel MOS transistor MN4 according to the first embodiment of the present invention. As shown in FIG. 42, an N-channel MOS transistor MN7 is connected in parallel with the N-channel MOS transistor MN1, and an N-channel MOS transistor MN8 is connected in parallel with the N-channel MOS transistor MN2. A P-channel MOS transistor MP5 is connected between the P-channel MOS transistor MP1 and the bipolar transistor Q1. The input signal voltage $V_{IN}'$ is applied, via the input terminal 7, to the gates of the MOS transistors MN7, MN8 and MP5. The turn-OFF means is made up of the N-channel MOS transistors MN2, MN4 and MN8. By adjusting the size of the N-channel MOS transistor MN4, it is possible to easily obtain the same advantages as those of the first embodiment of the present invention.

Figure 43:
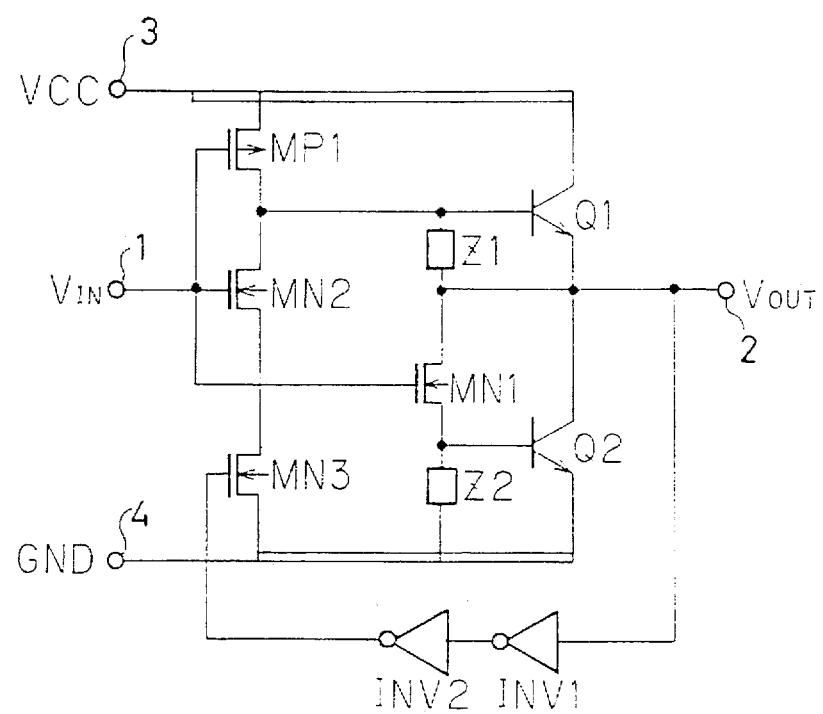
FIG. 43 is a circuit diagram of a conventional inverter related to the first embodiment of the present invention.

FIG. 43 shows a circuit configuration disclosed in IEDM89-439 related to the first embodiment of the present invention. A feedback circuit including inverters INV1 and INV2 is connected between the gate of the N-channel MOS transistor MN3 and the output terminal 2. The feedback circuit and the transistor MN3 function to temporarily connect the base of the bipolar transistor Q1 shown in FIG. 43 to the ground 4. However, the circuit configuration of the first embodiment of the present invention is advantageous to the circuit configuration shown in FIG. 43 from the following viewpoints.

First, the circuit configuration shown in FIG. 43 needs two inverters INV1 and INV2, and is complicated, as compared with the circuit configuration shown in FIG. 25. Hence, the circuit configuration shown in FIG. 43 needs complicated layout. Second, when the output voltage $V_{OUT}$ is switched from the high level to the low level, the N-channel MOS transistor MN3 is turned OFF with a delay of time dependent on the inverters INV1 and INV2. Hence, when the input signal $V_{IN}$ rises, a period occurs during which the N-channel MOS transistors MN2 and MN3 are both ON, and the base of the bipolar transistor Q1 is set to the ground potential. Hence, a reverse voltage is applied across the base and emitter of the bipolar transistor Q1. On the other hand, the first embodiment of the present invention does not have such a problem, as has been described previously.

A description will now be given of a second embodiment of the present invention. The conventional Bi-CMOS circuits have a further problem in addition to the aforementioned disadvantages. Now, such a further problem will be described with reference to FIGS. 44 and 45.

FIG. 44 shows a logic circuit using a Bi-CMOS circuit. An input signal IN is applied, as an input signal IN1, to a multiple-input NOR circuit C via a gate circuit A, and is applied, as an input signal IN2, to the NOR gate C via inverters A and B. In circuits such as the above logic circuit, an instantaneous level change (noise) occurs in which the output signal changes in the order of low (L), high (H) and low (L) levels under a certain condition. This certain condition is such that one of the two input terminals of the NOR gate C changes from the low level to the high level, and the other input terminal changes from the high level to the low level.

Figure 46:
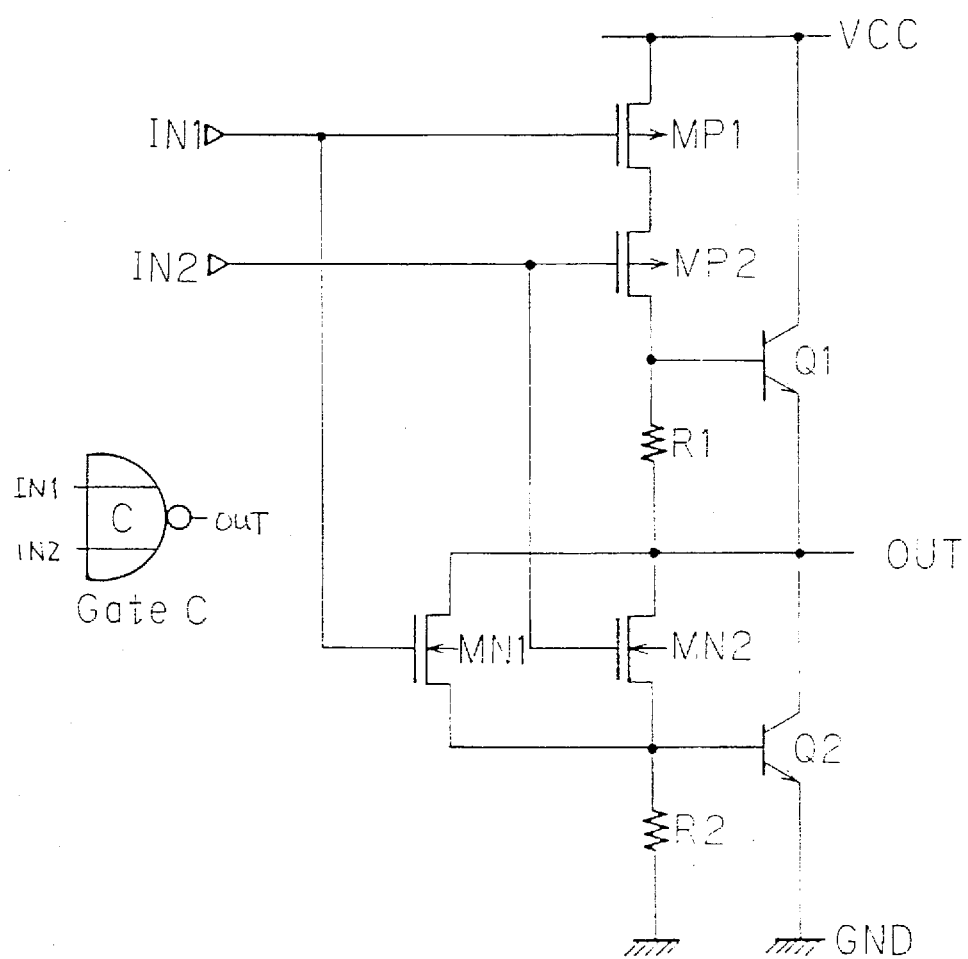
FIG. 46 is a circuit diagram of a NOR gate shown in FIG. 44.

Such an instantaneous level change of the output signal will be explained with reference to FIGS. 45 and 46. FIG. 45 is a waveform diagram of the AC operation of the logic circuit shown in FIG. 44, and FIG. 46 is a circuit diagram of the two-input NOR gate C. As shown in FIG. 46, the NOR gate C is made up of P-channel MOS transistors MP1 and MP2, N-channel MOS transistors MN1 and MN2, bipolar transistors Q1 and Q2, and resistors R1 and R2. Each of the inverters A and B shown in FIG. 44 has the circuit configuration shown in FIG. 1.

Referring to FIGS. 44 and 45, when the input signal IN switches from the high level to the low level, the output signal OUT is switched to the low level. However, for the following reason, an instantaneous level change of L-H-L occurs. When the input signal IN switches from the low level to the high level, the input signal IN1 starts to change from the low level to the high level at time $t_1$ due to the delay caused by the inverter A. The level of the input signal IN1 obtained at this time rapidly rises to a potential (VOH–$V_{BET1}$) from a potential VOL (ground potential), and gradually rises to the potential VOH, where $V_{BET1}$ denotes the base-emitter voltage of the transistor Q1 shown in FIG. 46).

Assuming now that the threshold voltage VTH of each of the P-channel MOS transistors MP1 and MP2 is equal to half the base-emitter voltage of each of the bipolar transistors Q1 and Q2, the P-channel MOS transistor MP1 receiving the input signal IN1 is switched from ON to OFF at time $t_3$ shown in FIG. 45.

The input signal IN2 switches from the high level to the low level at time $t_2$ due to the delay caused by the inverters A and B. At that time, the P-channel MOS transistor MP2 receiving the input signal IN2 is switched from ON to OFF. Hence, the P-channel MOS transistors MP1 and MP2 are ON during the period between times $t_2$ and $t_3$, and further the bipolar transistor Q1 is ON.

After time $t_1$, the N-channel MOS transistors MN1 and MN2 are ON, and therefore the bipolar transistor Q2 is also ON. As a result, the bipolar transistors Q1 and Q2 are ON during the period between times $T_2$ and $t_3$, and the output signal OUT is at an intermediate level VOH/2.

In order to eliminate the above problem, as shown in FIG. 24, the second embodiment of the present invention employs an element 7A, which is connected between the emitter and base of the bipolar transistor Q1 provided on the pull-up side of the NOR gate C and which controls the instantaneous level change of the output signal. The element 7A functions as an instantaneous output level change (noise) suppressing means and discharges the base of the bipolar transistor Q1 when the input signal IN1 changes from the low level to the high level, so that the bipolar transistor Q1 is prevented from being turned ON.

Figure 48:
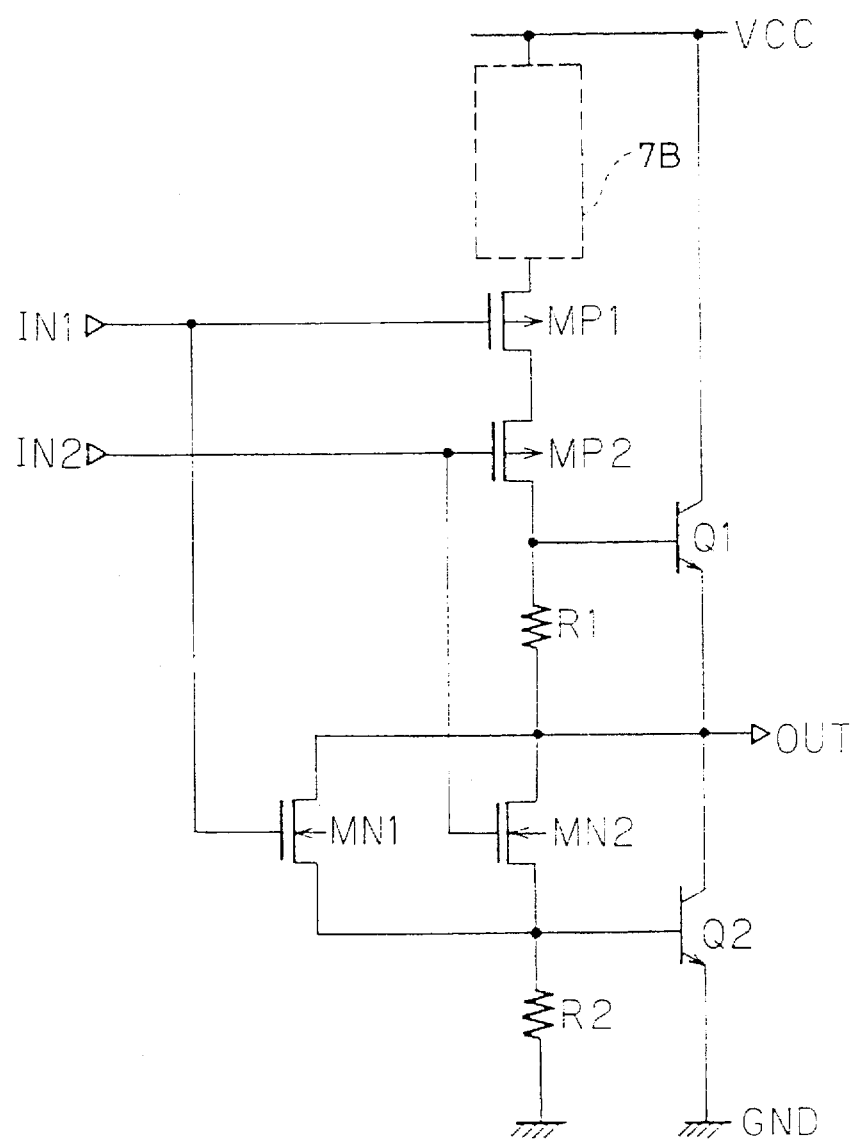
FIG. 48 is a circuit diagram of another version of the second embodiment of the present invention.

As shown in FIG. 48, an element (level shift element) 7B for controlling the instantaneous level change of the output signal is provided between the power supply line Vcc and the source of the P-channel MOS transistor MP1. When the input signal IN1 switches from the low level to the high level, the element 7B functions to increase the threshold voltage of the P-channel MOS transistor MP1 to thereby speed up the ON-OFF change of the transistor MP1. Thereby, the base current of the bipolar transistor Q1 provided on the pull-up side of the NOR gate C is cut off, whereby the bipolar transistor Q1 is prevented from being switched from OFF to ON.

Figure 49:
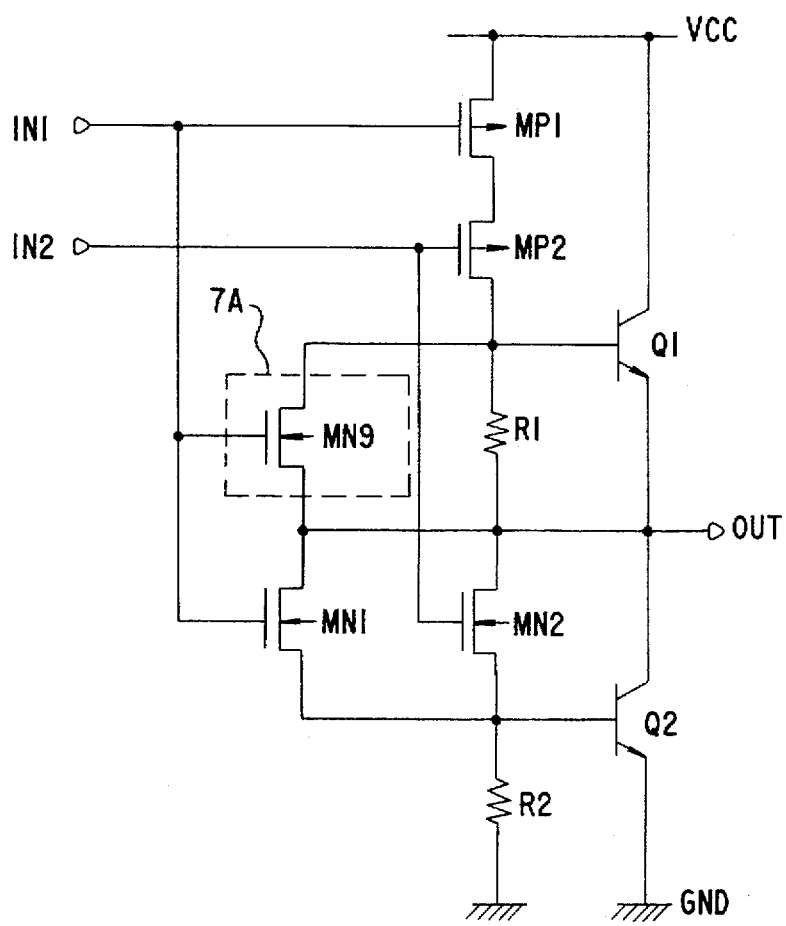
FIG. 49 is a circuit diagram of an example of the configuration shown in FIG. 47.

FIG. 49 shows a circuit configuration in which an N-channel MOS transistor MN9 is provided between the base and emitter of the bipolar transistor of the NOR gate. The gate of the N-channel MOS transistor MN9 receives the input signal IN1, and the drain and source thereof are connected to the base and emitter of the bipolar transistor Q1, respectively.

Figure 50:
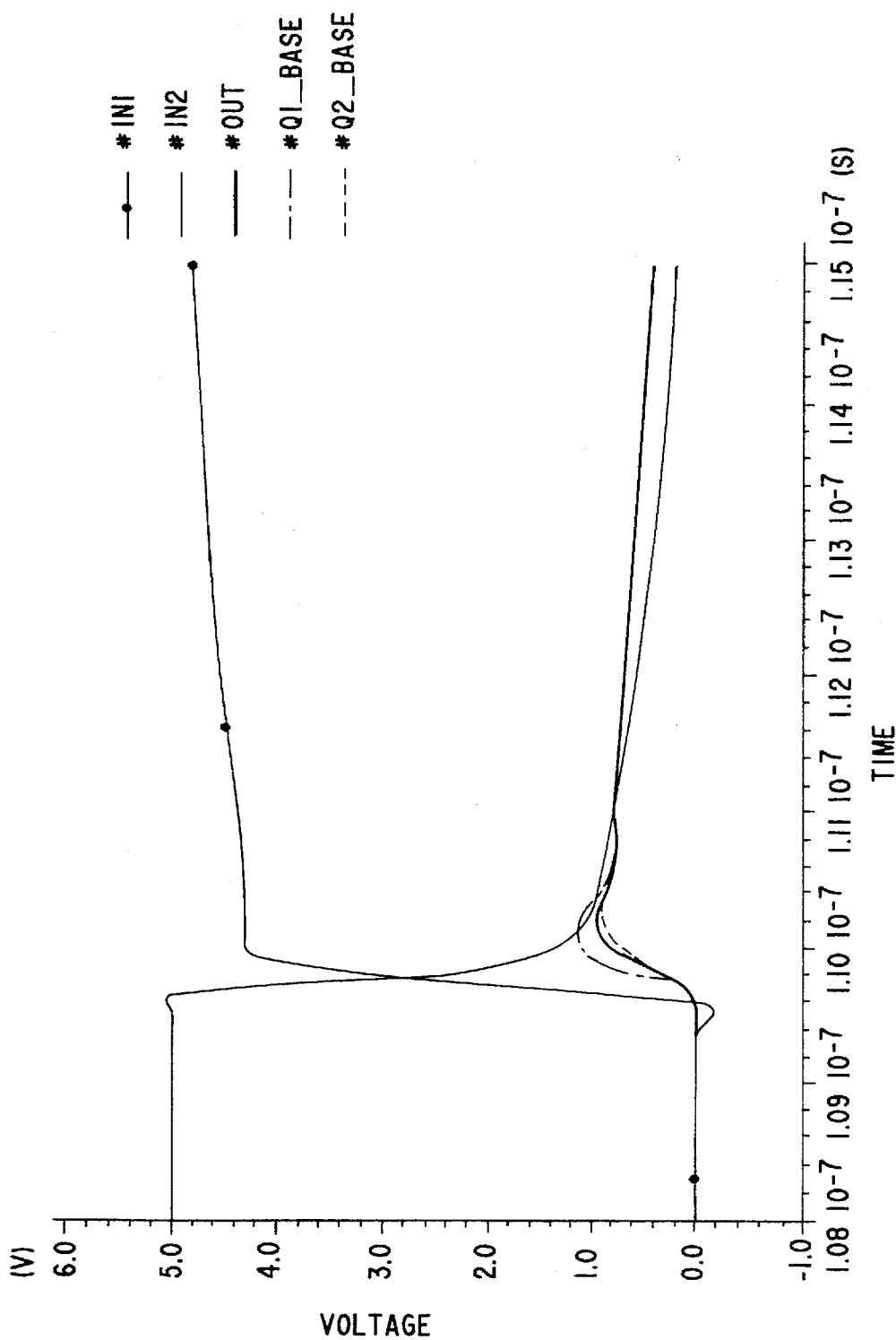
FIG. 50 is a waveform diagram showing the AC operation of the circuit shown in FIG. 49.

FIG. 50 is a waveform diagram of the AC operation of the NOR gate shown in FIG. 49 according to the second embodiment of the present invention. A thin solid line with a dot "." indicates the input signal IN1, and another thin line without a dot "." indicates the input signal IN2. Further, a thick solid line indicates the output signal OUT, and a one-dot chained line indicates the base voltage of the bipolar transistor Q1. Furthermore, a dotted line indicates the base voltage of the bipolar transistor Q2. As shown in FIG. 50, in the circuit configuration shown in FIG. 49, the base voltage is prevented from being increased when the input signal IN1 changes from the low level to the high level. A maximum base-emitter voltage of the bipolar transistor Q1 is approximately 0.2 [V]. Hence, the bipolar transistor Q1 is not turned ON.

On the other hand, in the circuit configuration shown in FIG. 46, the base voltage drastically rises when the input signal IN1 switches from the low level to the high level, and the base-emitter voltage of the transistor Q1 becomes approximately 0.9 [V]. Hence, the bipolar transistor Q1 is turned ON.

Figure 52:
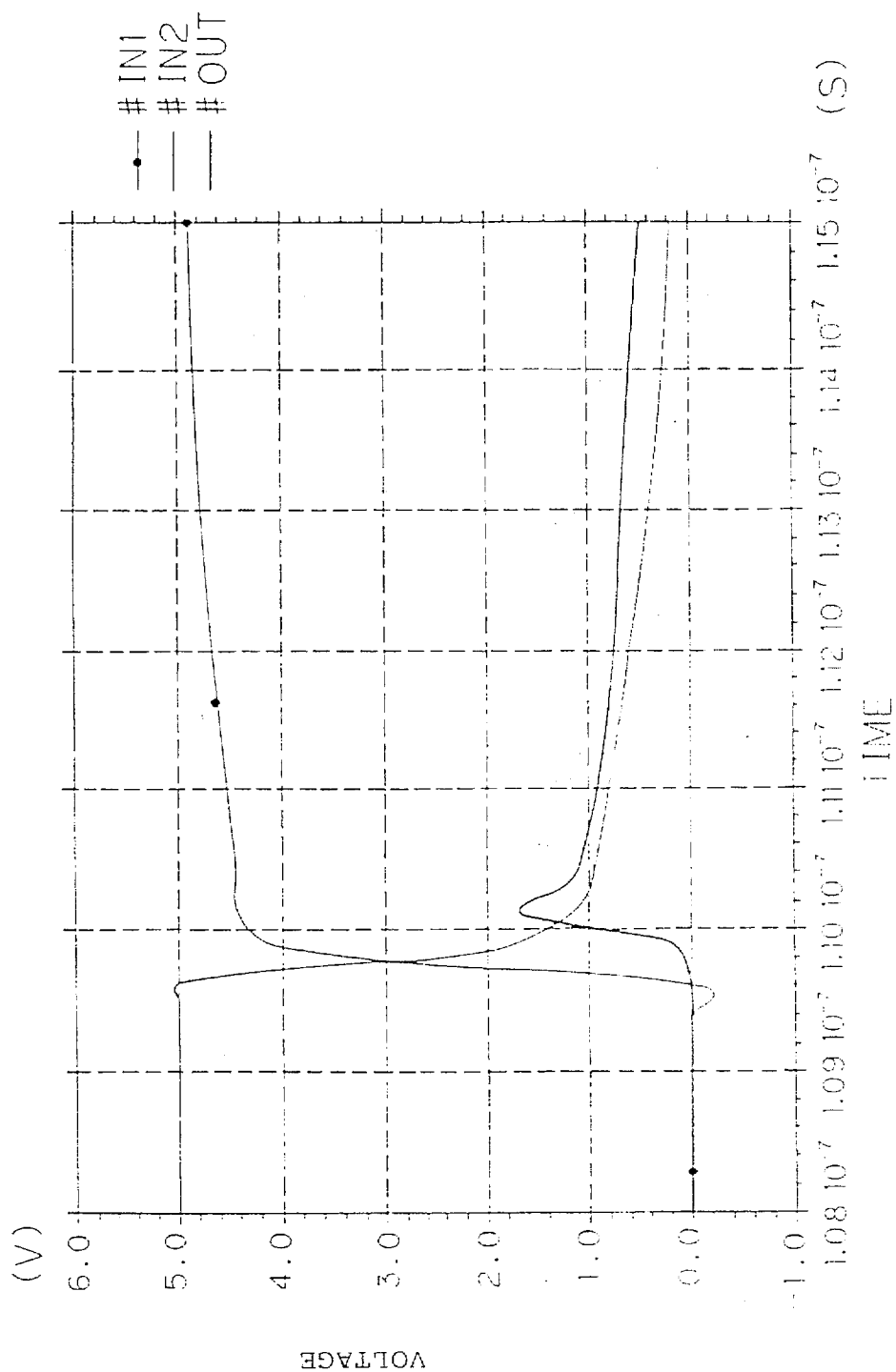
FIG. 52 is a waveform diagram showing the AC operation of the circuit shown in FIG. 49.
Figure 53:
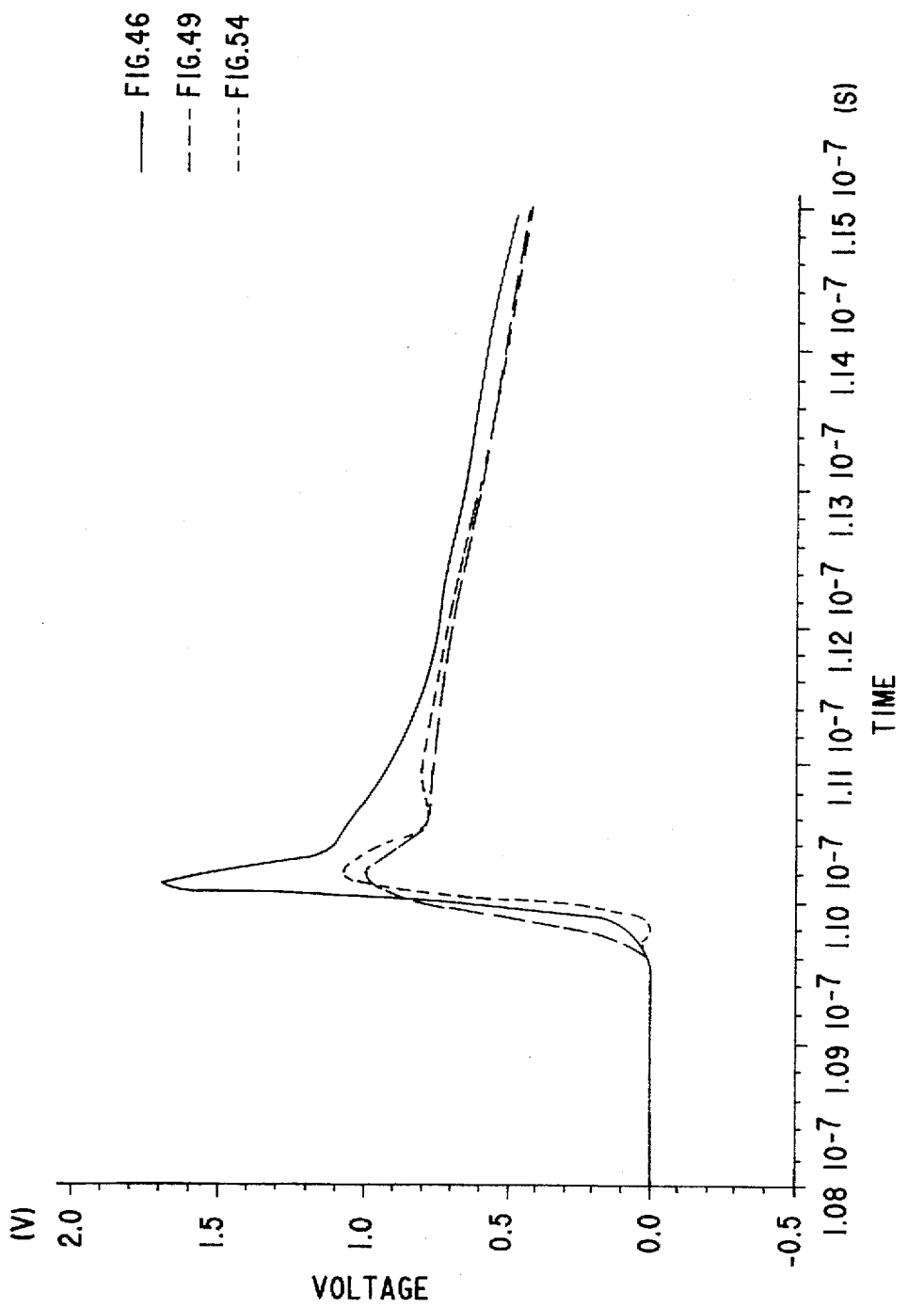
FIG. 53 is a waveform diagram showing instantaneous level changes in the output signals of the circuits shown in FIGS. 46, 49 and 54.

FIG. 52 shows only the input signals IN1 and IN2 and the output signal OUT of the conventional NOR gate shown in FIG. 46. FIG. 53 is an enlarged waveform diagram of the output signal (solid line) of the conventional NOR gate shown in FIG. 46 and the output signal (broken line) of the NOR gate according to the second embodiment of the present invention shown in FIG. 49. It can be seen from FIG. 53 that the instantaneous level change of the output signal is drastically suppressed according to the second embodiment of the present invention, as compared with the conventional circuit configuration shown in FIG. 46.

Figure 1:
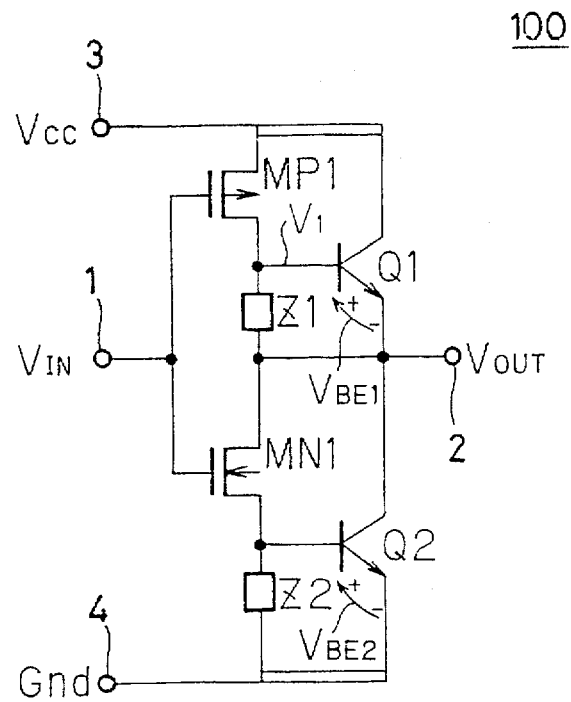
FIG. 1 is a circuit diagram of a conventional inverter circuit including a Bi-CMOS circuit.
Figure 2:
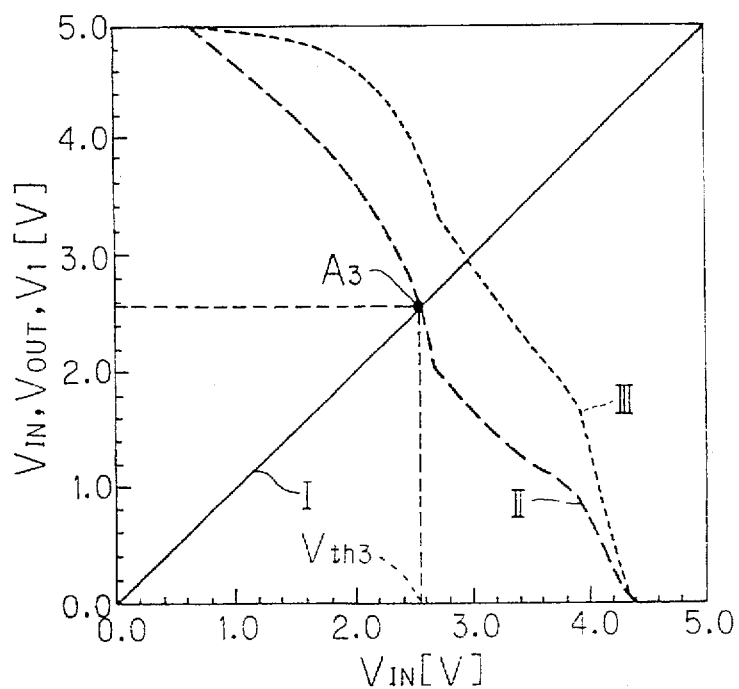
FIG. 2 is a graph showing the DC operation of the inverter circuit shown in FIG. 1.
Figure 47:
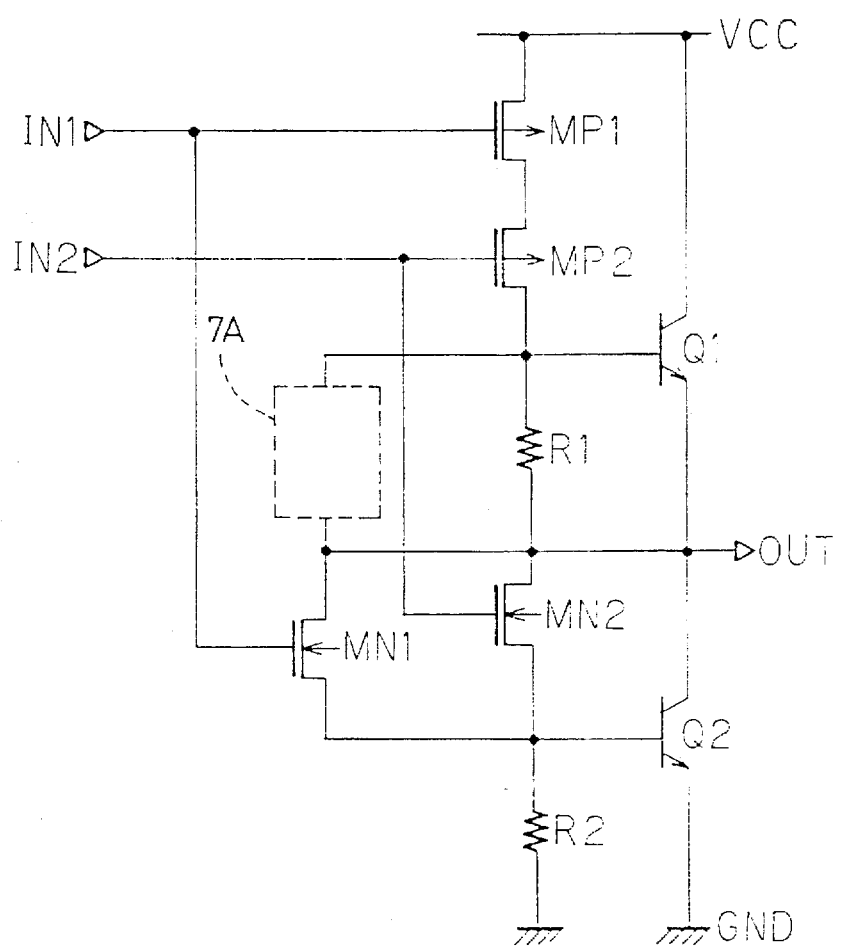
FIG. 47 is a circuit diagram of a second embodiment of the present invention.
Figure 54:
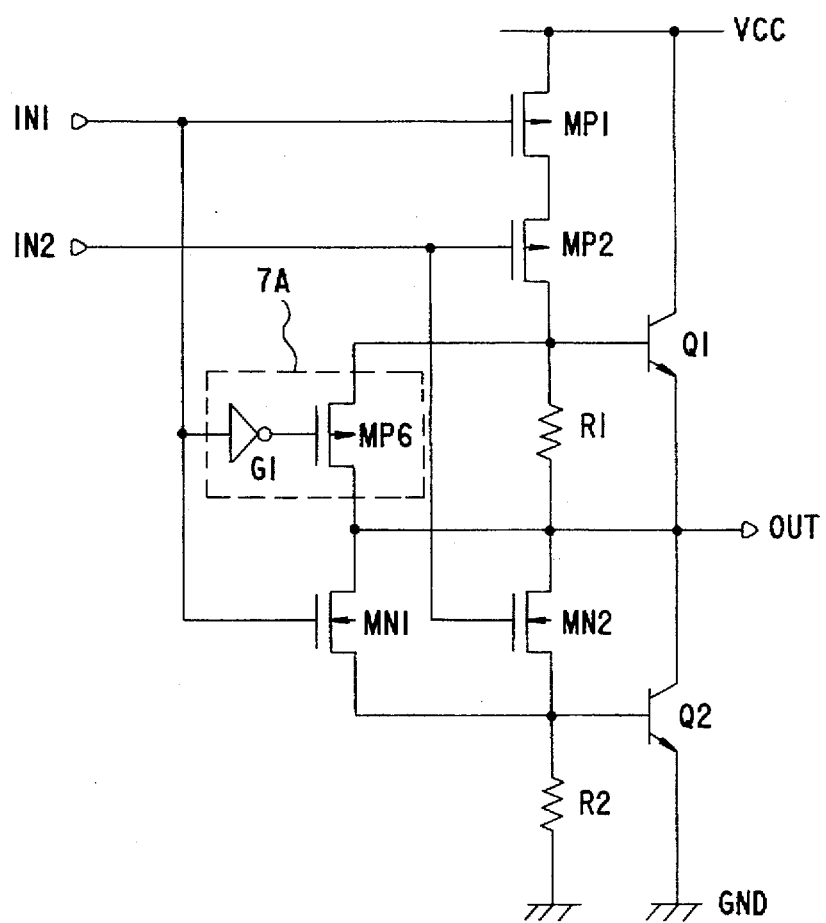
FIG. 54 is a circuit diagram of another example of the configuration shown in FIG. 47.

FIG. 54 is a circuit diagram of another configuration related to the configuration shown in FIG. 47. The configuration shown in FIG. 54 employs a P-channel MOS transistor MP6 and a gate circuit G1 instead of the N-channel MOS transistor MN9 shown in FIG. 49. The input terminal of the gate circuit (inverter) G1 receives the input signal IN1, and the output terminal thereof is connected to the gate of the P-channel MOS transistor MP6. The source and drain of the P-channel MOS transistor MP6 are connected to the base and emitter of the bipolar transistor Q1 located on the pull-up side, respectively. The gate circuit G1 is configured as shown in FIG. 1.

Figure 55:
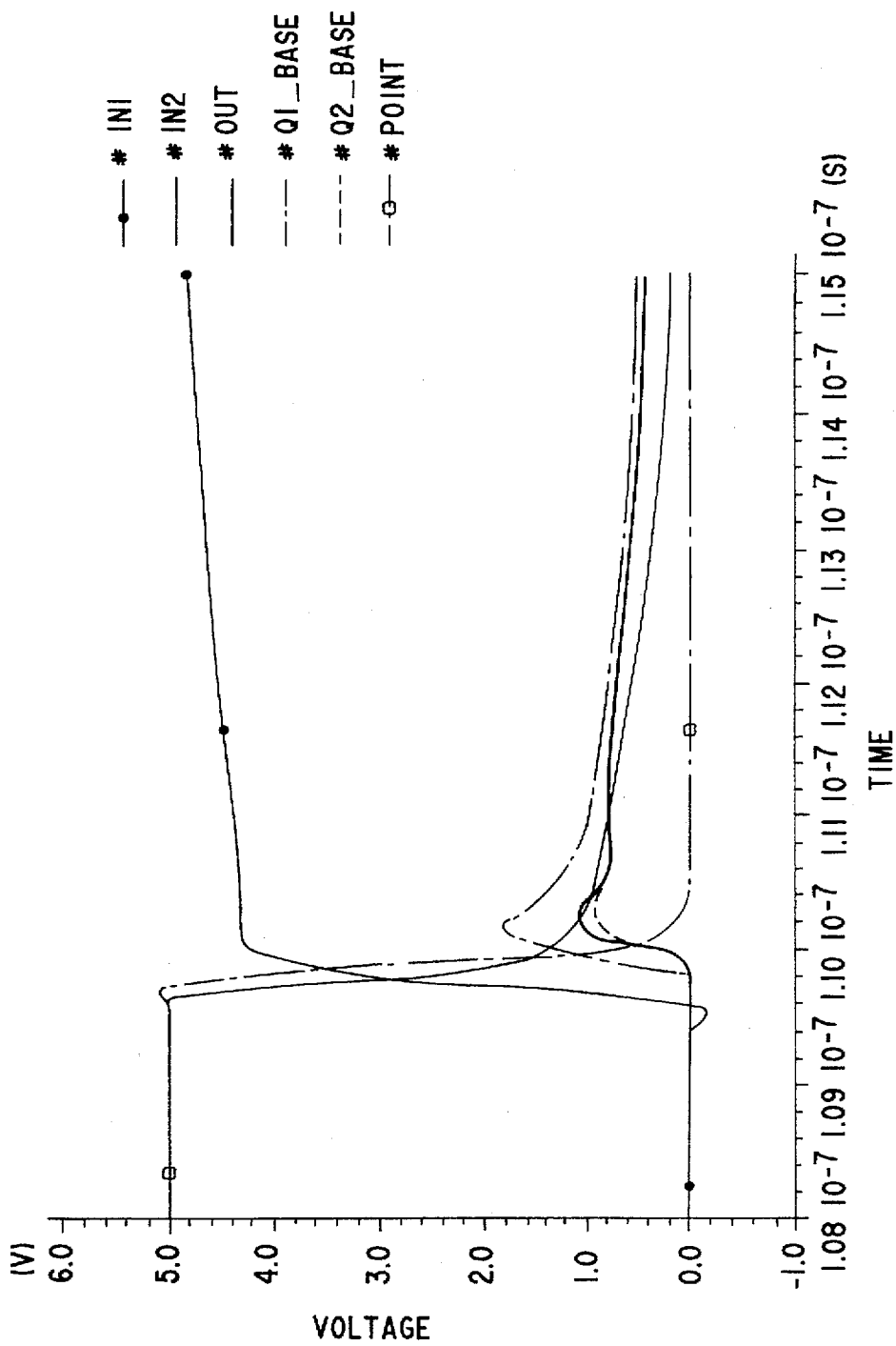
FIG. 55 is a waveform diagram showing the AC operation of the circuit shown in FIG. 54.

FIG. 55 is a waveform diagram of the AC operation of the circuit shown in FIG. 54. The potential difference between the base of the bipolar transistor Q1 indicated by the one-dot chained line and the emitter (output signal) thereof indicated by the thick solid line is slightly greater than the base-emitter voltage shown in FIG. 50, and a current slightly flows in the bipolar transistor Q1. Hence, as shown in FIG. 53, the instantaneous level change of the output signal occurring in the circuit configuration shown in FIG. 54 is slightly greater than that occurring in the circuit configuration shown in FIG. 49. However, as indicated by the dotted line shown in FIG. 53, the instantaneous level change of the output signal occurring in the circuit configuration shown in FIG. 54 is much less than that occurring in the conventional circuit.

Figure 56:
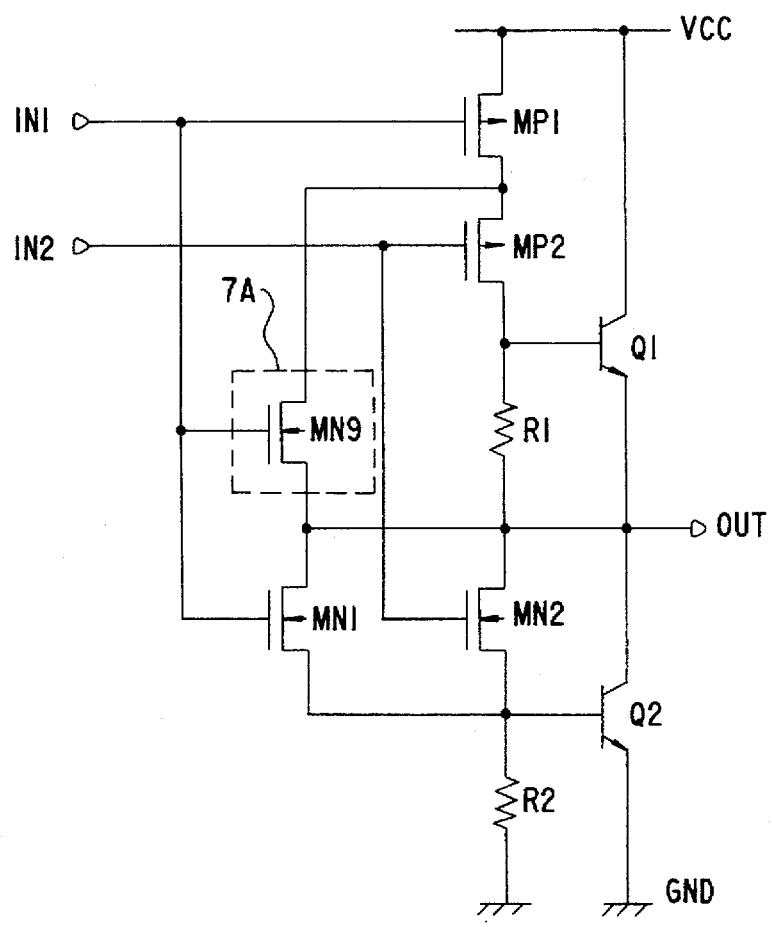
FIG. 56 is a circuit diagram of yet another example of the configuration shown in FIG. 47.

FIG. 56 is a circuit diagram of a configuration related to that shown in FIG. 47. The drain of the N-channel MOS transistor MN9 is connected to a node at which the P-channel MOS transistors MP1 and MP2. That is, the N-channel MOS transistor MN9 draws the current from the connection node of the P-channel MOS transistors MP1 and MP2.

Figure 57:
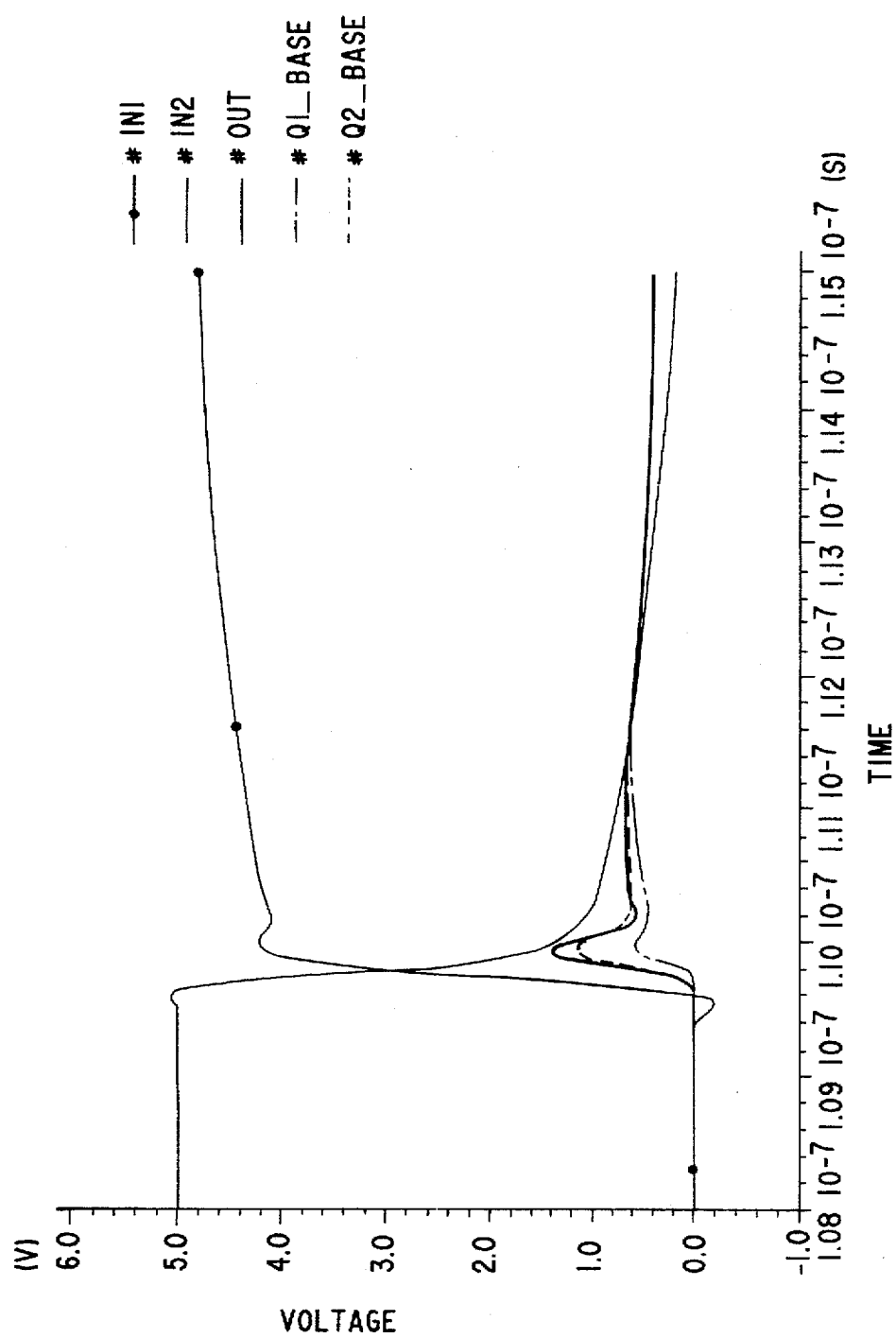
FIG. 57 is a waveform diagram of the AC operation of the circuit shown in FIG. 56.
Figure 58:
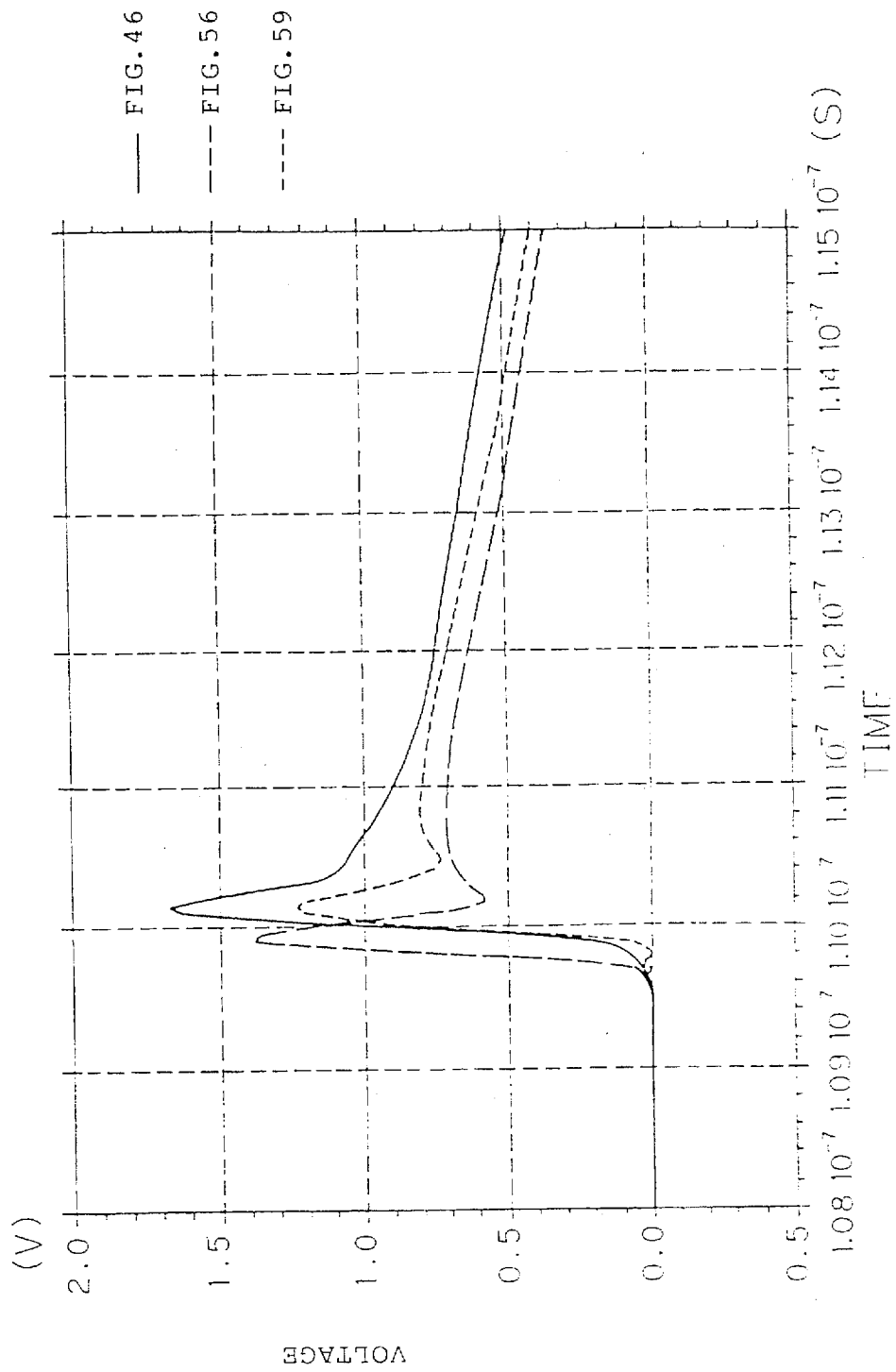
FIG. 58 is a waveform diagrams showing instantaneous level changes in the output signals of the circuits shown in FIGS. 46, 56 and 59.

FIG. 57 is a waveform diagram of the AC operation of the circuit shown in FIG. 56. FIG. 58 shows the instantaneous level change of the output signal occurring in the circuits shown in FIGS. 46, 56 and 57 (and 57 (which will be described later). The base and emitter of the bipolar transistor Q1 are reversely biased, while the instantaneous output level change occurring therein indicated by the broken line in FIG. 58 is slightly suppressed, as compared with the instantaneous output level change of the conventional circuit indicated by the solid line shown in FIG. 58.

Figure 59:
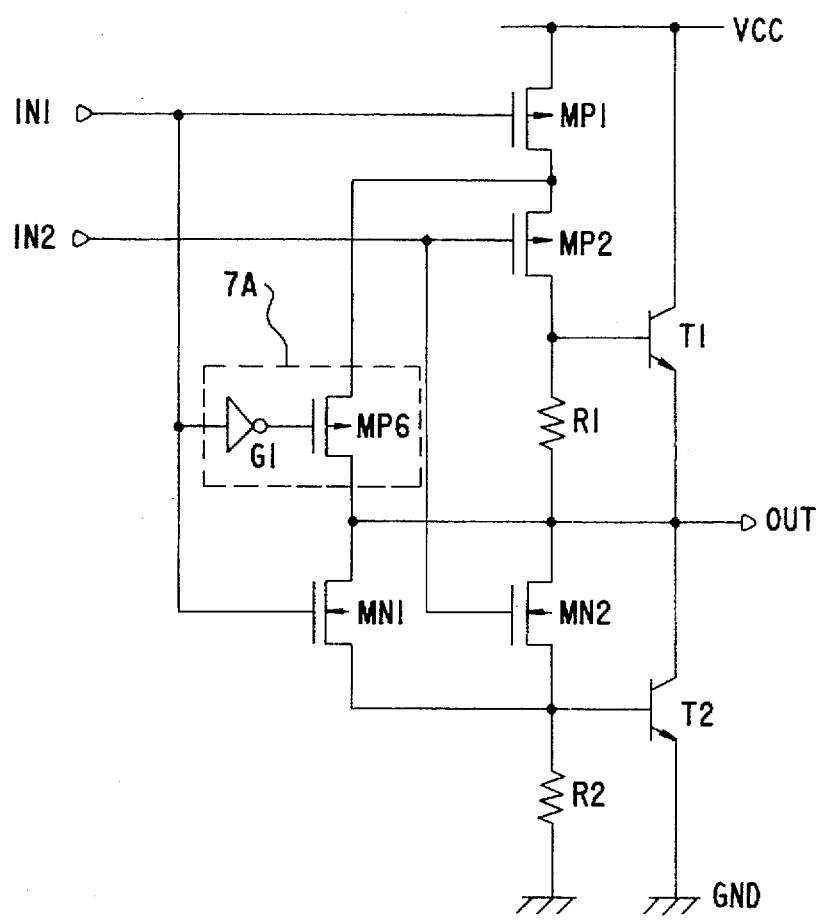
FIG. 59 is a circuit diagram of a further example of the configuration shown in FIG. 47.

FIG. 59 shows a variation of the circuit shown in FIG. 54. The source of the P-channel MOS transistor MP6 is connected to a connection node at which the P-channel MOS transistors MP1 and MP2 are connected. That is, the P-channel MOS transistor MP6 draws the current from the above connection node of the P-channel MOS transistors MP1 and MP2.

Figure 51:
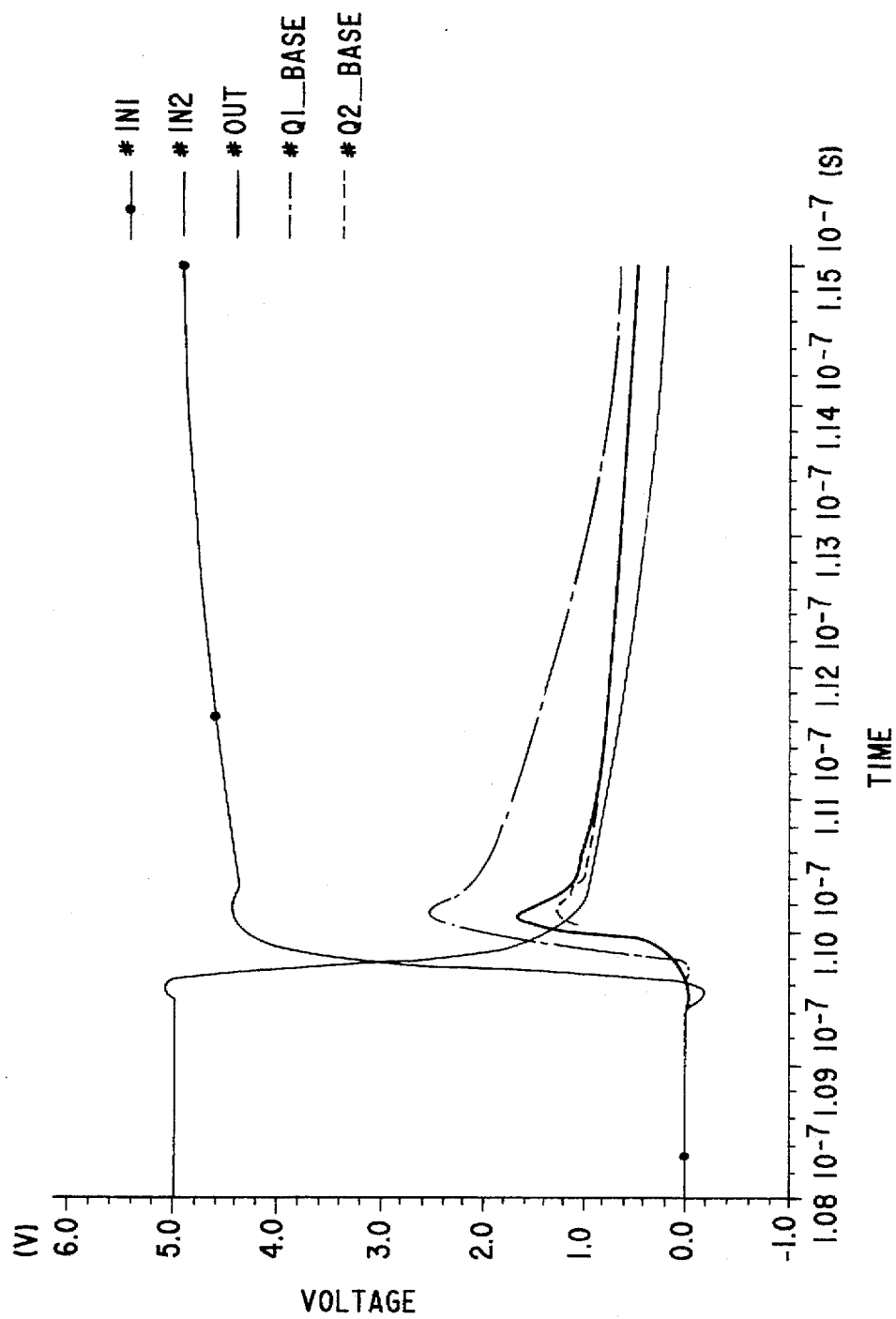
FIG. 51 is a waveform diagram showing the AC operation of the circuit shown in FIG. 49.
Figure 60:
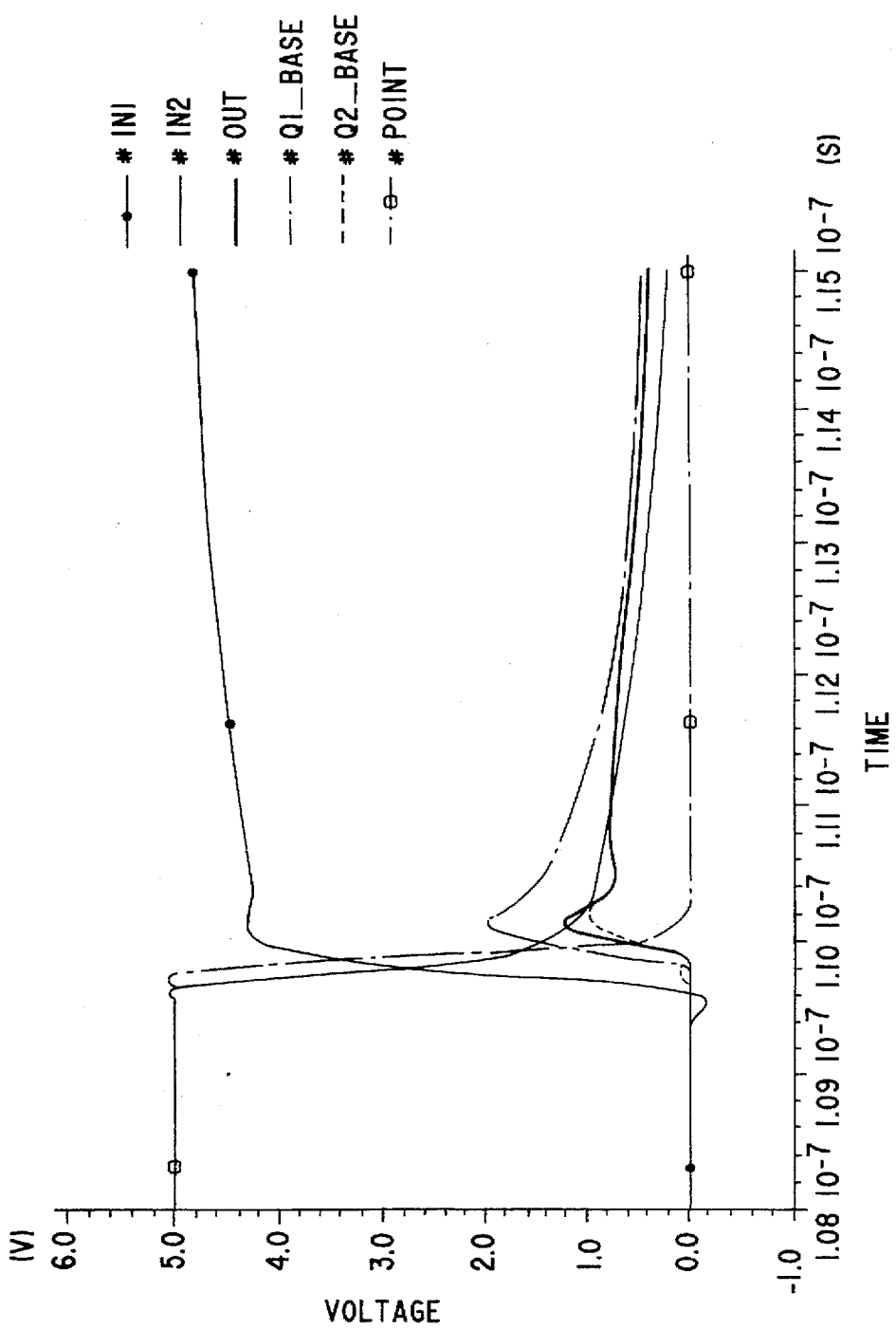
FIG. 60 is a waveform diagram of the operation of the circuit shown in FIG. 59.

FIG. 60 is a waveform diagram of the AC operation of the circuit shown in FIG. 59. The base-emitter voltage of the bipolar transistor on the pull-up side is slightly improved, as compared with the characteristic shown in FIG. 51, and the instantaneous level change of the output signal is suppressed as indicated by the dotted line shown in FIG. 58.

Figure 61:
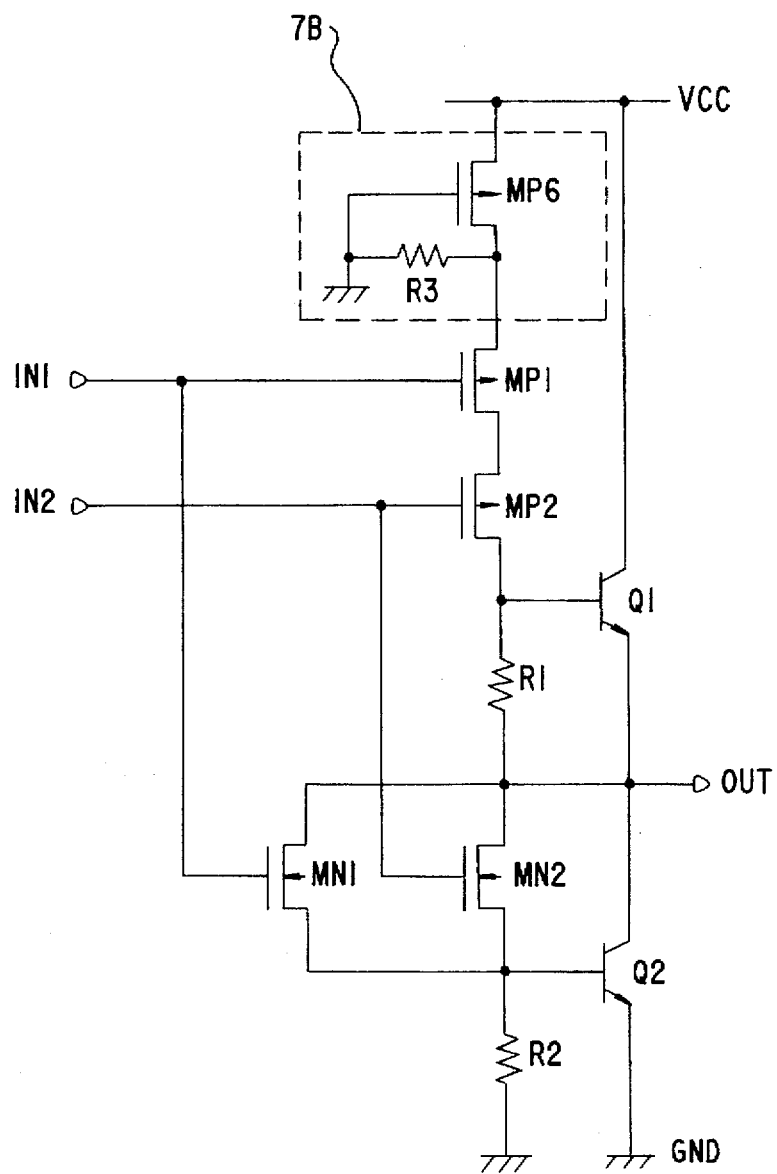
FIG. 61 is a circuit diagram of an example of the configuration shown in FIG. 48.

FIG. 61 is a circuit diagram related to the circuit configuration shown in FIG. 48. As shown in FIG. 61, a P-channel MOS transistor MP6 functioning as a level shift element, and a resistor R3 are provided. The source of the P-channel MOS transistor is connected to the power supply line Vcc, and the drain thereof is connected to the source of the P-channel MOS transistor. The gate of the P-channel MOS transistor MP6 is grounded, and is connected to the drain of the P-channel MOS transistor MP6 via the resistor R3.

Figure 62:
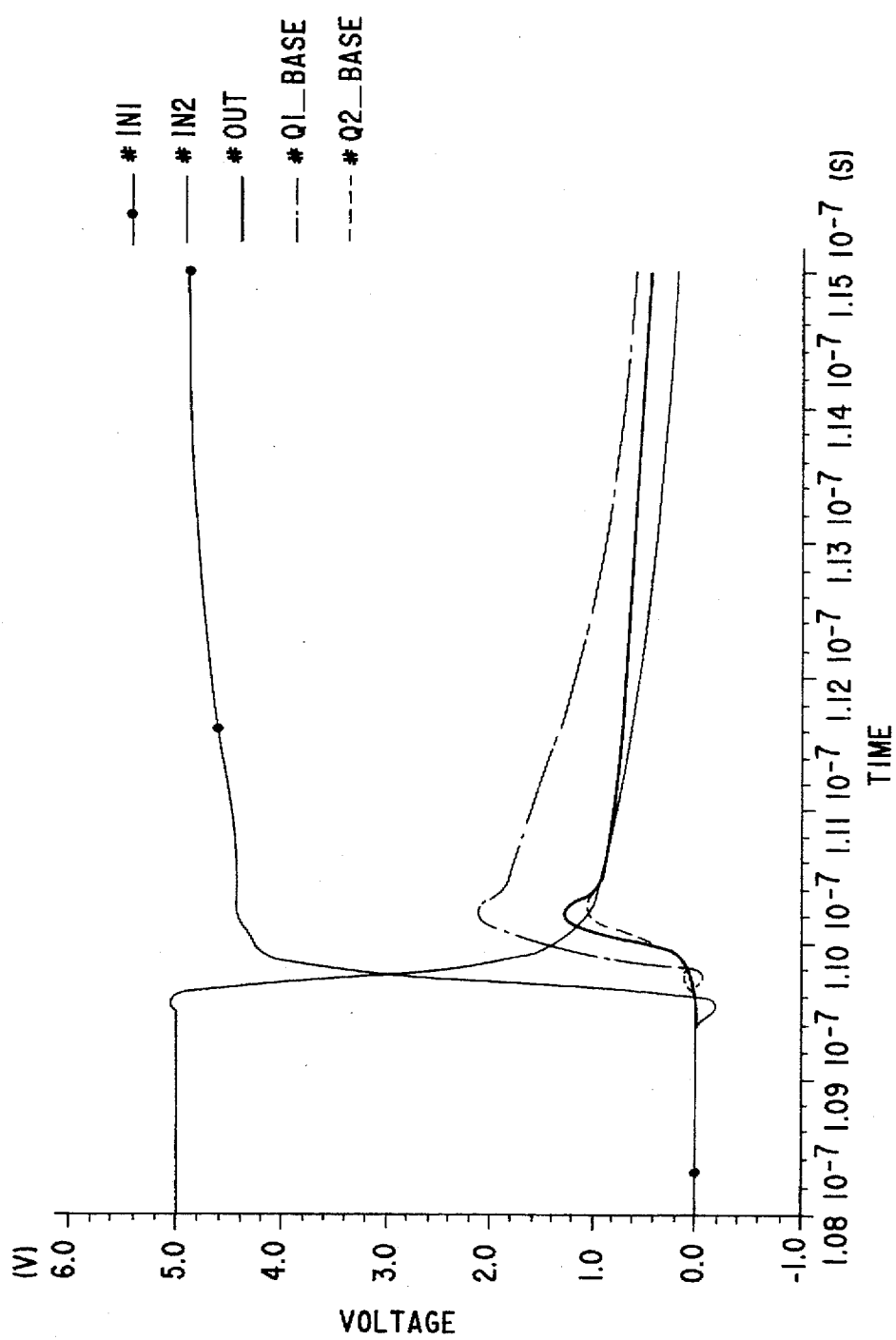
FIG. 62 is a waveform diagram showing the AC operation of the circuit shown in FIG. 61.
Figure 63:
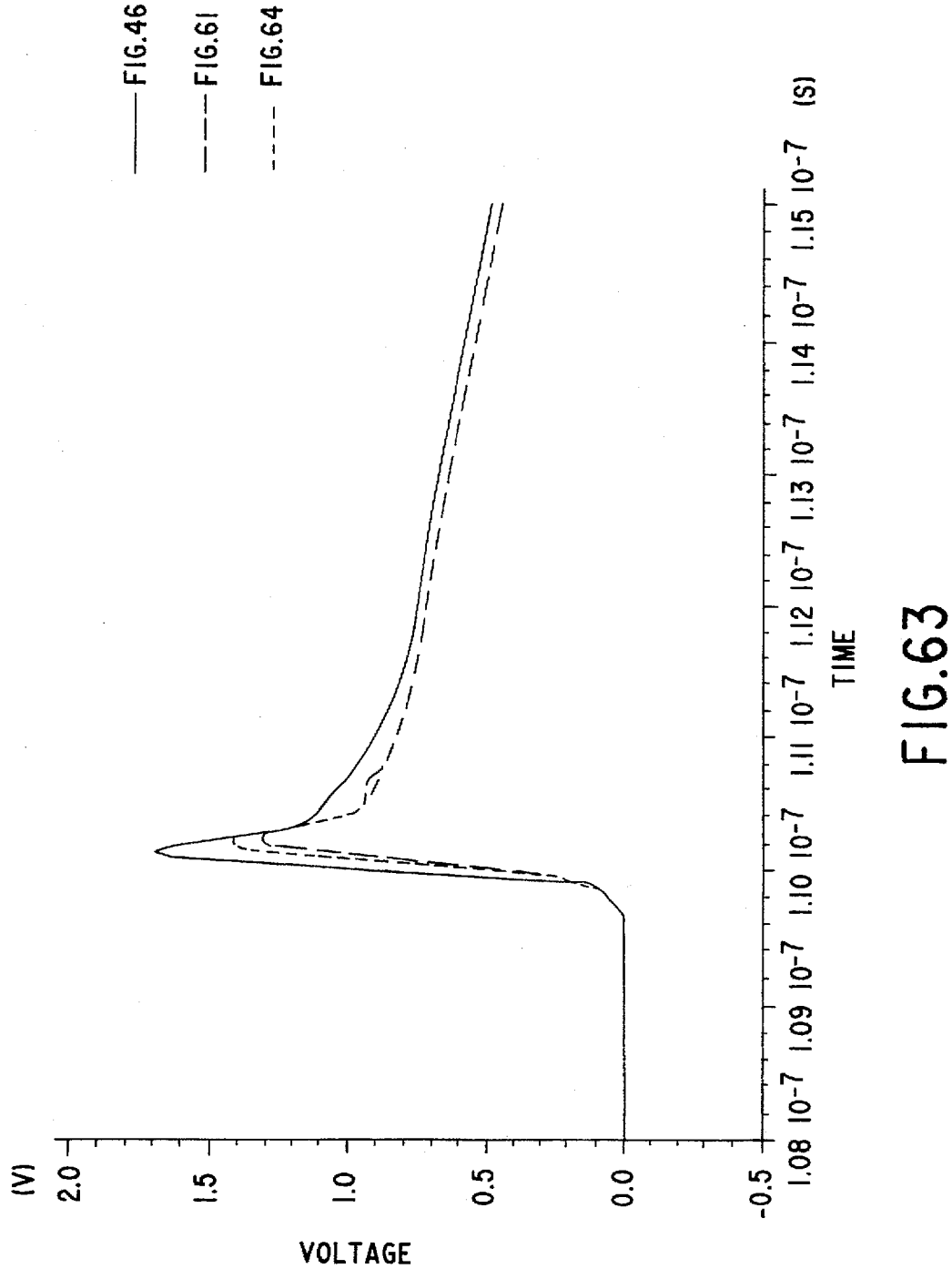
FIG. 63 is a waveform diagram showing instantaneous level changes in the output signals of the circuits shown in FIGS. 46, 61 and 64.

FIG. 62 is a waveform diagram of the AC operation of the circuit shown in FIG. 61. The base voltage and emitter voltage of the bipolar transistor Q1 rise in response to the rise of the input signal IN1. However, the maximum rising levels of the base and emitter voltages are lower than those in the conventional configuration shown in FIG. 51. As indicated by the broken line shown in FIG. 63, an instantaneous level change of the output signal occurring in the circuit shown in FIG. 61 is more suppressed than that occurring in the conventional circuit shown in FIG. 47.

Figure 64:
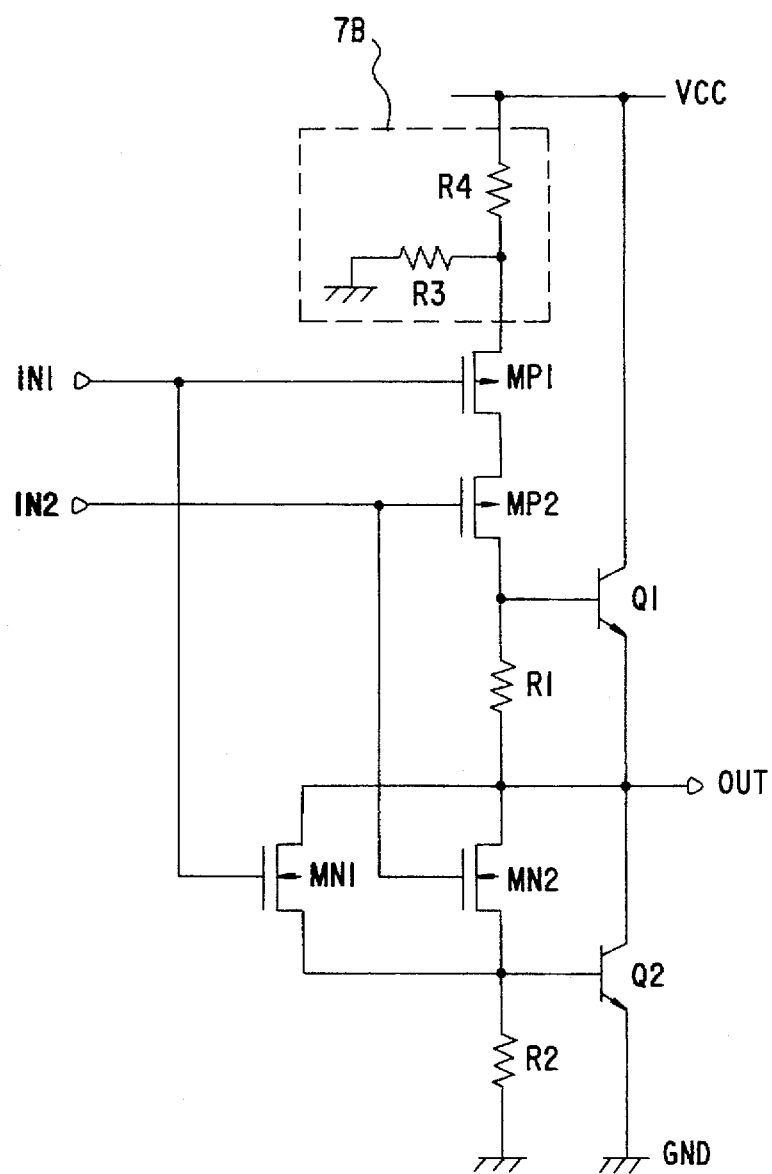
FIG. 64 is a circuit diagram of another example of the configuration shown in FIG. 48.

FIG. 64 shows another configuration related to the circuit configuration shown in FIG. 48. As shown in FIG. 64, a resistor R4 is connected to the power supply line Vcc and the source of the P-channel MOS transistor MP1, and this connection node is grounded via the resistor R3. The resistors R3 and R4 functions as the level shift element shown in FIG. 48.

Figure 65:
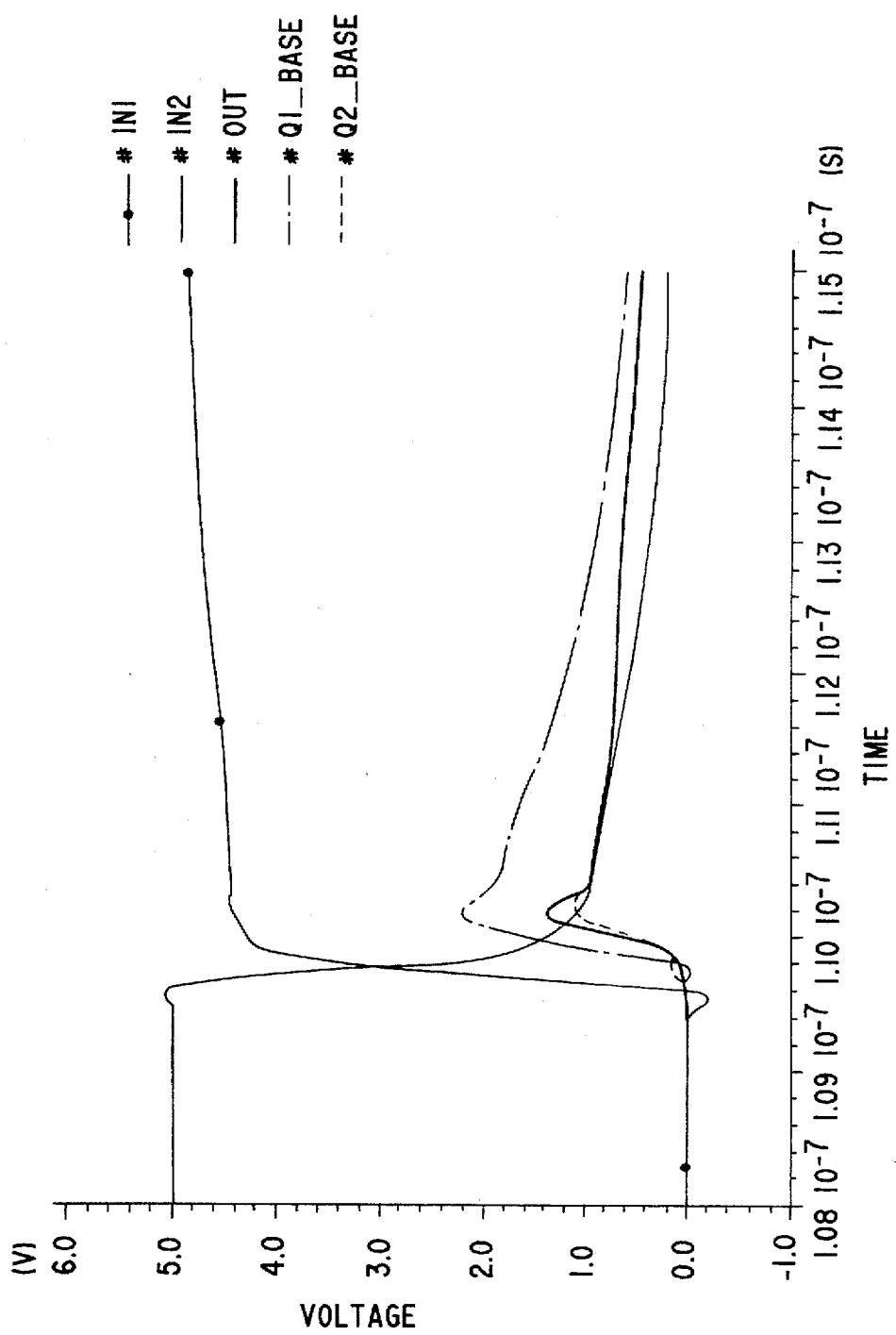
FIG. 65 is a waveform diagram of the operation of the circuit shown in FIG. 64.

FIG. 65 is a waveform diagram of the AC operation of the circuit shown in FIG. 64. The base and emitter voltages of the bipolar transistor Q1 rise in response to the rise of the input signal IN1. However, the maximum rising levels are lower than those in the conventional configuration shown in FIG. 51. As indicated by the broke line shown in FIG. 63, an instantaneous level change of the output signal occurring in the circuit shown in FIG. 64 is more suppressed than that occurring in the conventional circuit shown in FIG. 47.

A description will now be given of a third embodiment of the present invention. As in the case of the second embodiment of the present invention, the third embodiment thereof is intended to suppress an instantaneous level change of the output signal occurring at the output terminal of the Bi-CMOS circuit. Particularly, the third embodiment of the present invention is intended to suppress the instantaneous output level change occurring at the output terminal of a logic circuit shown in FIG. 66. Before describing the third embodiment of the present invention, a conventional configuration and problems encountered therein will be described.

Figure 66:
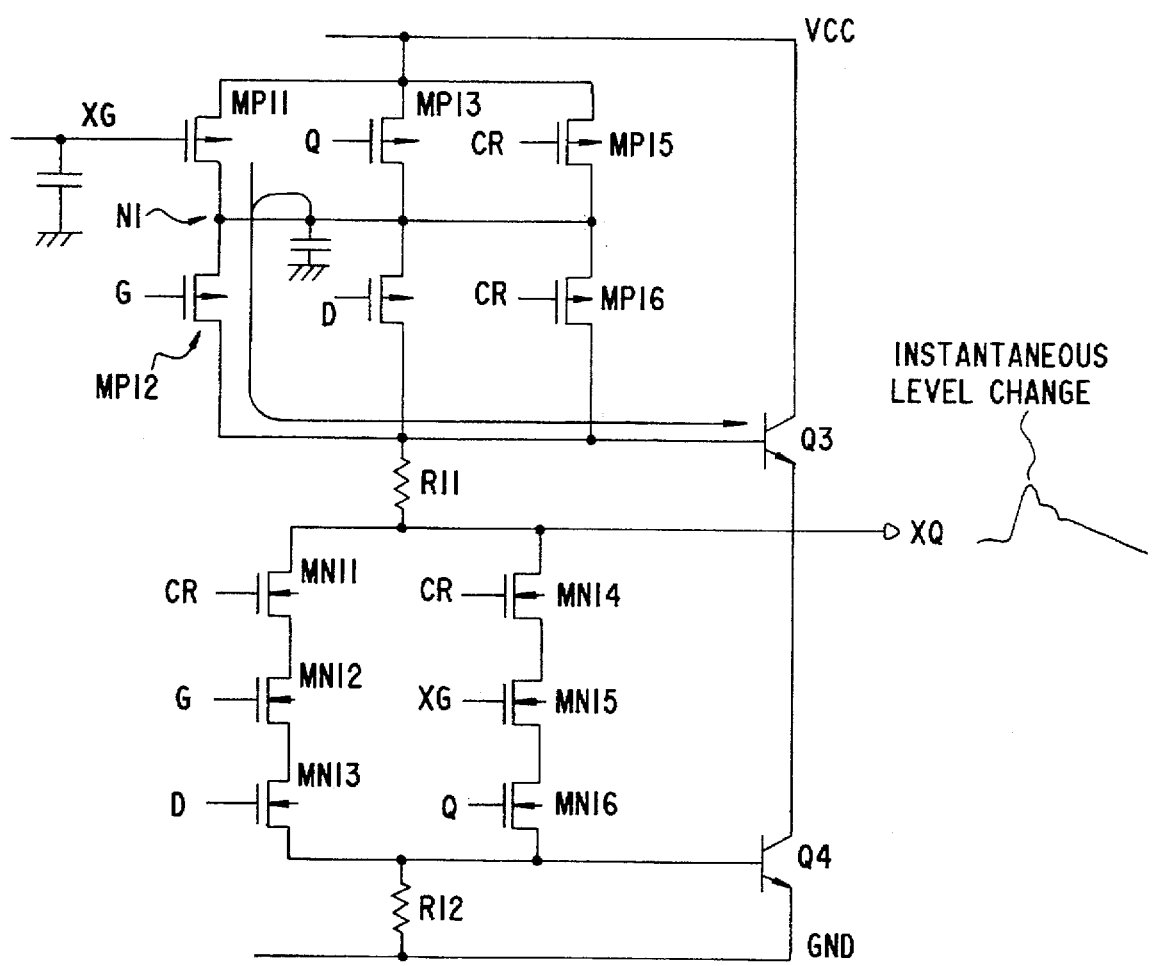
FIG. 66 is a circuit diagram of a conventional latch macro in which an instantaneous level change in the output signal thereof occurs.

FIG. 66 is a circuit diagram of an internal macro (latch macro) used in a Bi-CMOS gate array. The circuit shown in FIG. 66 corresponds to the block indicated by the broken line shown in FIG. 67. More particularly, the circuit shown in FIG. 66 forms two AND gates AND1 and AND2 and one NAND gate NAND1. The circuit shown in FIG. 66 has six P-channel MOS transistors MP11–MP16, six N-channel MOS transistors MN11–MN16, two bipolar transistors Q3 and Q4, and two resistors R11 and R12. Three pairs of the P-channel MOS transistors MP11 and MP12, MP13 and MP14, and MP15 and MP16 respectively connected in series are connected between the power supply line Vcc and the resistor R11. The N-channel MOS transistors MN11, MN12 and MN13 are connected in series between the resistors R11 and R12. The N-channel MOS transistors MN14, MN15 and MN16 are connected in series between the resistors R11 and R12. The resistor R11 is connected to the emitter and base of the bipolar transistor Q3, the resistor R12 is connected to the emitter and base of the bipolar transistor Q4. The power supply voltage Vcc is applied to the collector of the bipolar transistor Q3, and the emitter and connector thereof are connected together and form the output terminal of the overall circuit. The emitter of the bipolar transistor Q4 is grounded.

Figure 67:
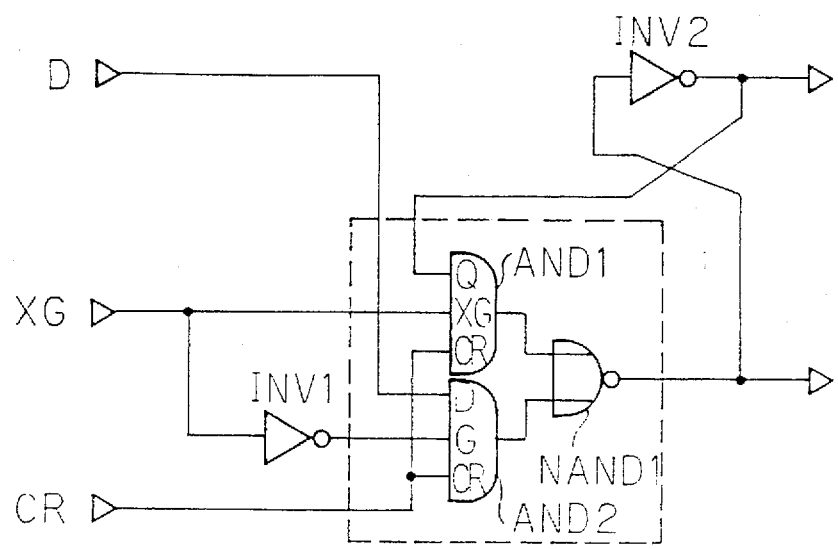
FIG. 67 is a block diagram of the latch macro shown in FIG. 66.

The P-channel MOS transistors MP11, MP13 and MP15 and the N-channel MOS transistors MN14, MN15 and MN16 form the AND gate AND1 shown in FIG. 67. The P-channel MOS transistors MP12, MP14 and MP16 and the N-channel MOS transistors MN11, MN12 and MN13 form the AND gate shown in FIG. 67. Further, the bipolar transistors Q3 and Q4 and the resistors R11 and R12 form the NAND gate NAND1 shown in FIG. 67.

A data signal D is applied to the AND gate AND2, and a latch enable signal XG is applied to the AND gate AND1. The inverted version G of the latch enable signal generated by the inverter INV1 is applied to the AND gate AND2. The output terminals of the AND gates AND1 and AND2 are connected to input terminals of the NAND gate NAND1, and the output signal of the NAND gate NAND1 passes through the inverter INV2 and is used as an input signal Q of the AND gate AND1. The inverter INV1 at the input side includes a CMOS inverter, and the inverter INV2 at the output side includes the Bi-CMOS inverter shown in FIG. 1.

The six P-channel MOS transistors are connected to a node N1 shown in FIG. 66, and thus a large capacitance is coupled to the node N1. Hence, when the P-channel MOS transistors MP11 and MP12 are simultaneously turned ON, a charge stored in the capacitance flows out, and flows in the bipolar transistor Q3 as a pass-through current, which turns ON the transistor Q3. As a result, an instantaneous level change as shown in FIG. 66 occurs in the output signal XQ. The condition that the P-channel MOS transistors MP11 and MP12 are simultaneously ON depends on the input signals G and XG.

Figure 68:
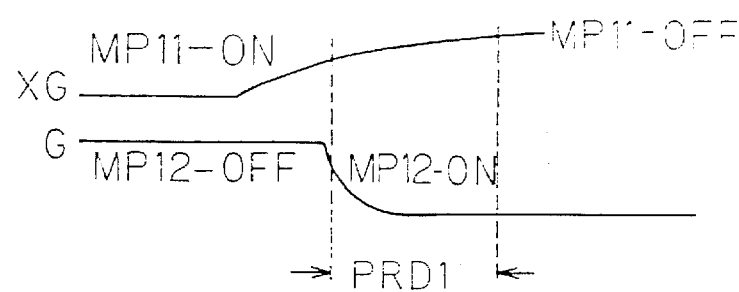
FIG. 68 is a waveform diagram of the AC operation of the conventional circuit shown in FIG. 66.

The mechanism of causing such an instantaneous level change of the output signal is as follows. It will now be assumed that the data signal D is at the high (H) level. The latch output Q obtained at that time is high, and the latch output XQ is low (see FIG. 68). If a signal line for carrying the latch enable signal XG is long, the rising waveform thereof becomes greatly dull. The dull waveform of the latch enable signal XG is input to the inverter INV1 without any change. The inverted version of the latch enable signal XG is generated by inverting the signal XG by the inverter INV1 provided in the latch macro. The threshold level of the inverter INV1 is approximately half the signal amplitude. The latch enable signal XG having the dull rising waveform is applied to the gate of the P-channel MOS transistor MP11 shown in FIG. 66, and the inverted version G thereof is applied to the gate of the P-channel MOS transistor MP12. Hence, as shown in FIG. 68, a period PPRD1 is generated during which the P-channel MOS transistors MP11 and MP12 are concurrently ON. Hence the current from the power supply line Vcc and the charge stored in the node N1 do not flow in the resistor R11, but flow in the bipolar transistor Q3, which is therefore turned ON. However, when the latch enable signal XQ is low, the bipolar transistor Q3 must be OFF. However, as described above, the transistor Q3 is ON, and an instantaneous level change occurs in the output signal. This instantaneous level change is transferred to a macro of the next stage without any change, and causes the next-stage macro to malfunction.

Figure 69:
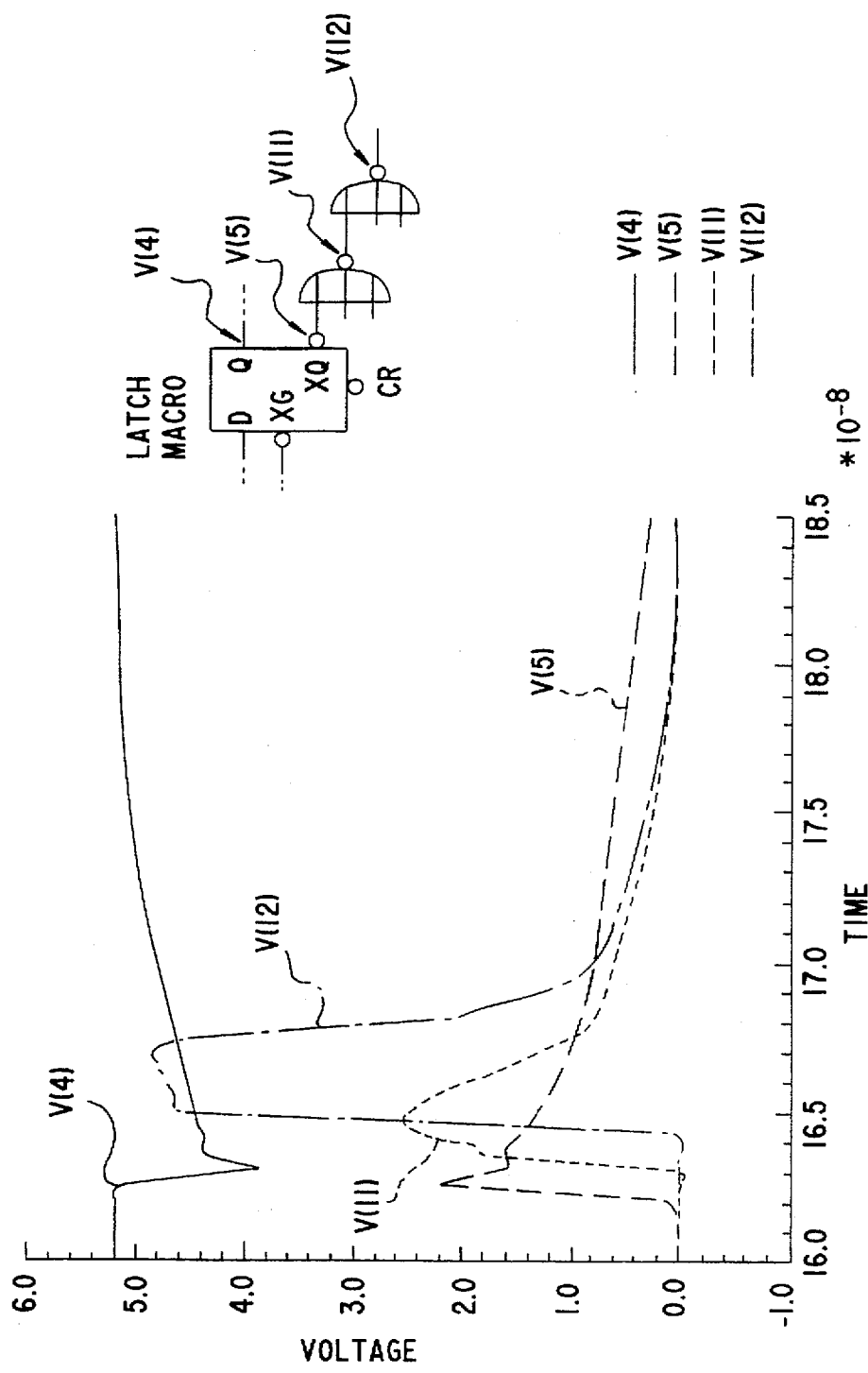
FIG. 69 is a diagram showing how much an instantaneous output level change in the configuration shown in FIG. 68 affects circuits of subsequent stages.

FIG. 69 is a diagram for explaining a malfunction of a macro of the next stage. The output signal XQ of the latch macro shown in FIG. 67 sequentially propagates two NOR gates shown in FIG. 69. An instantaneous level change having a peal level of approximately 2.2V occurs in a voltage waveform V(5) of the output signal XQ, and greatly appears in an output voltage waveform V(11) of the next-stage of the NOR gate, and an output voltage waveform V(12) of the following NOR gate.

The third embodiment of the present invention prevents occurrence of an instantaneous level change of the output signal without turning ON the transistor Q3 in the state in which the P-channel MOS transistors MP11 and MP12 are simultaneously ON.

Figure 70:
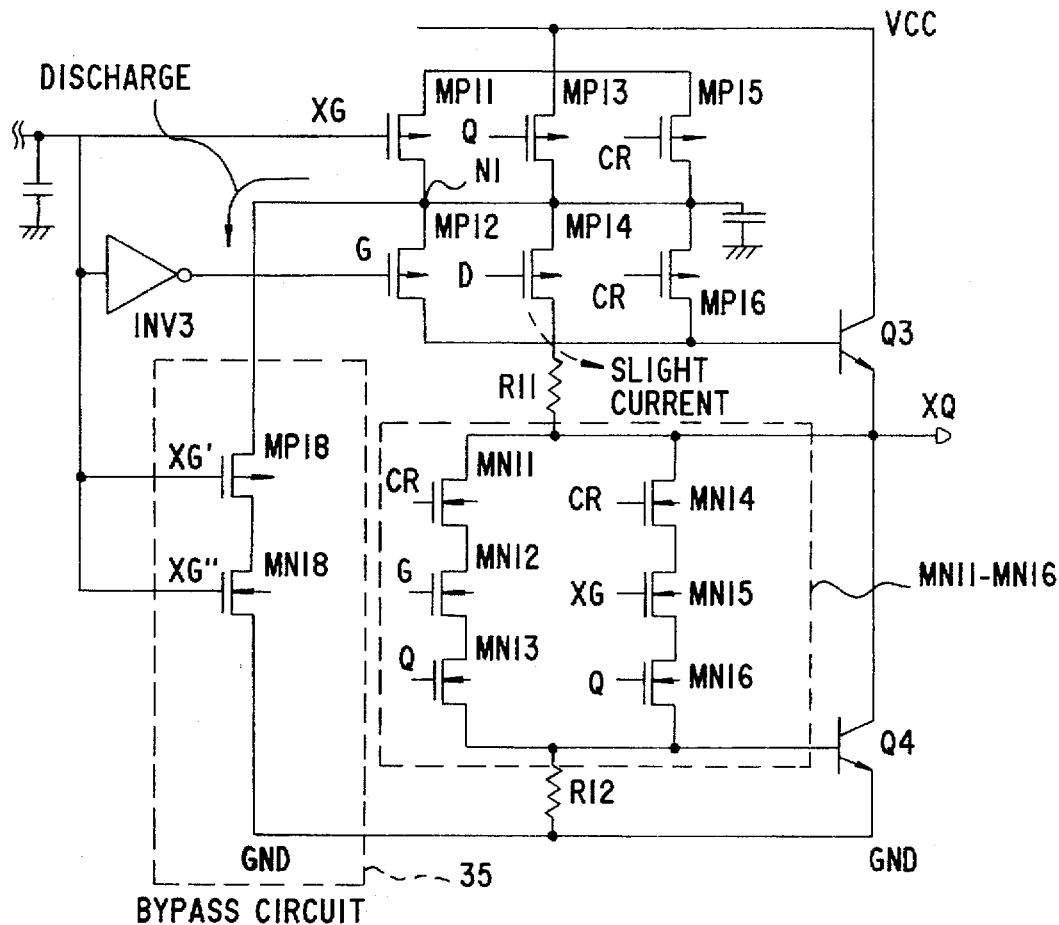
FIG. 70 is a circuit diagram of a third embodiment of the present invention.

FIG. 70 is a circuit diagram of the third embodiment of the present invention. In FIG. 70, parts that are the same as those shown in FIG. 66 are given the same reference numbers. The circuit shown in FIG. 70 is formed by adding a bypass circuit 35 to the circuit shown in FIG. 66. The bypass circuit 35 includes a P-channel MOS transistor MP18 and an N-channel MOS transistor MN18 connected in series. The source of the P-channel MOS transistor is connected to the node N1, and the source of the N-channel MOS transistor MN 18 is grounded. The gates of the MOS transistors MP18 and MN18 are supplied with the latch enable signal XG. For the convenience of explanation, the latch enable signal XG applied to the gate of the P-channel MOS transistor MP18 is represented as XG', and the latch enable signal XG applied to the gate of the N-channel MOS transistor MN18 is represented as XG".

Figure 71:
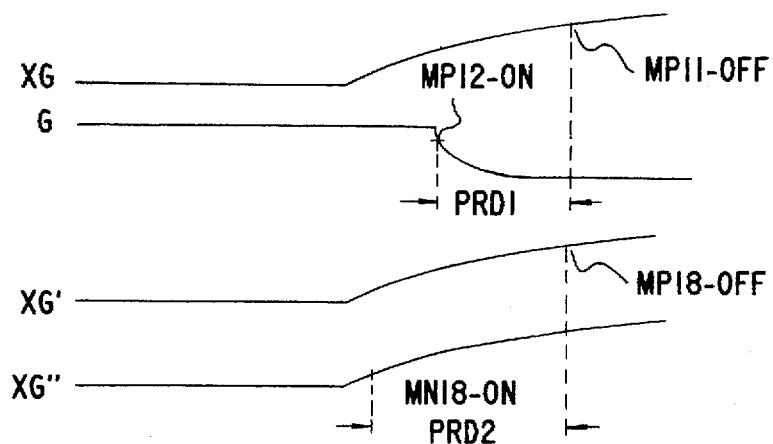
FIG. 71 is a waveform diagram of the operation of the circuit shown in FIG. 70.

FIG. 71 is a waveform diagram of the AC operation of the circuit shown in FIG. 70. The MOS transistors MP18 and MN18 are both ON before the MOS transistors MP11 and MP12 are switched to ON. Hence, the current from the power supply line Vcc and the charge stored in the node N1 pass through the MOS transistors MP18 and MN18 and flow to the ground GND. As a result, only a fine current flows in the base of the bipolar transistor Q3, and little instantaneous level change occurs in the output signal XQ.

Figure 72:
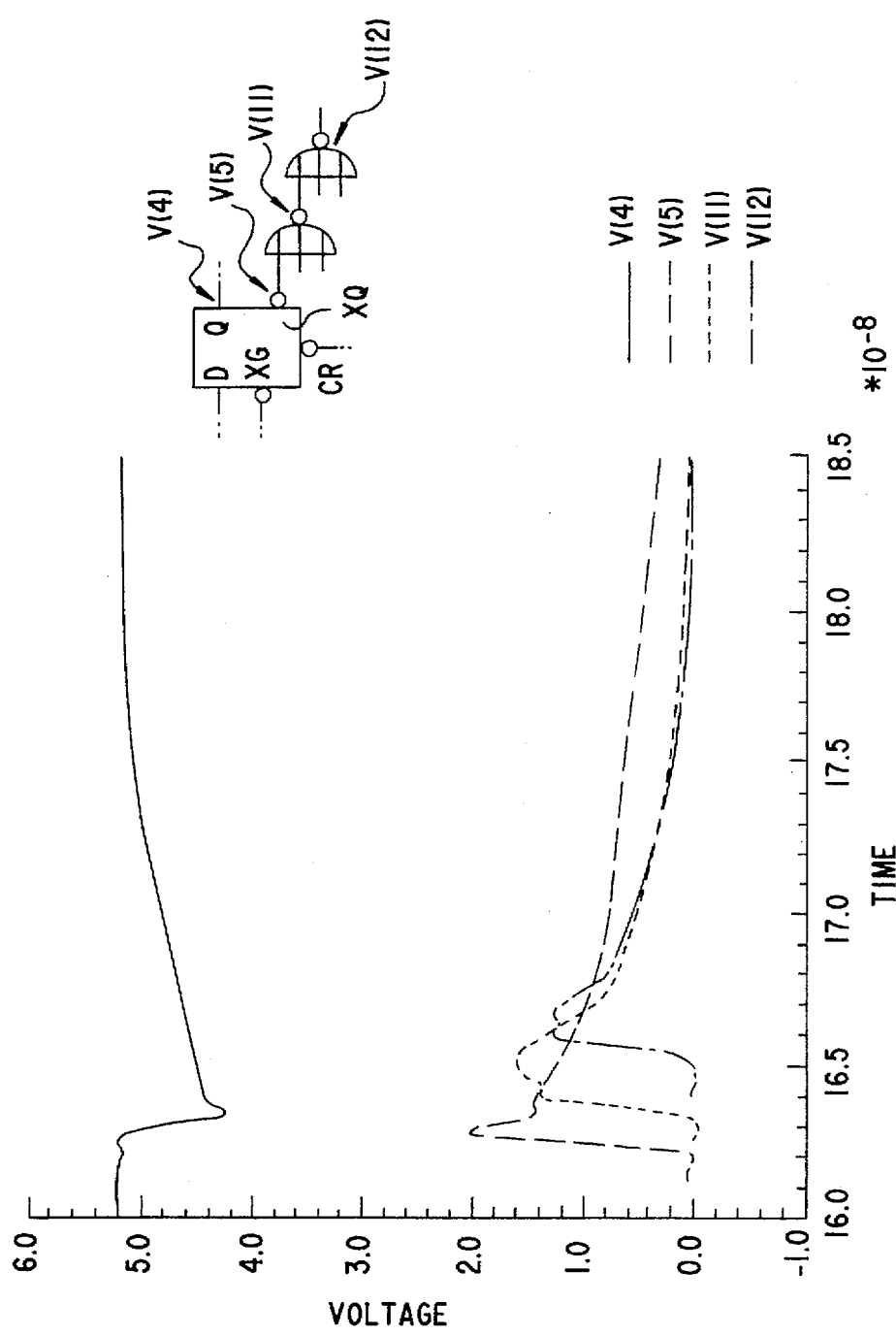
FIG. 72 is a diagram showing how much an instantaneous output level change in the configuration shown in FIG. 71 affects circuits of subsequent stages.

FIG. 72 is a diagram showing how much the latch macro circuit shown in FIG. 70 affects the following logic circuit macros (NOR gates as in the case shown in FIG. 69). An instantaneous level change occurring in the output signal V(5) of the latch macro shown in FIG. 70 is approximately equal to 2 [V], and is less than that shown in FIG. 69. Further, the influence of the output signal V(5) to the output signals V(11) and V(12) of the subsequent NOR gates is reduced and more improved than that shown in FIG. 69. Hence, it is possible to prevent a malfunction of the subsequent logic circuits.

Figure 73:
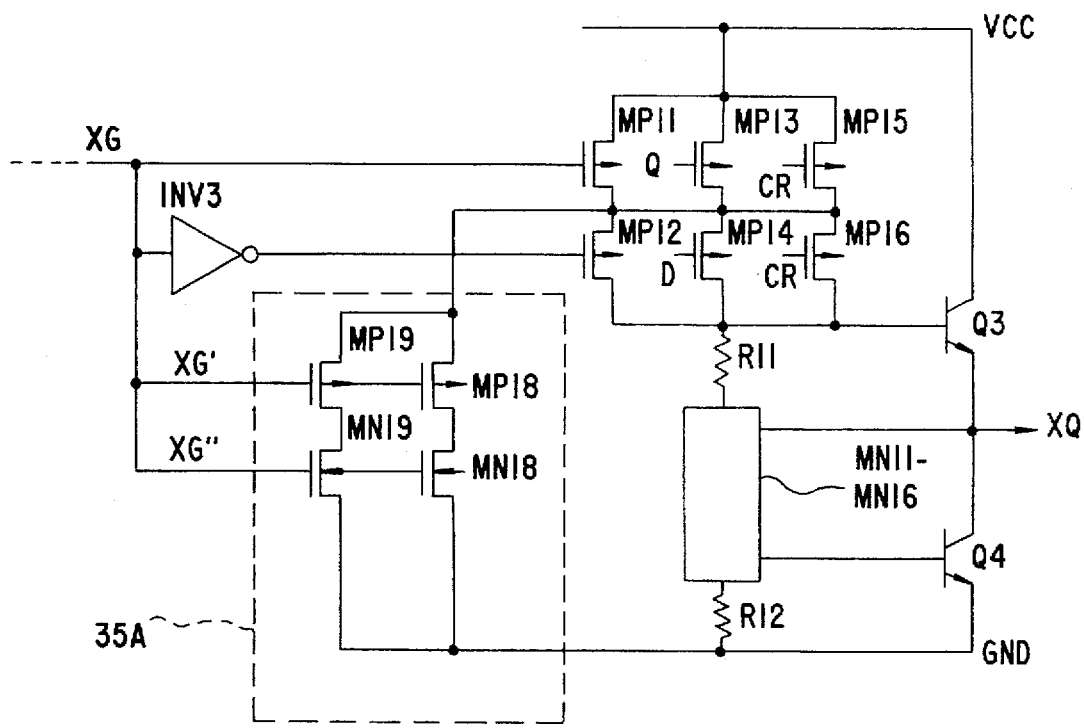
FIG. 73 is a circuit diagram of a latch macro having a first variation of a bypass circuit used in the third embodiment of the present invention.

FIG. 73 is a circuit diagram of a first variation of the bypass circuit used in the third embodiment of the present invention. A bypass circuit 35A shown in FIG. 73 is formed by connecting a series circuit made up of a P-channel MOS transistor MP19 and an N-channel MOS transistor MN19 in parallel to the series circuit made up of the P-channel MOS transistor MP18 and the N-channel MOS transistor MN18. For the sake of simplicity, the N-channel MOS transistors MN11–MN1t shown in FIG. 70 are replaced by a block. As compared with the circuit configuration shown in FIG. 70, the circuit configuration shown in FIG. 50 is capable of rapidly flowing the charge stored in the node N1 to the ground.

Figure 74:
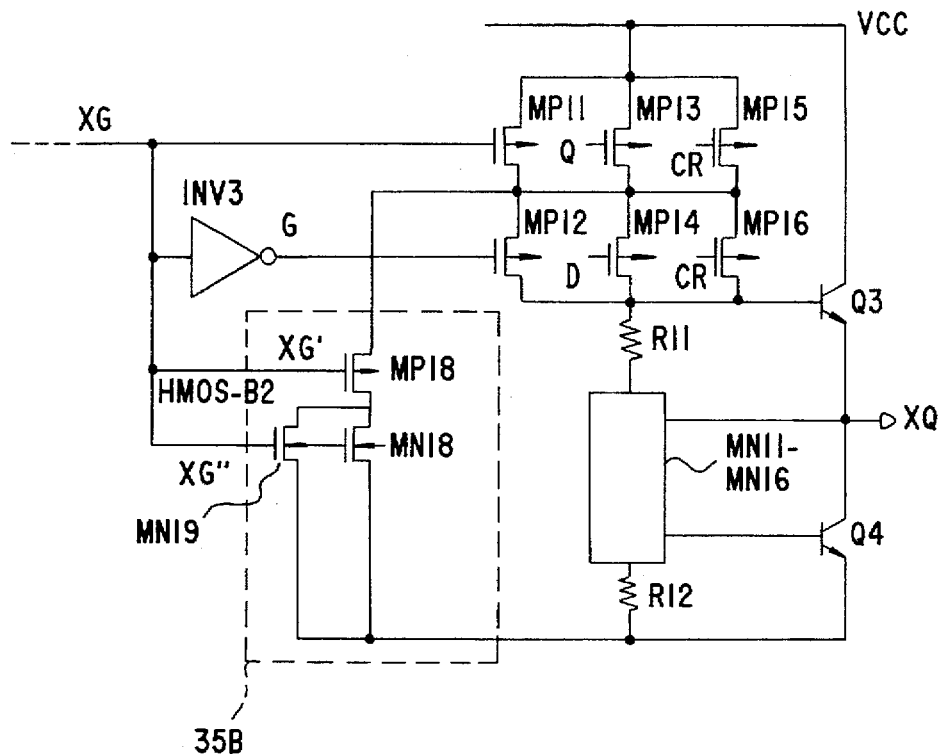
FIG. 74 is a circuit diagram of a latch macro having a second variation of the bypass circuit used in the third embodiment of the present invention.

FIG. 74 is a circuit diagram of a latch macro including a second variation of the bypass circuit used in the third embodiment of the present invention. A bypass circuit 35B shown in FIG. 74 is formed by connecting the N-channel MOS transistor MN19 in parallel to the transistor MN18. Due to the presence of the transistor MN19, it becomes possible to rapidly discharge the node N1 immediately after the transistors MN18 and MN19 are both ON, as compared with the configuration shown in FIG. 70.

Figure 75:
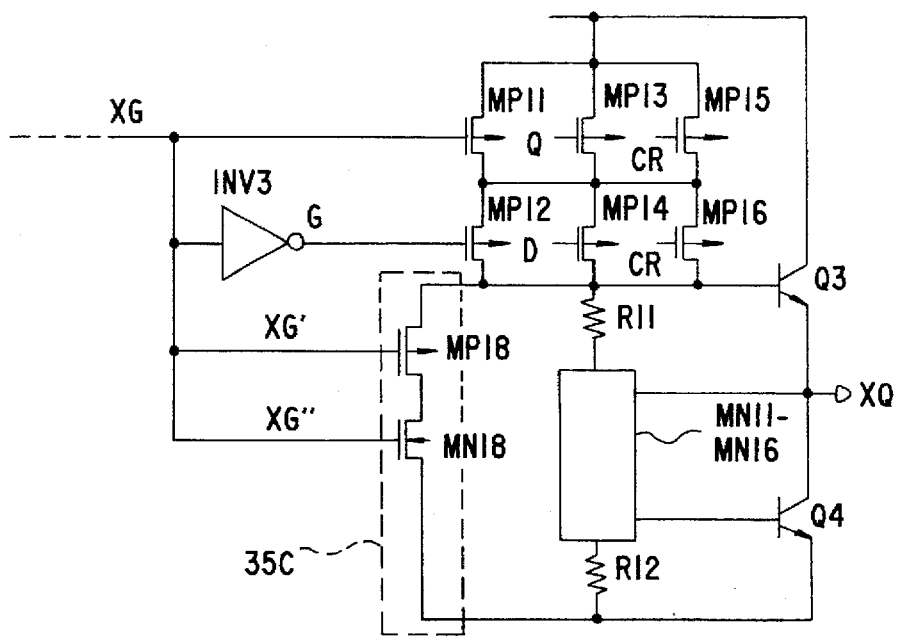
FIG. 75 is a circuit diagram of a latch macro having a third variation of the bypass circuit used in the third embodiment of the present invention.

FIG. 75 is a circuit diagram of a latch macro having a third variation of the bypass circuit used in the third embodiment of the present invention. A bypass circuit 35C shown in FIG. 75 is formed by connecting the source of the P-channel MOS transistor MP18 to the base of the bipolar transistor Q3. With this structure, the threshold voltage of the P-channel MOS transistor is decreased, so that the change from ON to OFF more occurs earlier than that in the circuit shown in FIG. 70. However, the bypassing capability of the circuit shown in FIG. 75 is less than that of the circuit shown in FIG. 70. In this regard, it is preferable to connect an N-channel MOS transistor to the N-channel MOS transistor MN18 in parallel.

Figure 76:
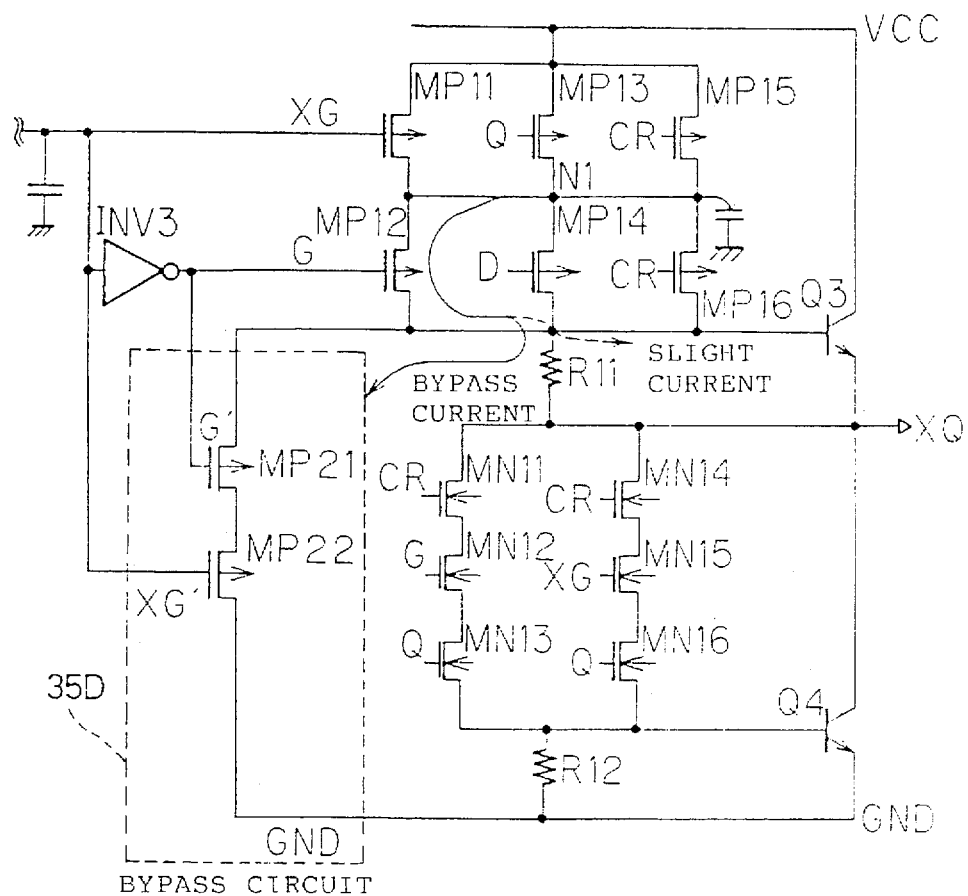
FIG. 76 is a circuit diagram of a latch macro having a fourth variation of the bypass circuit used in the third embodiment of the present invention.

FIG. 76 is a circuit diagram of a latch macro having a fourth variation of the bypass circuit used in the third embodiment of the present invention. A bypass circuit 35D shown in FIG. 76 includes two P-channel MOS transistors MP21 and MP22 connected in parallel. The gate of the P-channel MOS transistor is connected to the output terminal of the inverter INV3, and receives the gate signal G as a gate signal G'. The gate of the P-channel MOS transistor MP22 receives the gate enable signal XG as XG'. The source of the P-channel MOS transistor MP21 is connected to the base of the bipolar transistor Q3, and the drain of the P-channel MOS transistor MP22 is grounded.

Figure 77:
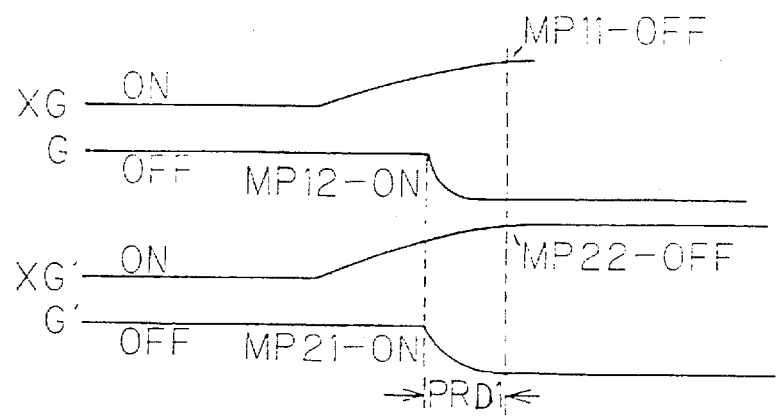
FIG. 77 is a waveform diagram of the AC operation of the circuit shown in FIG. 76.

FIG. 77 is a waveform diagram of the operation of the bypass circuit 35D shown in FIG. 76. When the P-channel MOS transistors MP11 and MP12 are both ON, the two P-channel MOS transistors MP21 and MP22 of the bypass circuit 35D are both ON (period PRD1). Hence, a current from the power supply line Vcc and the charge stored in the node N1 pass through the bypass circuit 35D and flow to the ground. Hence, only a fine current flows in the base of the bipolar transistor Q3, and occurrence of an instantaneous level change of the output signal is prevented.

Figure 78:
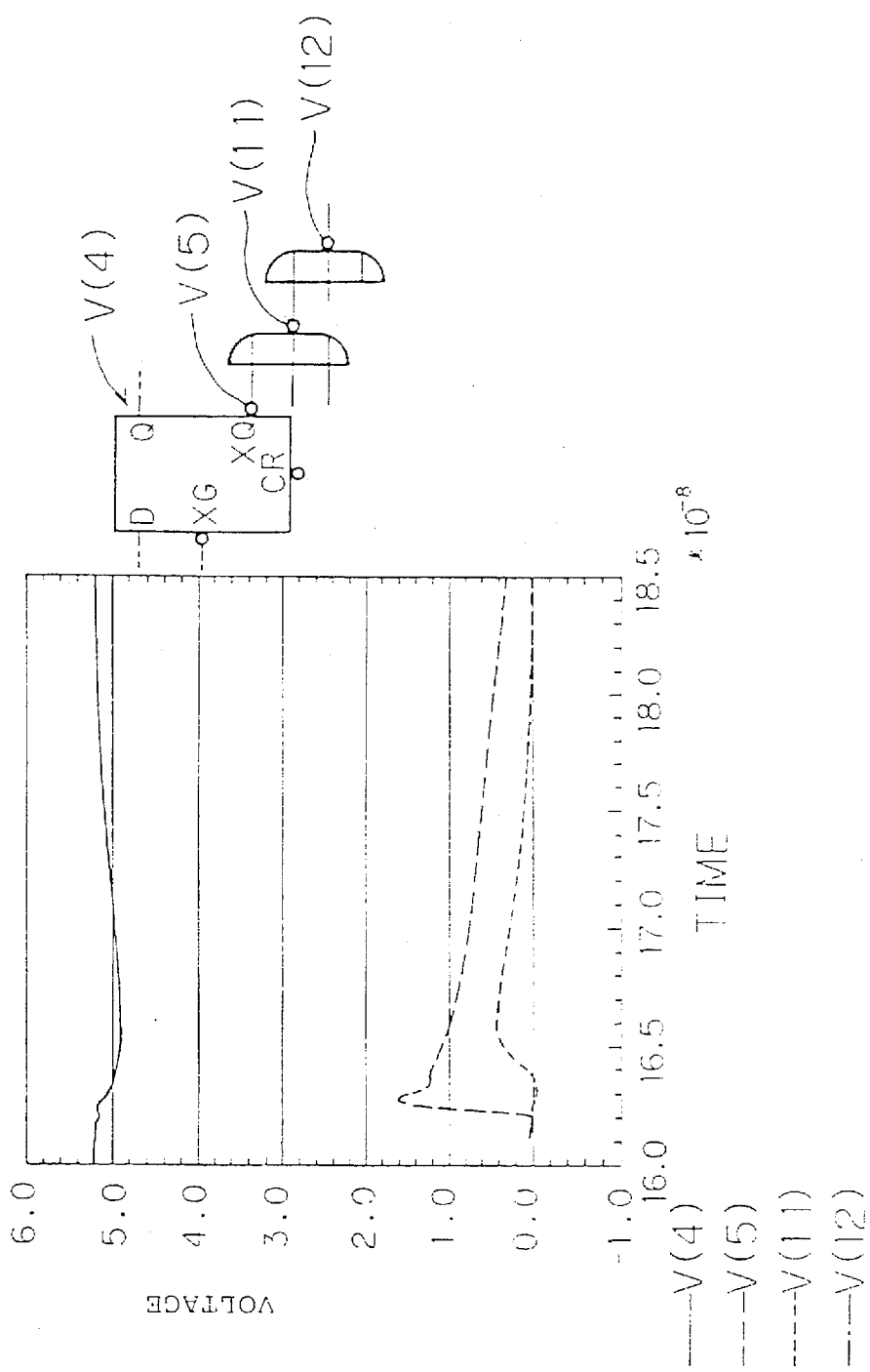
FIG. 78 is a diagram showing how much an instantaneous output level change in the configuration shown in FIG. 77 affects circuits of subsequent stages.

FIG. 78 is a diagram how much the latch macro circuit shown in FIG. 76 affects the following logic circuit macros (NOR gates as in the case shown in FIG. 69). An instantaneous level change occurring in the output signal V(5) of the latch macro shown in FIG. 76 is approximately equal to 1.2 [V], and is less than that shown in FIG. 69. Further, the influence of the output signal V(5) to the output signals V(11) and V(12) of the subsequent NOR gates is reduced and more improved than that shown in FIG. 69. Hence, it is possible to prevent a malfunction of the subsequent logic circuits.

Figure 79:
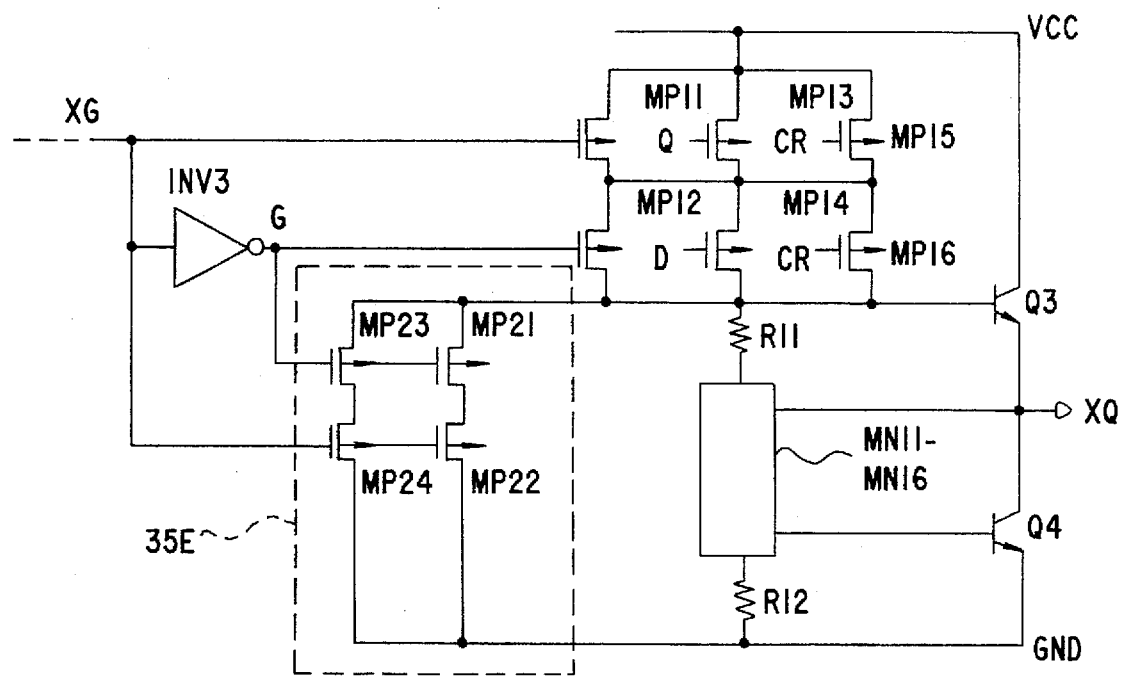
FIG. 79 is a circuit diagram of a latch macro having a fifth variation of the bypass circuit used in the third embodiment of the present invention.

FIG. 79 is a circuit diagram of a latch macro having a fifth variation of the bypass circuit used in the third embodiment of the present invention. A bypass circuit 53E shown in FIG. 79 includes two series circuits connected in parallel, one of the two series circuit being made up of the P-channel MOS transistors MP21 and MP22 shown in FIG. 76, and the other series circuit being made up of two P-channel MOS transistors MP23 and MP24. The gates of the P-channel MOS transistors MP23 and MP24 are supplied with the output signal G of the inverter INV3 and the latch enable signal XG, respectively. The bypass circuit 53E has a bypassing capability higher than that of the bypass circuit shown in FIG. 76.

Figure 80:
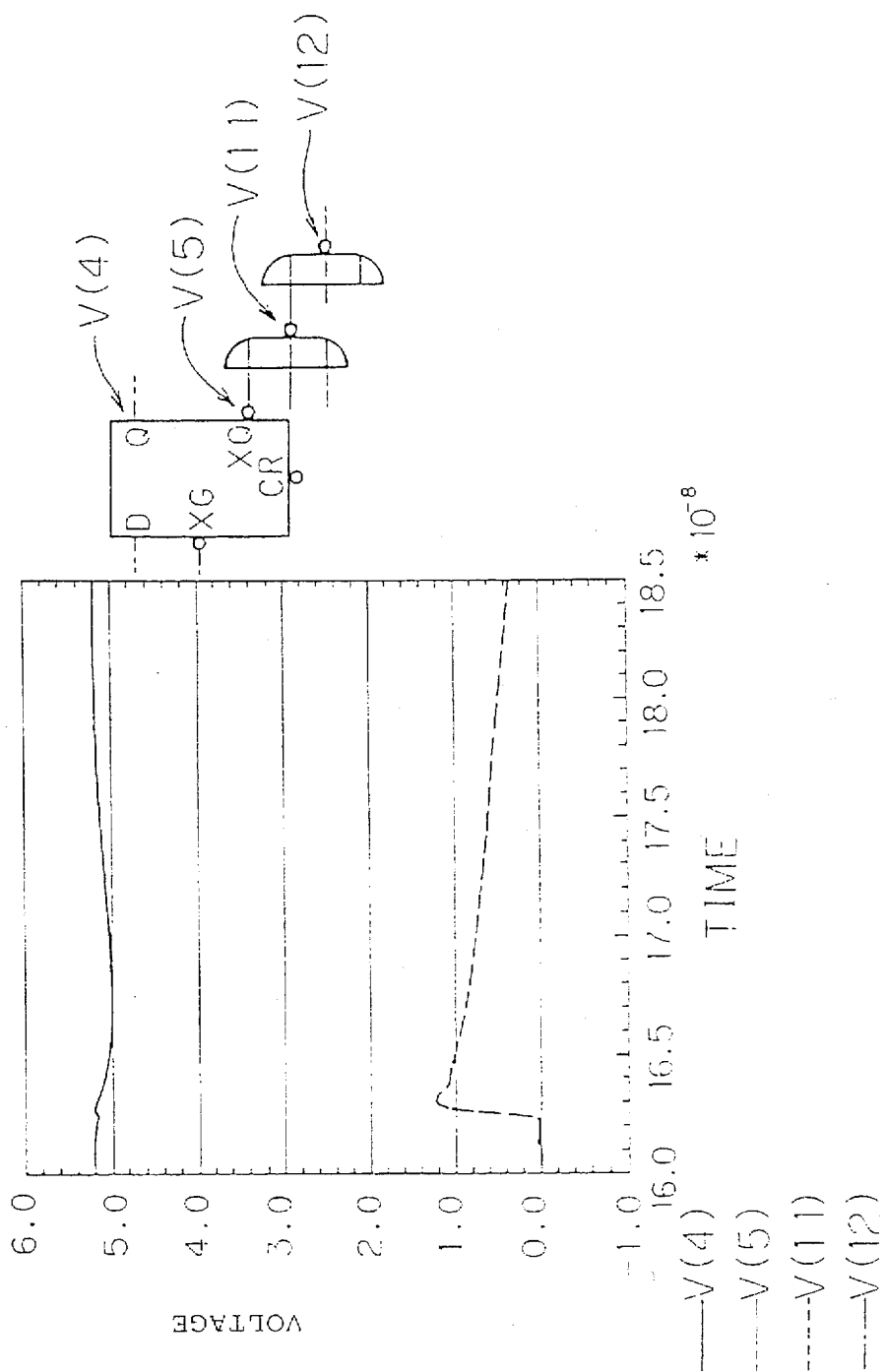
FIG. 80 is a diagram showing how much an instantaneous output level change in the configuration shown in FIG. 79 affects circuits of subsequent stages.

FIG. 80 is a diagram how much the latch macro circuit shown in FIG. 79 affects the following logic circuit macros (NOR gates as in the case shown in FIG. 69). Since the bypass circuit 35E has a high bypassing capability, an instantaneous level change in the output signal can be more suppressed than that (shown in FIG. 78) occurring in the circuit shown in FIG. 76.

Figure 81:
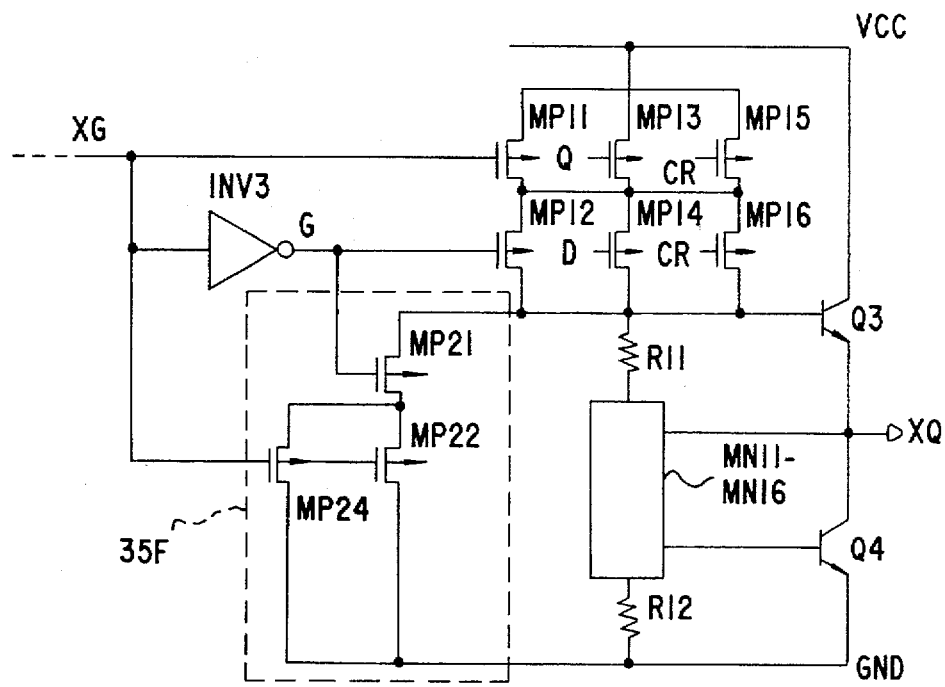
FIG. 81 is a circuit diagram of a latch macro having a sixth variation of the bypass circuit used in the third embodiment of the present invention.

FIG. 81 is a circuit diagram of a latch macro having a sixth variation of the bypass circuit used in the third embodiment of the present invention. A bypass circuit 35F shown in FIG. 81 is configured by connecting a P-channel MOS transistor MP24 in parallel to the P-channel MOS transistor MP22 of the bypass circuit 35D shown in FIG. 76. The bypass circuit 35F is capable of facilitating the discharging at the early stage of the bypassing operation.

Figure 82:
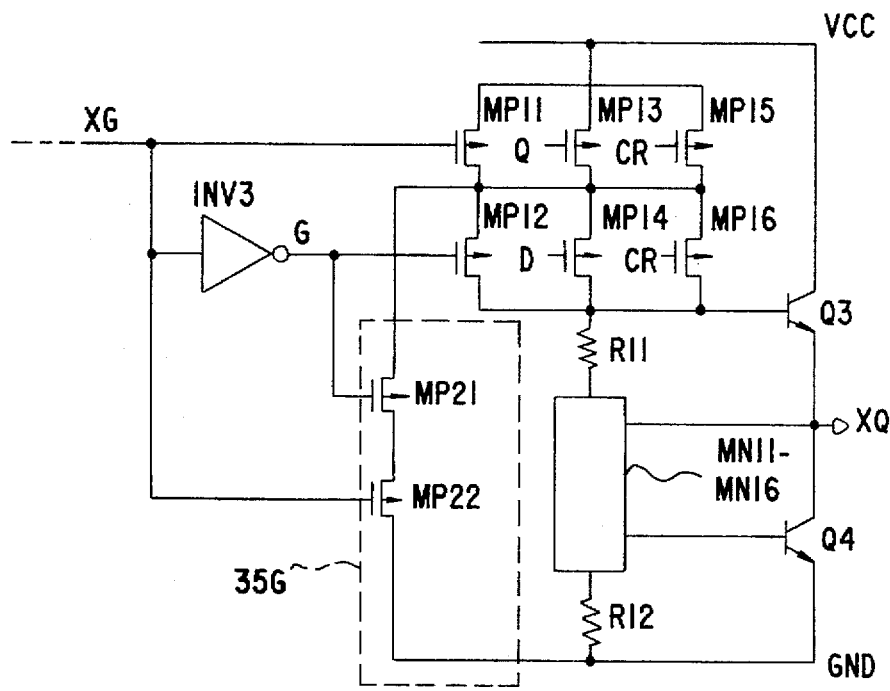
FIG. 82 is a circuit diagram of a latch macro having a seventh variation of the bypass circuit used in the third embodiment of the present invention.
Figure 83:
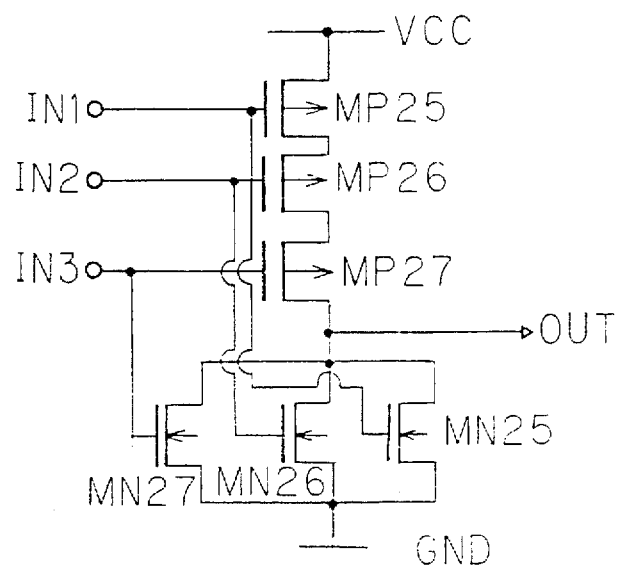
FIG. 83 is a circuit diagram of a conventional three-input NOR gate in which an instantaneous output level change occurs.

FIG. 82 is a circuit diagram of a latch macro having a seventh variation of the bypass circuit used in the third embodiment of the present invention. A bypass circuit 35G shown in FIG. 82 is made up of two P-channel MOS transistors MP21 and MP22 like the bypass circuit 35D shown in FIG. 76, but differs from it in that the source of the P-channel MOS transistor MP21 shown in FIG. 82 is connected to the node N1. The bypass circuit 35G has almost the same advantages as those of the bypass circuit 35D.

As described above, the second and third embodiments of the present invention have structures for suppressing occurrence of an instantaneous level change. The instantaneous output level change may occur due to a cause other than the aforementioned causes. Generally, in an ASIC (Application Specific Integrated Circuit), the different types of gates (macro-cells) employ different input threshold voltages for determining logical switching. If a noise is input to a gate having a threshold voltage much deviating from the standard threshold value, the above noise may be input as a normal input signal. Such a noise causes a malfunction of devices and degrades the reliability thereof. Particularly, the input noise is propagated in the circuits of the subsequent stages, and causes various problems.

For example, the thresholds of three P-channel MOS transistors MP25, MP26 and MP27 and three N-channel MP25, MP26 and MP27 are much less than the threshold voltage of a pair of MOS transistors forming the CMOS inverter. If a noise increasing toward a plus level from the ground level occurs in one of three input signals IN1, IN2 and IN3 which are at the low level (ground level), the relevant N-channel MOS transistor is turned ON, and it malfunctions as if high-level data is input thereto. The above problem becomes conspicuous as the number of input signals increases.

With the above in mind, a fourth embodiment of the present invention is characterized in that input threshold voltages suitable for the types of gates can be set by controlling the power supply voltage.

Figure 84:
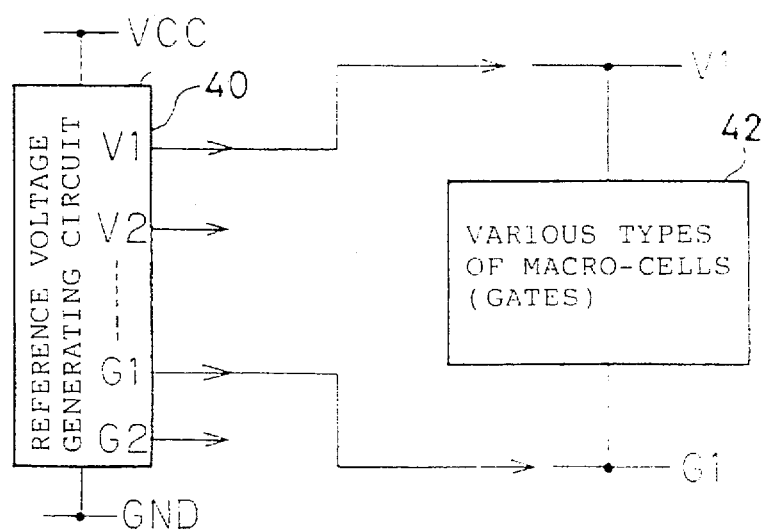
FIG. 84 is a block diagram of the principle of the fourth embodiment of the present invention.

FIG. 84 is a block diagram of the principle of the fourth embodiment of the present invention. The fourth embodiment of the present invention includes a reference voltage generating circuit 40, which is connected between the power supply lines Vcc and GND and generates a plurality of internal power supply voltages V1, V2, . . . , G1 and G2 (Vcc>V1>V2>. . . G1>G2 >GND). The voltages enabling a macro-cell (gate) 42 to operate on an optimal threshold voltage are selected from among the above voltages (V1 and G1 in the example shown in FIG. 84), and are applied thereto. Either the high-potential or low-potential supply voltage applied to the macro-cell 42 may be Vcc or GND. That is, either the high-potential or low-potential power supply voltage applied to the macro-cell 42 is generated by the reference voltage generating circuit 40. The macro-cell is a logic circuit including a CMOS circuit and/or a Bi-CMOS circuit.

Figure 85:
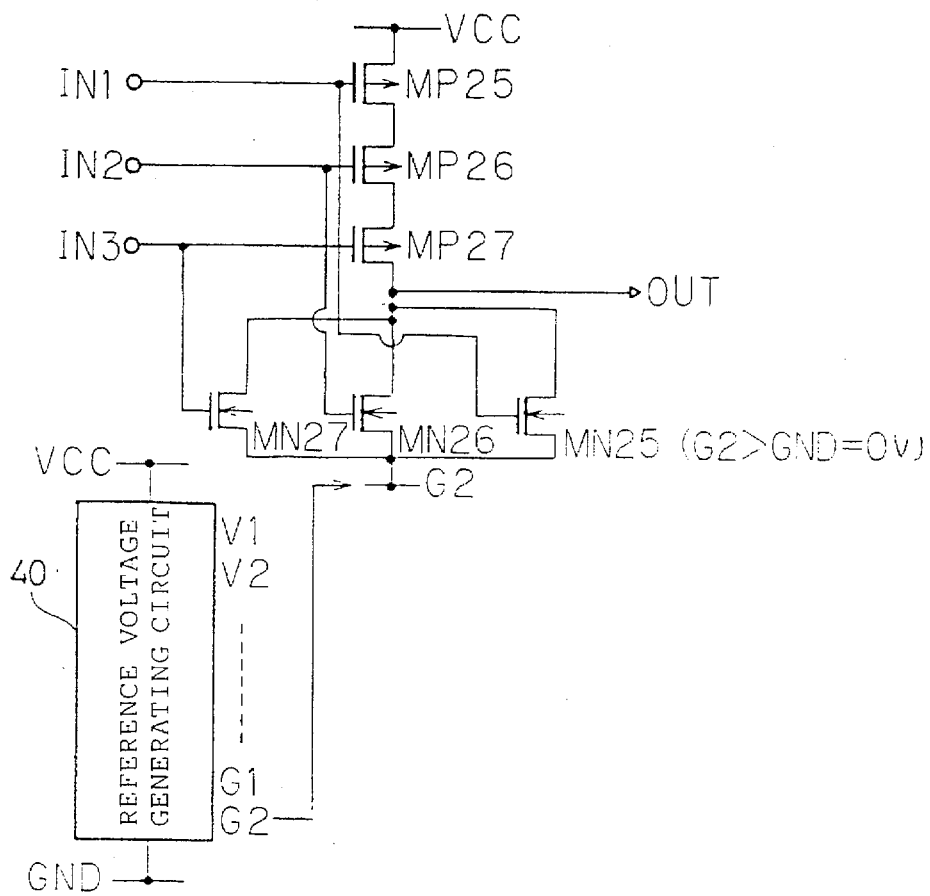
FIG. 85 is a circuit diagram of an example of the configuration of the fourth embodiment of the present invention.

FIG. 85 shows a circuit configuration in which the reference voltage generating circuit 40 is applied to a three-input NOR gate. In FIG. 85, the high power supply voltage applied to the NOR gate is Vcc, and the low power supply voltage applied thereto is G2 (>GND) generated by the reference voltage generating circuit 40. With the above configuration, the source potentials of the N-channel MOS transistors MN25, MN26 and MN27 become higher than the ground level, whereby the threshold voltages of these MOS transistors can be substantially increased. Hence, even if an instantaneous level change (noise) is superimposed on one of the three input signals, the relevant N-channel MOS transistor is not turned ON with ease, so that an instantaneous level change does not occur in the output signal OUT.

In the case shown in FIG. 85, the low logic level of the output signal OUT is slightly higher than the ground level. However, if such a slightly high ground level does not change the state of a circuit of the subsequent stage, no problem will occur. In a circuit configuration in which the aforementioned bipolar transistors Q1 and Q2 are added to the circuit shown in FIG. 85, the same advantages as described above are obtained.

Figure 86:
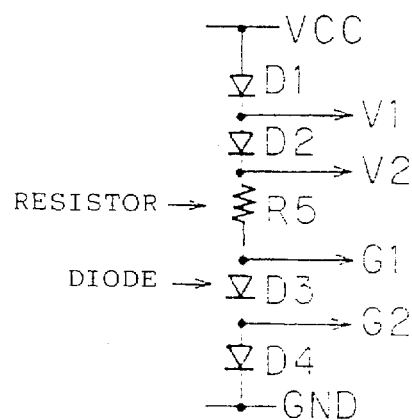
FIG. 86 is a circuit diagram of a reference voltage generating circuit shown in FIG. 84.

FIG. 86 is a circuit diagram of an example of the reference voltage generating circuit 40. Diodes D1 and D2 are connected to a resistor R5 in series and diodes D3 and D4 are connected thereto in series. The diodes D1–D4 may be ordinary diodes, Schottky diodes or diode-connected transistors. Further, an arbitrary number of diodes can be selected. Further, a ladder-type resistor network having series-connected resistors may be used instead of diodes.

Figure 87:
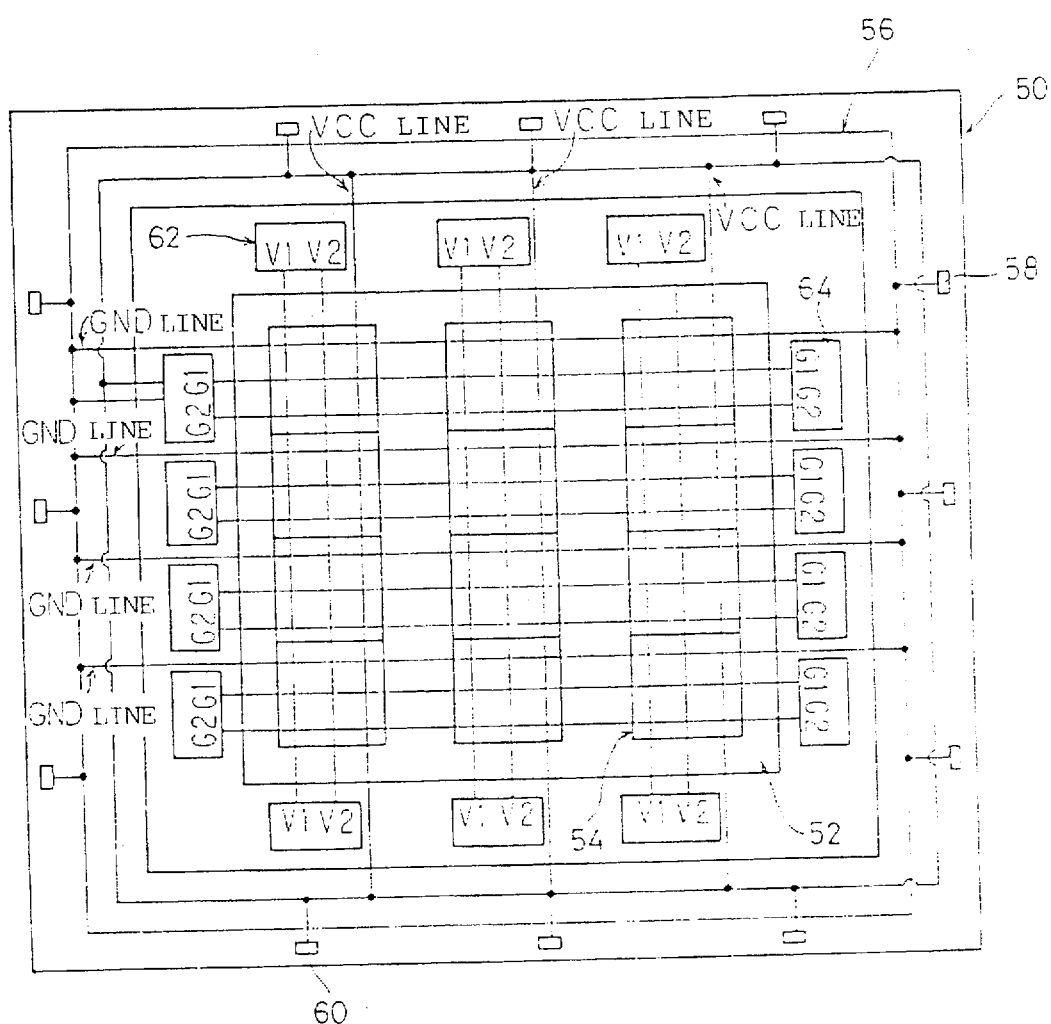
FIG. 87 is a plan view of a semiconductor device according to the fourth embodiment of the present invention.

FIG. 87 is a plan view of a semiconductor device equipped with reference voltage generating circuits according to the fourth embodiment of the present invention. A basic cell area 52 and an I/O area 56 are formed on a semiconductor chip 50. A plurality of macro-cells 54 arranged in rows and columns are formed in the basic cell area 52. A plurality of reference voltage generating circuits 62 and 64 are arranged in an intermediate area between the basic cell area 52 and the I/O area 56. The reference voltage generating circuits 62, each generating voltages V1 and V2 (<Vcc), are arranged in rows, and the reference voltage generating circuits 64, each generating voltages G1 and G2 (>GND), are arranged in columns. Power supply lines of voltages V1 and V2 extend on the macro-cell 54 from the reference voltage generating circuits 62 in columns, and power supply lines of voltages G1 and G2 extend on the macro-cell 54 from the reference voltage generating circuits 64 in columns. In order to ensure reliability, opposite portions of the Vcc and GND lines formed on the I/O area 56 are connected to each other by means of power supply lines. Each of the macro-cells 54 is supplied with one of Vcc, V1 and V2 and one of GND, G1 and G2 in order to determine optimal threshold voltages.

The reference voltage generating circuits 62 are formed by, for example, removing the diodes D3 and D4 from the circuit shown in FIG. 86, and the reference voltage generating circuits 64 are formed by, for example, removing the diodes D1 and D2 therefrom.

Pads 58 receiving the power supply voltage Vcc from an external power supply device and pads set at the ground potential are arranged on the I/O area 56. Further, the power supply voltages Vcc and GND are applied to the reference voltage generating circuits 62 and 64. The arrangements of the reference voltage generating circuits 62 and 64 are not limited to those shown in FIG. 87. For example, the reference voltage generating circuits 62 and 64 are arranged on the upper and right sides on the chip 50 shown in FIG. 87.

Figure 88:
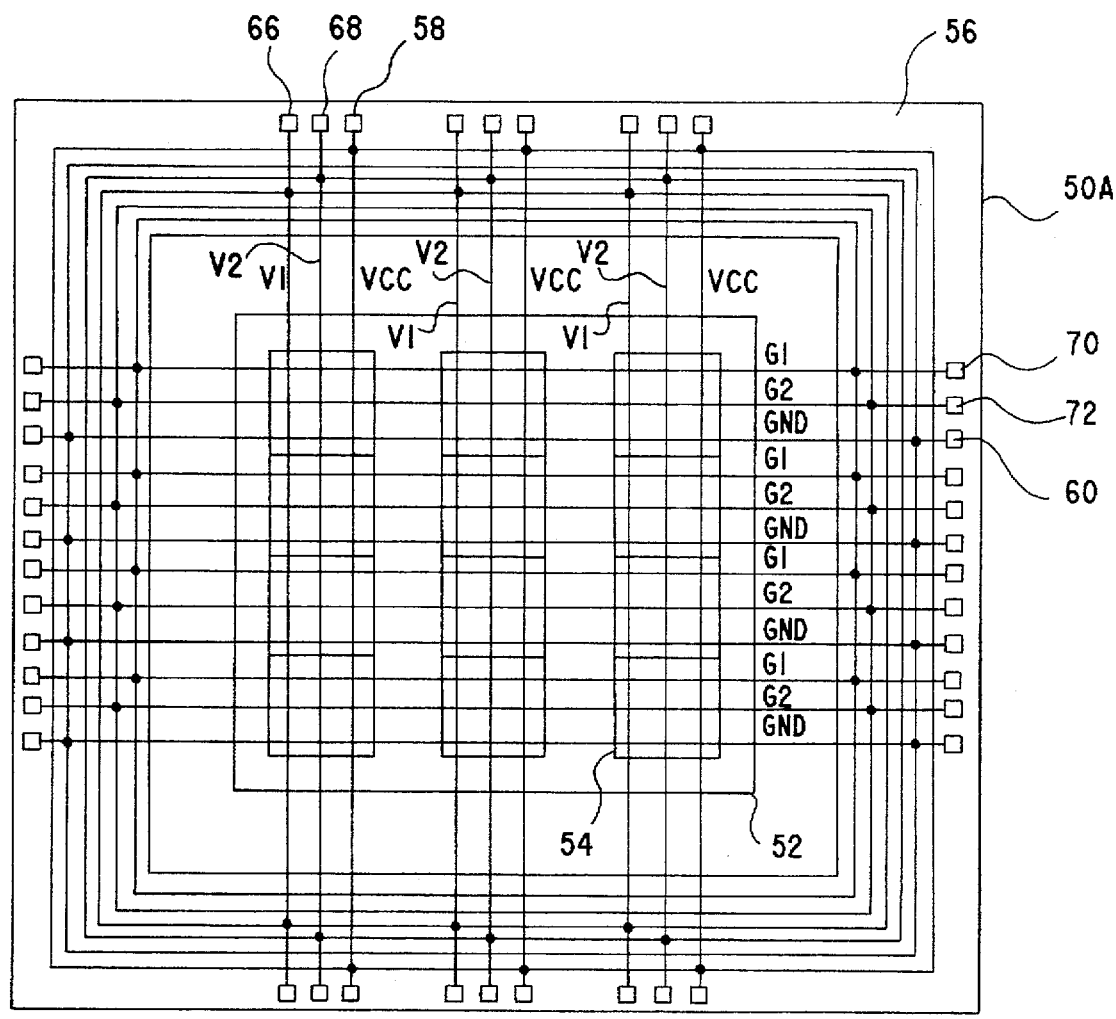
FIG. 88 is a plan view of another semiconductor device according to the fourth embodiment of the present invention.

Further, as shown in FIG. 88, it is possible to supply a chip 50A with voltages V1, V2, G1 and G2 from an external power supply device. On the I/O area 54, there are provided pads 66 and 68 to which the voltages V1 and V2 are externally applied, and pads 70 and 72 to which the voltages G1 and G2 are applied.

Figure 89:
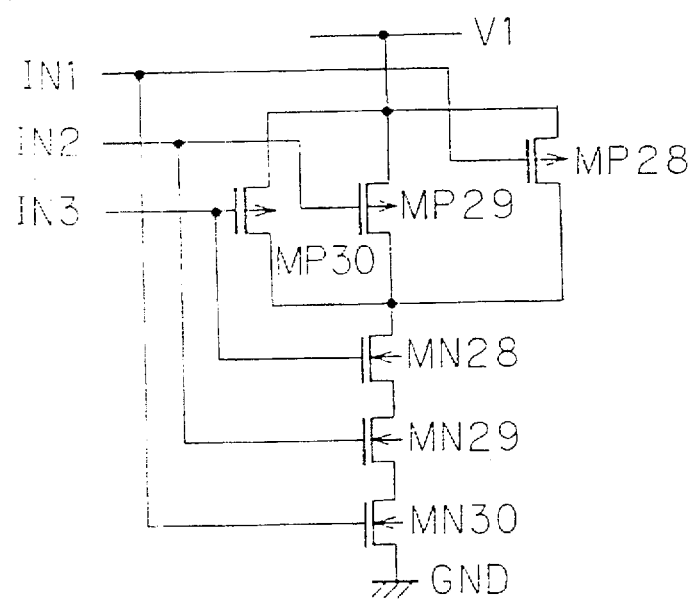
FIG. 89 is a circuit diagram of another configuration of the fourth embodiment of the present invention.

FIG. 89 is a circuit diagram of a three-input NAND gate operating on a voltage V1 lower than the power supply voltage Vcc. The three-input NAND gate is made up of three P-channel MOS transistors MP28, MP29 and MP30, and three N-channel MOS transistors MP28, MP29 and MP30. The voltage V1 lower than the power supply voltage Vcc is applied to the sources of the P-channel MOS transistors MP28–MP30, whereby the threshold voltages of these MOS transistors are made to shift toward the minus-level side. Hence, even if an instantaneous level change of the output signal toward the minus-level side, the P-channel MOS transistors MP28–MP30 are not turned ON.

In short, according to the first embodiment of the present invention, when the control means 5 (FIG. 24) performs the switching control to turn ON the bipolar transistor Q1, the turn-OFF means 6 temporarily conducts to connect the base of the bipolar transistor Q1 and the ground 4. Hence, the bipolar transistor Q1 is rapidly turned OFF, and it becomes possible to prevent the unnecessary pass-through current from the power supply caused by a drastic increase in the base-emitter voltage of the bipolar transistor Q1 when the output voltage $V_{OUT}$ is switched from the high level to the low level. Further, the base of the bipolar transistor Q1 is normally maintained in the high-impedance state with respect to the ground. Hence, no current flows from the base of the bipolar transistor Q1 to the ground when the output voltage $V_{OUT}$ is switched from the low level to the high level by the switching control in which the control means 5 switches the bipolar transistor from ON to OFF. As a result, the propagation delay time tpLH can be shortened.

According to the second and third embodiments of the present invention, the pass-through current flowing in the bipolar transistor Q1 (Q3) is restricted, and hence an instantaneous level change (noise) superimposed on the output voltage can be suppressed.

According to the fourth embodiment of the present invention, the threshold voltage for determining the logical switching can be selected in accordance with the gate type. Hence, an instantaneous level change superimposed on the output voltage can be suppressed.

The present invention is not limited to the specifically disclosed embodiments, and variations and modifications may be made without departing from the scope of the present invention.

What is claimed is:

1. A Bi-CMOS circuit comprising:
   a first bipolar transistor having a collector connected to a first power supply line, an emitter connected to an output terminal, and a base;
   a second bipolar transistor having a collector connected to the output terminal, an emitter connected to a second power supply line, and a base;
   control means, coupled to the first and second bipolar transistors and comprised of a CMOS circuit, for performing switching controls of the first and second bipolar transistors on the basis of an input signal applied to an input terminal on the basis of the input signal; and
   turn-OFF means, operatively coupled to the first bipolar transistor and said control means, for temporarily coupling the base of the first bipolar transistor to the second power supply line on the basis of a current flowing in said control means when the first bipolar transistor is turned OFF, so that the first bipolar transistor can be rapidly turned OFF.

2. The Bi-CMOS circuit as claimed in claim 1, wherein said control means comprises:
   a first P-channel MOS transistor having a source connected to the first power supply line, a drain connected to the base of the first bipolar transistor, and a gate connected to the input terminal to which the input signal is applied; and
   a first N-channel MOS transistor having a drain connected to the output terminal, a source connected to the base of the second bipolar transistor, and a gate connected to the input terminal, and
   wherein said turn-OFF means comprises a second N-channel MOS transistor coupled between the base of the first bipolar transistor and ground.

3. The Bi-CMOS circuit as claimed in claim 2, wherein the first and second N-channel MOS transistors have identical sizes.

4. The Bi-CMOS circuit as claimed in claim 2, wherein sizes of the first and second N-channel MOS transistors are smaller than a size of the first P-channel MOS transistor.

5. The Bi-CMOS circuit as claimed in claim 2, wherein a size of the second N-channel MOS transistor is smaller than that of the first N-channel MOS transistor.

6. A Bi-CMOS circuit comprising:
   a first bipolar transistor having a collector connected to a first power supply line, an emitter connected to an output terminal, and a base;
   a second bipolar transistor having a collector connected to the output terminal, an emitter connected to a second power supply line, and a base;
   control means, comprised of a CMOS circuit, for performing switching controls of the first and second bipolar transistors on the basis of a plurality of input signals applied to input terminals and for controlling an output signal output via the output terminal on the basis of the plurality of input signals; and
   instantaneous noise suppressing means, operatively coupled to the first bipolar transistor and said control means, which directly detects changes in the plurality of input signals and controls the current flowing from the first power supply line to the base of the first bipolar transistor on the basis of logical changes in the plurality of input signals, so that an instantaneous noise caused at the output terminal at the time of said logical changes can be suppressed.

7. The Bi-CMOS circuit as claimed in claim 6, wherein said control means performs a NOR operation on the plurality of input signals.

8. The Bi-CMOS circuit as claimed in claim 6, wherein said instantaneous noise suppressing means comprises level shift means, connected in a current path between the first power supply line and the base of the first bipolar transistor, for applying a level-shifted voltage to the base of the first bipolar transistor.

9. The Bi-CMOS circuit as claimed in claim 6, wherein said instantaneous noise suppressing means comprises switch means for connecting a node in a current path between the first power supply line and the base of the first bipolar transistor to the second power supply line when one of the plurality of input signals switches from a first level to a second level.

10. The Bi-CMOS circuit as claimed in claim 6, wherein said instantaneous noise suppressing means comprises bypass means for discharging either a node in a current path between the first power supply line and the base of the first bipolar transistor or the base thereof when one of the plurality of input signals switches from a first level to a second level.

11. The Bi-CMOS circuit as claimed in claim 10, wherein said bypass means comprises a plurality of MOS transistors connected in series between said node and the second power supply line, said plurality of MOS transistors having respective gates receiving said one of the plurality of input signals.

12. The Bi-CMOS circuit as claimed in claim 10, wherein said bypass means comprises a plurality of MOS transistors connected in series between the base of the first bipolar transistor and the second power supply line, said plurality of MOS transistors having respective gates receiving said one of the plurality of input signals.

13. A Bi-CMOS circuit, comprising:

a first bipolar transistor having a collector connected to a first power supply line, an emitter connected to an output terminal, and a base;

a second bipolar transistor having a collector connected to the output terminal, an emitter connected to a second power supply line, and a base;

control means, including a CMOS circuit, for performing switching controls of the first and second bipolar transistors on the basis of a plurality of input signals applied to input terminals and for controlling an output signal output via the output terminal on the basis of the plurality of input signals; and instantaneous noise suppressing means, operatively coupled to the first bipolar transistor and said control means, for controlling a current flowing from the base of the first bipolar transistor to the second power supply line; wherein said instantaneous noise suppressing means comprises switch means for connecting the base of the first bipolar transistor to the second power supply line when one of the plurality of input signals switches from a first level to a second level.

* * * * *